United States Patent
Godo et al.

(10) Patent No.: US 12,219,861 B2
(45) Date of Patent: Feb. 4, 2025

(54) DISPLAY APPARATUS AND ELECTRONIC DEVICE

(71) Applicant: Semiconductor Energy Laboratory Co., Ltd., Atsugi (JP)

(72) Inventors: Hiromichi Godo, Isehara (JP); Hisao Ikeda, Zama (JP); Yoshiyuki Kurokawa, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 146 days.

(21) Appl. No.: 17/860,286

(22) Filed: Jul. 8, 2022

(65) Prior Publication Data

US 2023/0022494 A1 Jan. 26, 2023

(30) Foreign Application Priority Data

Jul. 20, 2021 (JP) .................................. 2021-119388
Jul. 20, 2021 (JP) .................................. 2021-119389

(51) Int. Cl.
*H01L 27/28* (2006.01)
*G06F 3/01* (2006.01)
(Continued)

(52) U.S. Cl.
CPC ............. *H10K 65/00* (2023.02); *G06F 3/013* (2013.01); *G06T 7/20* (2013.01); *G09G 3/003* (2013.01); *H10K 30/80* (2023.02); *H10K 59/1213* (2023.02); *G06T 2207/30201* (2013.01); *G09G 3/3233* (2013.01); *G09G 2300/0426* (2013.01); *G09G 2300/0465* (2013.01);
(Continued)

(58) Field of Classification Search
CPC .... H10K 65/00; H10K 59/1213; H10K 30/80; H10K 59/35; H10K 59/38; G06F 3/013; G09G 3/003; G09G 3/3233; G09G 2300/0426; G09G 2300/0465; G09G 2354/00; G09G 2300/0842; G09G 2360/14; G06T 7/20; G06T 2207/30201; H01L 27/1251
See application file for complete search history.

(56) References Cited

U.S. PATENT DOCUMENTS 7,495,206 B2 2/2009 Park
7,701,029 B2 4/2010 Mabuchi
(Continued)

FOREIGN PATENT DOCUMENTS

JP 2019-512726 5/2019
WO WO-2015/145306 10/2015

*Primary Examiner* — Lixi C Simpson
(74) *Attorney, Agent, or Firm* — Eric J. Robinson; Intellectual Property Law Office, P.C.

(57) ABSTRACT

A novel display apparatus is provided. The display apparatus includes a first layer including a plurality of pixel circuits, a second layer provided over the first layer, a plurality of optical lenses provided over the second layer, a display region, and a plurality of light-receiving regions. The display region includes a first pixel circuit provided in the first layer and a light-emitting device provided in the second layer. The light-receiving region includes a second pixel circuit provided in the first layer and a light-receiving device provided in the second layer. The plurality of light-receiving regions are provided around the display region. The optical lens is provided at a position overlapping with the light-receiving region.

11 Claims, 32 Drawing Sheets

(51) Int. Cl.
   *G06T 7/20*      (2017.01)
   *G09G 3/00*      (2006.01)
   *H01L 27/32*     (2006.01)
   *H01L 51/44*     (2006.01)
   *H10K 30/80*     (2023.01)
   *H10K 59/121*    (2023.01)
   *H10K 65/00*     (2023.01)
   *G09G 3/3233*    (2016.01)
   *H01L 27/12*     (2006.01)
   *H10K 59/35*     (2023.01)
   *H10K 59/38*     (2023.01)

(52) U.S. Cl.
   CPC . *G09G 2300/0842* (2013.01); *G09G 2354/00* (2013.01); *G09G 2360/14* (2013.01); *H01L 27/1251* (2013.01); *H10K 59/35* (2023.02); *H10K 59/38* (2023.02)

(56) References Cited

U.S. PATENT DOCUMENTS

| | | | |
|---|---|---|---|
| 7,812,874 B2 | 10/2010 | Iwabuchi et al. | |
| 8,314,870 B2 | 11/2012 | Itonaga et al. | |
| 8,378,341 B2 | 2/2013 | Hayashi et al. | |
| 8,378,391 B2 | 2/2013 | Koyama et al. | |
| 8,440,954 B2 | 5/2013 | Masaaki | |
| 8,466,403 B2 | 6/2013 | Endo et al. | |
| 8,629,524 B2 | 1/2014 | Wang et al. | |
| 8,669,602 B2 | 3/2014 | Hayashi | |
| 8,749,679 B2 | 6/2014 | Shinohara | |
| 8,928,795 B2 | 1/2015 | Kusaka | |
| 9,093,575 B2 | 7/2015 | Yokoyama | |
| 9,123,529 B2 | 9/2015 | Hanaoka et al. | |
| 9,136,141 B2 | 9/2015 | Koezuka | |
| 9,293,496 B2 | 3/2016 | Kashihara | |
| 9,473,714 B2 | 10/2016 | Aoki et al. | |
| 9,502,450 B2 | 11/2016 | Yanagita et al. | |
| 9,553,120 B2 | 1/2017 | Park et al. | |
| 9,748,291 B2 | 8/2017 | Ikeda et al. | |
| 9,905,598 B2 | 2/2018 | Yamazaki et al. | |
| 10,020,336 B2 | 7/2018 | Ikeda et al. | |
| 10,026,768 B2 | 7/2018 | Saruwatari et al. | |
| 10,109,067 B2 | 10/2018 | Hunt et al. | |
| 10,115,205 B2 | 10/2018 | Cavin et al. | |
| 10,319,266 B1* | 6/2019 | Percival | G02B 27/0172 |
| 2012/0104523 A1 | 5/2012 | Ikeda | |
| 2012/0212467 A1* | 8/2012 | Kohtoku | G02F 1/1354 345/207 |
| 2013/0285046 A1 | 10/2013 | Yamazaki | |
| 2014/0061612 A1* | 3/2014 | Yamazaki | H10K 50/8426 257/40 |
| 2015/0162371 A1 | 6/2015 | Fujii et al. | |
| 2015/0263053 A1 | 9/2015 | Yamazaki et al. | |
| 2015/0279884 A1 | 10/2015 | Kusumoto | |
| 2015/0349129 A1 | 12/2015 | Ikeda | |
| 2016/0118425 A1 | 4/2016 | Kurokawa | |
| 2016/0133660 A1 | 5/2016 | Inoue et al. | |
| 2016/0225808 A1 | 8/2016 | Kurokawa | |
| 2019/0379844 A1* | 12/2019 | Chen | H01L 27/14652 |
| 2020/0012101 A1* | 1/2020 | Yuki | H04N 5/64 |
| 2021/0176383 A1* | 6/2021 | Kim | H04N 23/80 |
| 2021/0335896 A1* | 10/2021 | Choi | H10K 59/40 |
| 2022/0102419 A1 | 3/2022 | Yamazaki et al. | |
| 2022/0344405 A1* | 10/2022 | Zhu | H10K 59/60 |

* cited by examiner

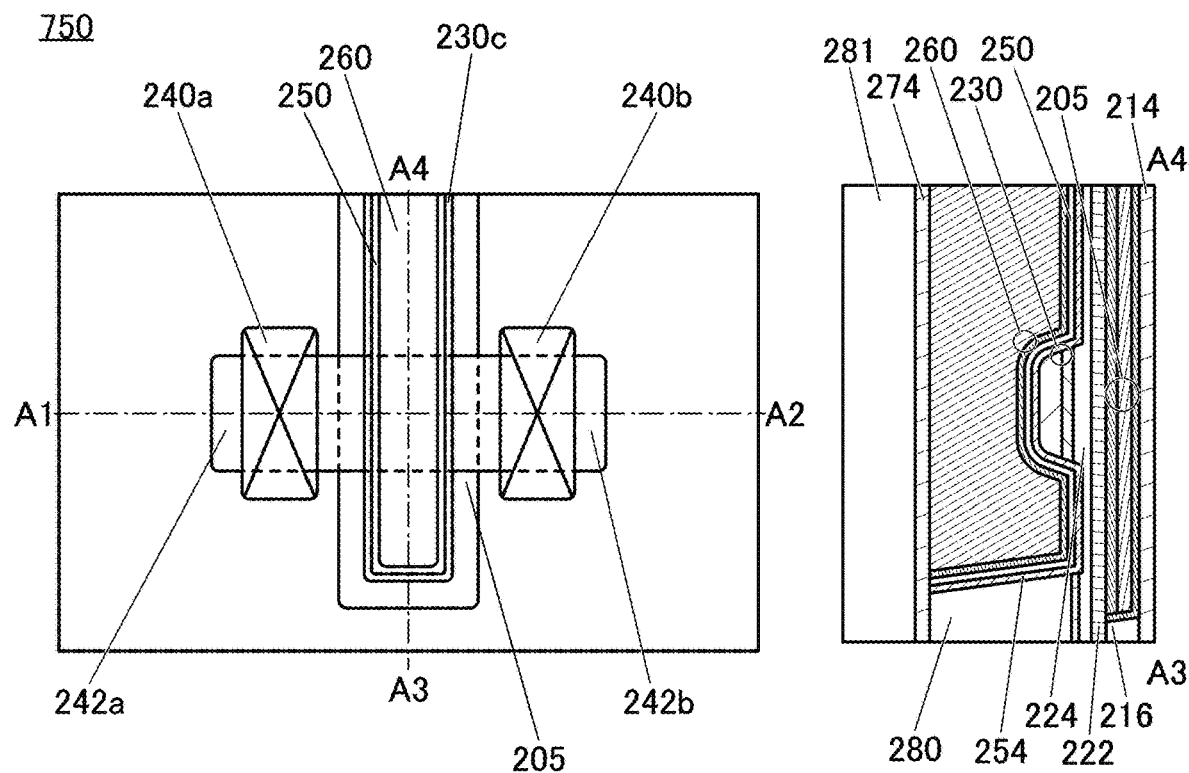
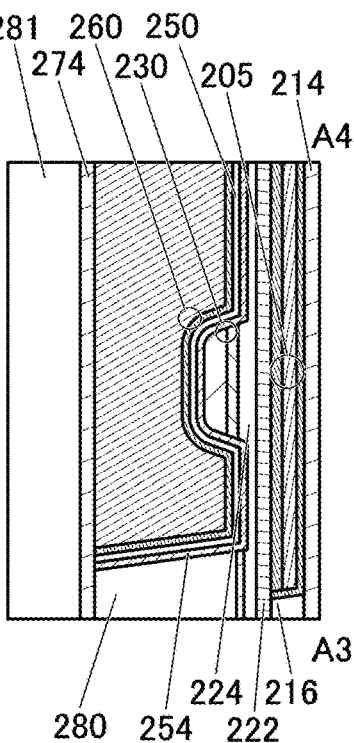
FIG. 24A
FIG. 24C
FIG. 24B

FIG. 25A
|  | Intermediate state<br>New crystalline phase |  |
|---|---|---|
| Amorphous | Crystalline | Crystal |
| • completely amorphous | • CAAC<br>• nc<br>• CAC<br>excluding single crystal and poly crystal | • single crystal<br>• poly crystal |
FIG. 25B
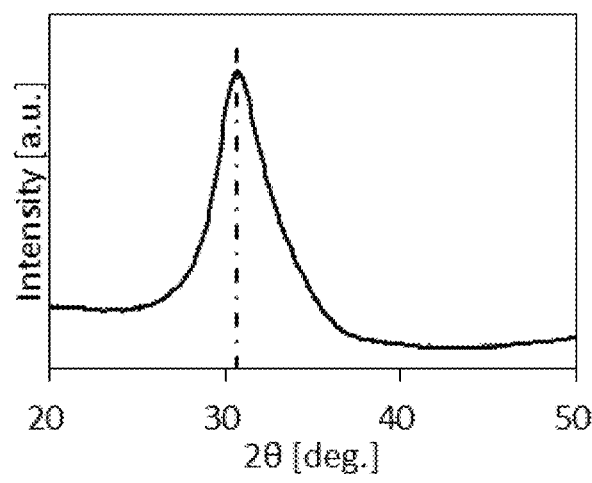
FIG. 25C
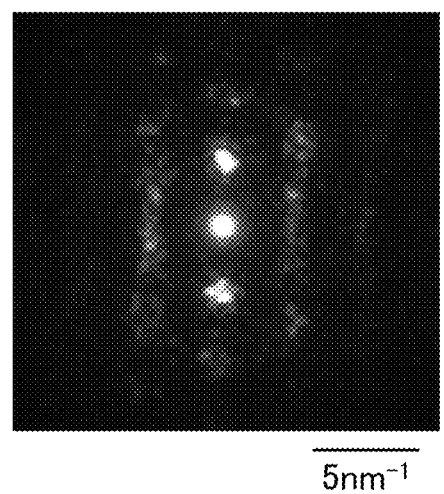

380A

380B

FIG. 31A
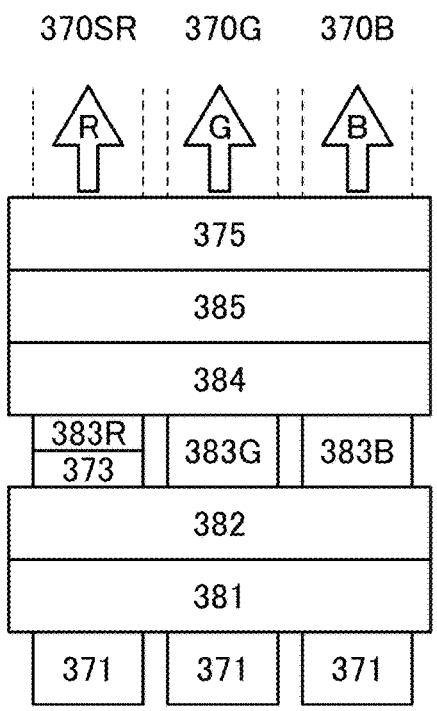
FIG. 31B
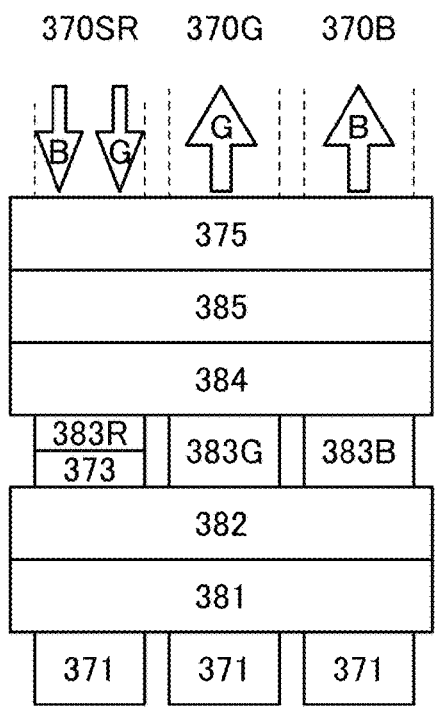
FIG. 31C
FIG. 31D
FIG. 31E
FIG. 31F
FIG. 31G
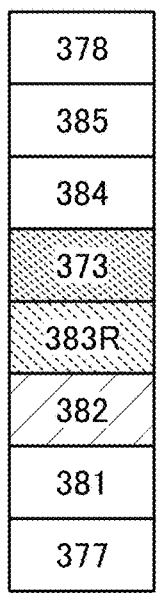 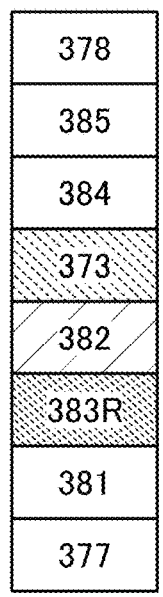 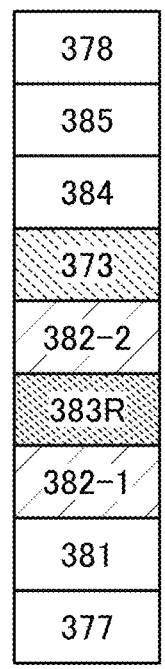 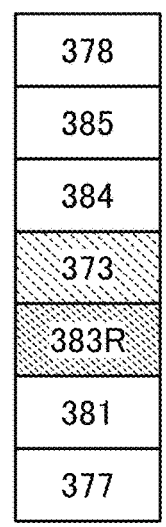 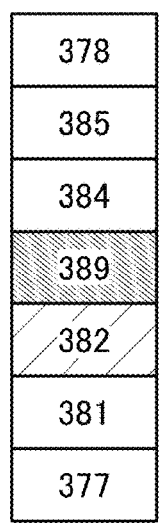

DISPLAY APPARATUS AND ELECTRONIC DEVICE

BACKGROUND OF THE INVENTION

1. Field of the Invention

One embodiment of the present invention relates to a display apparatus and an electronic device. One embodiment of the present invention relates to a wearable electronic device including a display apparatus.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof.

2. Description of the Related Art

In recent years, electronic devices for virtual reality (VR) or augmented reality (AR) have been attracting attention. Furthermore, VR or AR electronic devices with an eye tracking function have been under development. Such VR or AR electronic devices with an eye tracking function can be used for analysis of consumer behavior, image processing, avatar creation, and an operation using gaze, for example.

For example, Patent Document 1 discloses a head-mounted electronic device that performs eye tracking utilizing an image obtained using light that is emitted from an infrared ray light source and reflected by a cornea.

REFERENCE

[Patent Document 1] Japanese Translation of PCT International Application No. 2019-512726

SUMMARY OF THE INVENTION

The head-mounted electronic device includes an optical sensor for eye tracking separately from a display apparatus, and thus has a problem of size increase.

In the display apparatus used in the head-mounted electronic device, a light-receiving element included in the optical sensor for eye tracking can be provided together with a light-emitting element included in the display apparatus. In this case, an optical lens or the like is preferably provided between eyeballs and the display apparatus to obtain a clear image of the eyeballs. However, in the case where an optical lens for image capturing is provided in the display apparatus including both the light-receiving element and the light-emitting element, light emitted from the light-emitting element is blocked by the optical lens. This might make it difficult to achieve both displaying a high-quality image and capturing a clear image.

An object of one embodiment of the present invention is to provide a display apparatus and an electronic device that are reduced in size. Another object of one embodiment of the present invention is to provide a display apparatus and an electronic device that can achieve both displaying a high-quality image and capturing a clear image. Another object of one embodiment of the present invention is to provide a novel display apparatus and electronic device.

Note that the description of these objects does not preclude the existence of other objects. One embodiment of the present invention does not need to achieve all these objects. Objects other than these can be derived from the description of the specification, the drawings, the claims, and the like.

One embodiment of the present invention is a display apparatus including a first layer including a plurality of pixel circuits, a second layer provided over the first layer, a plurality of optical lenses provided over the second layer, a display region, and a plurality of light-receiving regions. The display region includes a light-emitting device provided in the second layer. Each of the plurality of light-receiving regions includes a plurality of light-receiving devices provided in the second layer. The plurality of light-receiving regions are provided around the display region. Each of the plurality of optical lenses is provided at a position overlapping with a corresponding one of the plurality of light-receiving regions.

One embodiment of the present invention is a display apparatus including a first layer, a second layer provided over the first layer, a plurality of optical lenses provided over the second layer, a display region, and a plurality of light-receiving regions. The display region includes a first pixel circuit provided in the first layer and a light-emitting device provided in the second layer. Each of the plurality of light-receiving regions includes a second pixel circuit provided in the first layer and a light-receiving device provided in the second layer. The plurality of light-receiving regions are provided around the display region. Each of the plurality of optical lenses is provided at a position overlapping with a corresponding one of the plurality of light-receiving regions.

In the display apparatus of one embodiment of the present invention, a distance between wirings provided in the light-receiving region and used for driving the second pixel circuit is preferably shorter than a distance between wirings provided in the display region and used for driving the first pixel circuit.

In the display apparatus of one embodiment of the present invention, a resolution of an image captured by the light-receiving device provided in the light-receiving region is preferably higher than a resolution of an image displayed by the light-emitting device provided in the display region.

In the display apparatus of one embodiment of the present invention, the display region is preferably a rectangular region and the plurality of light-receiving regions are preferably placed at four corners of the rectangular region.

One embodiment of the present invention is a display apparatus including a first layer, a second layer provided over the first layer, a plurality of optical lenses provided over the second layer, a display region, and a plurality of light-receiving regions. The display region includes a first pixel circuit provided in the first layer and a light-emitting device provided in the second layer. Each of the plurality of light-receiving regions includes a second pixel circuit provided in the first layer and a light-receiving device provided in the first layer. The plurality of light-receiving regions are provided around the display region. Each of the plurality of optical lenses is provided at a position overlapping with a corresponding one of the plurality of light-receiving regions.

The display apparatus of one embodiment of the present invention preferably includes a third layer, the third layer preferably includes a driver circuit, and the driver circuit is preferably placed at a position overlapping with the display region.

In the display apparatus of one embodiment of the present invention, the third layer preferably includes an arithmetic circuit, and the arithmetic circuit preferably has a function of performing eye tracking on the basis of image data obtained in the plurality of light-receiving regions.

In the display apparatus of one embodiment of the present invention, the first layer preferably includes a first transistor including a semiconductor layer containing silicon in a channel formation region, and the first pixel circuit preferably includes the first transistor.

In the display apparatus of one embodiment of the present invention, the first layer preferably includes a second transistor including a semiconductor layer including a metal oxide in a channel formation region.

In the display apparatus of one embodiment of the present invention, the metal oxide preferably contains In, Zn, and an element M (M is Al, Ga, Y, or Sn).

In the display apparatus of one embodiment of the present invention, the light-receiving element contains an organic semiconductor.

One embodiment of the present invention is an electronic device including a housing and any of the above display apparatuses. The housing includes the display apparatus at a position where an image of a user's eye can be captured, and the light-receiving region has a function of capturing an image of the user's eye and/or the surroundings of the eye.

Note that other embodiments of the present invention will be described in the following embodiments with reference to the drawings.

One embodiment of the present invention can provide a display apparatus and an electronic device that are reduced in size. Another embodiment of the present invention can provide a display apparatus and an electronic device that can achieve both displaying a high-quality image and capturing a clear image. Another embodiment of the present invention can provide a novel display apparatus and electronic device.

Note that the description of these effects does not preclude the existence of other effects. One embodiment of the present invention does not necessarily have all these effects. Effects other than these can be derived from the description of the specification, the drawings, the claims, and the like.

BRIEF DESCRIPTION OF THE DRAWINGS

In the accompanying drawings:

FIGS. 24A to 24C illustrate a structure example of a display apparatus;

FIG. 25A shows a classification of crystal structures of IGZO, FIG. 25B shows an XRD spectrum of a CAAC-IGZO film, and FIG. 25C shows a nanobeam electron diffraction pattern of a CAAC-IGZO film;

FIGS. 31A to 31G each illustrate a structure example of a display apparatus.

DETAILED DESCRIPTION OF THE INVENTION

Figure 1A:
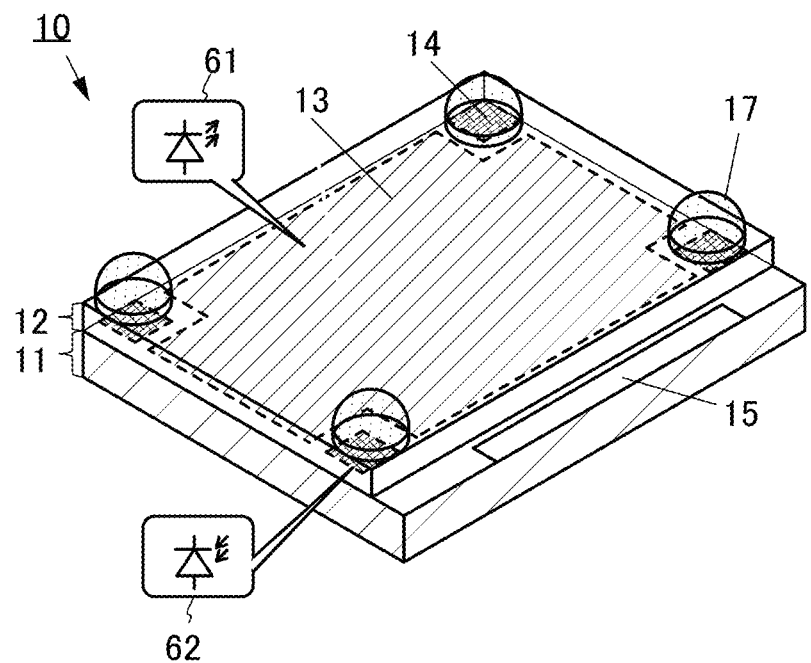
FIGS. 1A and 1B illustrate a structure example of a display apparatus.

Embodiments will be described below with reference to the drawings. The embodiments can be implemented with various modes. It will be readily appreciated by those skilled in the art that modes and details can be changed in various ways without departing from the spirit and scope of the present invention. Therefore, the present invention should not be construed as being limited to the description of embodiments below.

In the drawings, sizes, layer thicknesses, or regions are sometimes exaggerated for clarity. Therefore, the size, the layer thickness, or the region is not limited to the illustrated scale. Note that the drawings schematically show ideal examples, and embodiments of the present invention are not limited to shapes or values shown in the drawings.

Unless otherwise specified, an off-state current in this specification and the like refers to a drain current of a transistor in an off state (also referred to as a non-conduction state or a cutoff state). Unless otherwise specified, the off state of an n-channel transistor means that a gate-source voltage $V_{gs}$ is lower than a threshold voltage $V_{th}$, and the off state of a p-channel transistor means that $V_{gs}$ is higher than $V_{th}$.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is referred to as an oxide semiconductor in some cases. That is, an OS transistor can also be referred to as a transistor including a metal oxide or an oxide semiconductor.

Embodiment 1

In this embodiment, a display apparatus and an electronic device of embodiments of the present invention are described. The display apparatus of one embodiment of the present invention can be suitably used as a display apparatus included in a wearable electronic device for VR and/or AR application(s).

Structure Example 1 of Display Apparatus

Figure 1B:
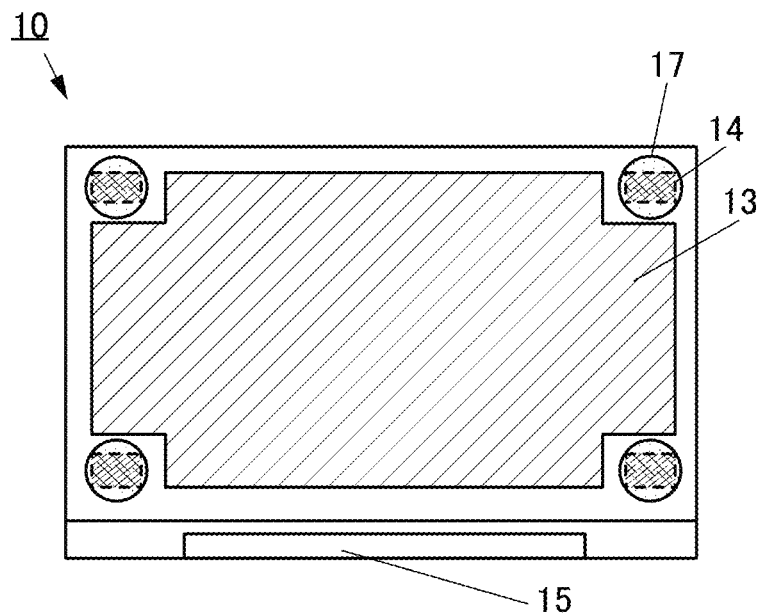

FIG. 1A is a perspective view illustrating a structure example of a display apparatus of one embodiment of the present invention. FIG. 1B is a top view illustrating the structure example of the display apparatus of one embodiment of the present invention. A display apparatus 10 includes a layer 11, a layer 12, and an optical lens 17. The display apparatus 10 includes a display region 13 and a light-receiving region 14.

The display region 13 includes a light-emitting element 61 and displays an image using light emitted toward a user (viewer). As illustrated in FIG. 1B, the display region 13 is placed in a central portion of the display apparatus 10 having a rectangular shape, which allows the display apparatus 10 to include the display region 13 in a large area. The display region 13 preferably has a rectangular shape, further preferably has a rectangular shape with the four corners cut off, which will be described later. Although this embodiment describes an example in which the display region 13 has a rectangular shape, the present invention is not limited thereto. For example, the present invention can be applied to a case where the display region has a non-rectangular shape (typically, a hexagonal, octagonal, or circular shape).

In the display region 13, a pixel circuit (not illustrated) for controlling the intensity of light from the light-emitting element 61 is provided in the layer 11, and the light-emitting element 61 is provided in the layer 12. The pixel circuit is sometimes referred to as a first pixel circuit or a pixel circuit for controlling light emission. The pixel circuit for controlling light emission includes a plurality of transistors, a capacitor, and the like. The transistors and the capacitor included in the pixel circuit for controlling light emission are provided in a region overlapping with the light-emitting element 61. In addition, the display region 13 may include a circuit other than the pixel circuit, such as a driver circuit for driving the pixel circuit, an arithmetic circuit for performing arithmetic operation of signals, or the like.

As the light-emitting element 61, an organic electroluminescent element (also referred to as an organic EL element) or the like can be used, for example. Note that the light-emitting element 61 is not limited thereto and may be an inorganic EL element formed using an inorganic material, for example. Note that an "organic EL element" and an "inorganic EL element" are collectively referred to as "EL element" in some cases. The light-emitting element 61 may contain an inorganic compound such as quantum dots. For example, when used for a light-emitting layer, quantum dots can function as a light-emitting material.

The light-receiving region 14 includes a light-receiving element 62 and generates a signal by receiving light from the user side. Note that the light-receiving element 62 is an element that converts light energy into electric energy and may be referred to as a photoelectric conversion element. As illustrated in FIG. 1B, the light-receiving region 14 is preferably placed in a region where a corner of the display region 13 in the display apparatus 10 having a rectangular shape is cut off. That is, a plurality of light-receiving regions 14 are preferably provided around the display region 13. Note that when the light-receiving region 14 is made small, the display region 13 can have a substantially rectangular shape.

In the case where the display apparatus 10 has a shape other than the rectangular shape, such as a polygonal or oval shape, the light-receiving regions 14 are preferably provided around the display region 13, e.g., in corner portions or end portions of the display region 13. With this structure, a plurality of light-receiving regions 14 can be provided without influence on display in the display region 13.

In the light-receiving region 14, a pixel circuit (not illustrated) for controlling imaging data (also referred to as a reading signal or the like) obtained when the light-receiving element 62 receives light is provided in the layer 11, and the light-receiving element 62 is provided in the layer 12. The pixel circuit is sometimes referred to as a second pixel circuit or a pixel circuit for controlling light reception. The pixel circuit for controlling light reception includes a plurality of transistors, a capacitor, and the like. The transistors and the capacitor included in the pixel circuit for controlling light reception are provided in a region overlapping with the light-receiving element 62. Alternatively, the light-receiving region 14 may include a circuit other than the pixel circuit, such as a driver circuit for driving the pixel circuit, an arithmetic circuit for performing arithmetic operation of signals, or the like.

As the light-receiving element 62, a photodiode having spectral sensitivity characteristics in a visible light wavelength range can be used, for example. An active layer of the photodiode contains a semiconductor. Examples of the semiconductor include an inorganic semiconductor such as silicon and an organic semiconductor including an organic compound. The use of an organic semiconductor in the active layer of the light-receiving element 62 is preferable because the light-emitting layer of the light-emitting element 61 and the active layer of the light-receiving element 62 can be formed by the same method (e.g., a vacuum evaporation method) and thus the same manufacturing apparatus can be used. In addition, the light-emitting layer of the light-emitting element 61 and the active layer of the light-receiving element 62 can each be formed without using a metal mask or a fine metal mask (FMM), which will be described in detail later. Thus, the light-emitting elements 61 and the light-receiving elements 62 can be arranged at high density.

In this specification and the like, the term "element" can be replaced with the term "device" in some cases. For example, a display element, a light-emitting element, and a liquid crystal element can be rephrased as a display device, a light-emitting device, and a liquid crystal device, respectively.

The display apparatus 10 also includes a terminal portion for receiving a variety of signals and a power supply potential. FIGS. 1A and 1B each illustrate a terminal portion 15 provided in the layer 11. Although the layers 11 and 12 are provided in the display apparatus 10 in FIGS. 1A and 1B, a layer different from the layers 11 and 12 may be provided. In the layer different from the layers 11 and 12, the driver circuit and/or the arithmetic circuit described above can be provided.

In the display apparatus 10, a plurality of optical lenses 17 are provided in the regions overlapping with the plurality of light-receiving regions 14 over the layer 12. As the optical lens 17, it is possible to use an optical element in which refraction, divergence, convergence, or the like of light is performed. As the optical lens 17, a spherical lens, an aspheric lens, or a Fresnel lens is preferably used. By placing the optical lens 17 and the light-receiving region 14 to overlap with each other, an optical path of light reflected by a user's eye that is a subject can be adjusted, so that light convergence by light refraction in accordance with the density of the light-receiving elements 62 that are focal points can be performed. An appropriate space may be provided between the layer 12 and the optical lens 17.

Figure 2A:
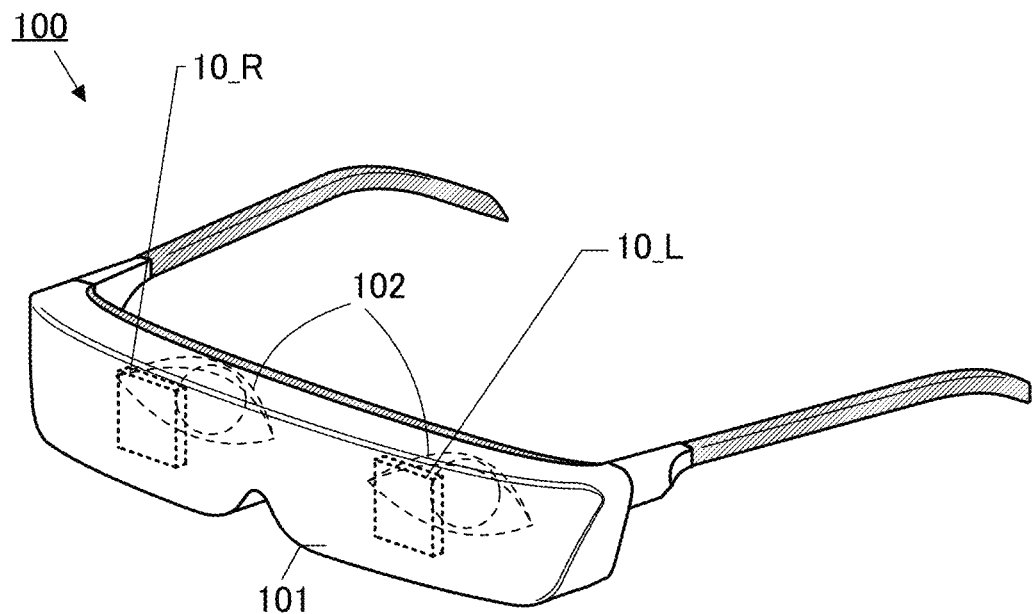
FIGS. 2A and 2B illustrate a structure example of an electronic device including a display apparatus.

FIG. 2A illustrates a structure example of the case where the display apparatus 10 illustrated in FIGS. 1A and 1B is applied to a head-mounted electronic device 100. FIG. 2A is a perspective view illustrating an example of the head-mounted electronic device 100. The electronic device 100 illustrated in FIG. 2A includes a pair of display apparatuses 10_L and 10_R in a housing 101. In addition, eyes (eyeballs) 102 of a user wearing the electronic device 100 are illustrated in FIG. 2A. As illustrated in FIG. 2A, the pair of display apparatuses 10_L and 10_R is positioned to overlap with the eyes 102, for example. When the housing 101 is provided with an acceleration sensor such as a gyroscope sensor, the orientation of the user's head can be sensed and an image corresponding to the orientation can be displayed.

In the light-receiving region 14, the display apparatuses 10_L and 10_R can capture an image of movement of the surroundings of the eyeballs, e.g., eyelids, glabella, and the inner and outer corners of eyes, in addition to the eyes 102 of the user. As illustrated in FIG. 2A, it is preferable that the diagonal length (panel size) of each of the display apparatuses 10_L and 10_R be substantially equal to the width of the opened eye 102. In this case, the display apparatuses 10_L and 10_R each have a diagonal panel size of greater than or equal to 0.1 inches and less than or equal to 5 inches, preferably greater than or equal to 0.5 inches and less than or equal to 3 inches, further preferably greater than or equal to 1 inch and less than or equal to 2 inches, still further preferably greater than or equal to 1.3 inches and less than or equal to 1.7 inches, yet still further preferably greater than or equal to 1.5 inches and less than or equal to 1.6 inches. With this structure, the display region 13 and the light-receiving region 14 each having a size suitable for the width of the eye 102 can be provided. In other words, when the display apparatus 10 is brought closer to the eyes 102 of the user, data on the eyes 102 of the user and their surroundings can be acquired in the light-receiving region 14 and a wide field of view of an image displayed on the display region 13 can be achieved.

In this specification and the like, in the cases where matters that apply to both the display apparatuses 10_L and 10_R are described and they do not need to be differentiated from each other, for example, the display apparatuses 10_L and 10_R may be simply referred to as the display apparatus 10.

Figure 2B:
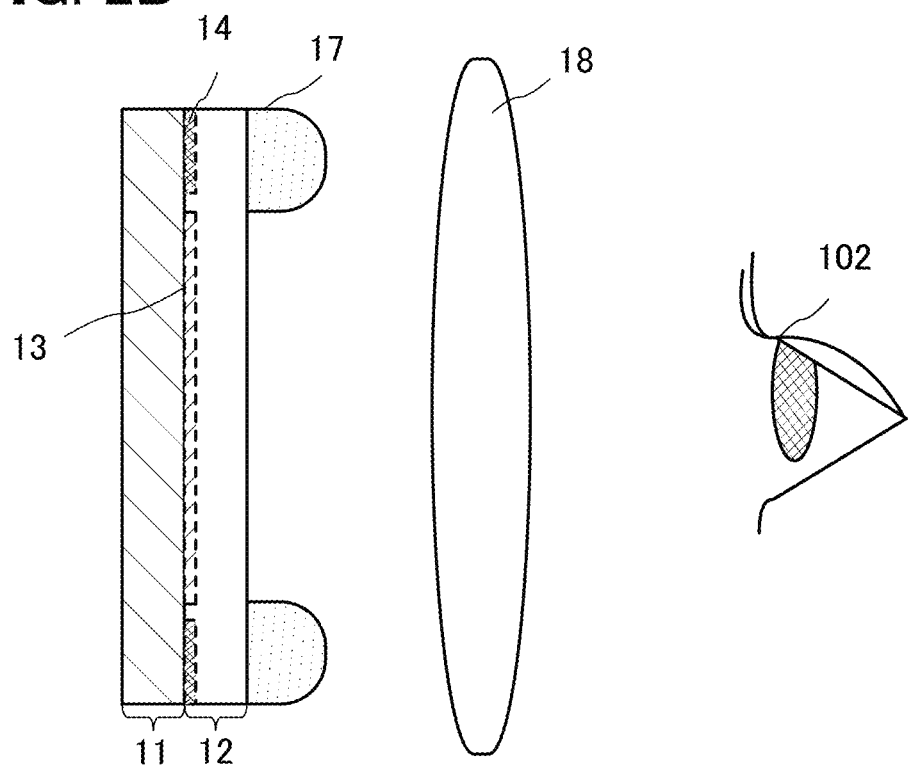

FIG. 2B is a schematic view illustrating the case where the display apparatus 10 including the display region 13 and the light-receiving region 14 illustrated in FIGS. 1A and 1B is placed close to the eye 102 of the user. Note that FIG. 2B is a schematic cross-sectional view illustrating an example in which the display region 13 is placed between the light-receiving regions 14. In FIG. 2B, another optical lens such as an optical lens 18 is preferably provided between the layer 12 and the eye 102. As the optical lens 18, a spherical lens, an aspheric lens, or a Fresnel lens is preferably used. With this structure, an image corresponding to light emitted from the display region 13 can be enlarged before being perceived by the eye 102, leading to improvement in visibility when the display apparatus 10 in the electronic device 100 is seen.

Light emitted from the light-emitting element 61 in the display region 13 allows the eyes 102 of the user to see an image. Examples of the light emitted from the light-emitting element 61 may include infrared light in addition to visible light.

Light from the eyes 102 of the user and/or their surroundings (also referred to as reflected light) goes through the optical lenses 18 and 17 and then is converted into an electric signal by the light-receiving element 62 in the light-receiving region 14. Data acquired in the light-receiving regions 14 may be a captured image of eyeballs (or the state of pupils) for eye tracking or a captured image of movement of the surroundings of the eyeballs (e.g., eyelids, glabella, and the inner and outer corners of eyes).

As described above, the display apparatus of one embodiment of the present invention can include the light-emitting element of the display region and the light-receiving element of the light-receiving region in the same layer. Thus, as compared with the case where a display apparatus and a light-receiving apparatus are provided separately, the number of components can be reduced, leading to a reduction in size and weight of an electronic device including the display apparatus.

In the display apparatus of one embodiment of the present invention, the light-receiving regions are provided around the display region and overlap with the optical lenses. Thus, a clear image can be captured even when a distance between the display apparatus and an object is short, for example, when an image of the user's eyes is captured. When one embodiment of the present invention has a structure where an optical lens for image capturing is placed in a region overlapping with the light-receiving region, light emitted from the light-emitting element in the display region can be inhibited from being blocked by the optical lens. In one embodiment of the present invention where the light-receiving region and the optical lens can be placed to overlap with each other, a clear image can be captured while a high-quality image can be displayed on the display region; thus, both displaying a high-quality image and capturing a clear image can be achieved.

Figure 3A:
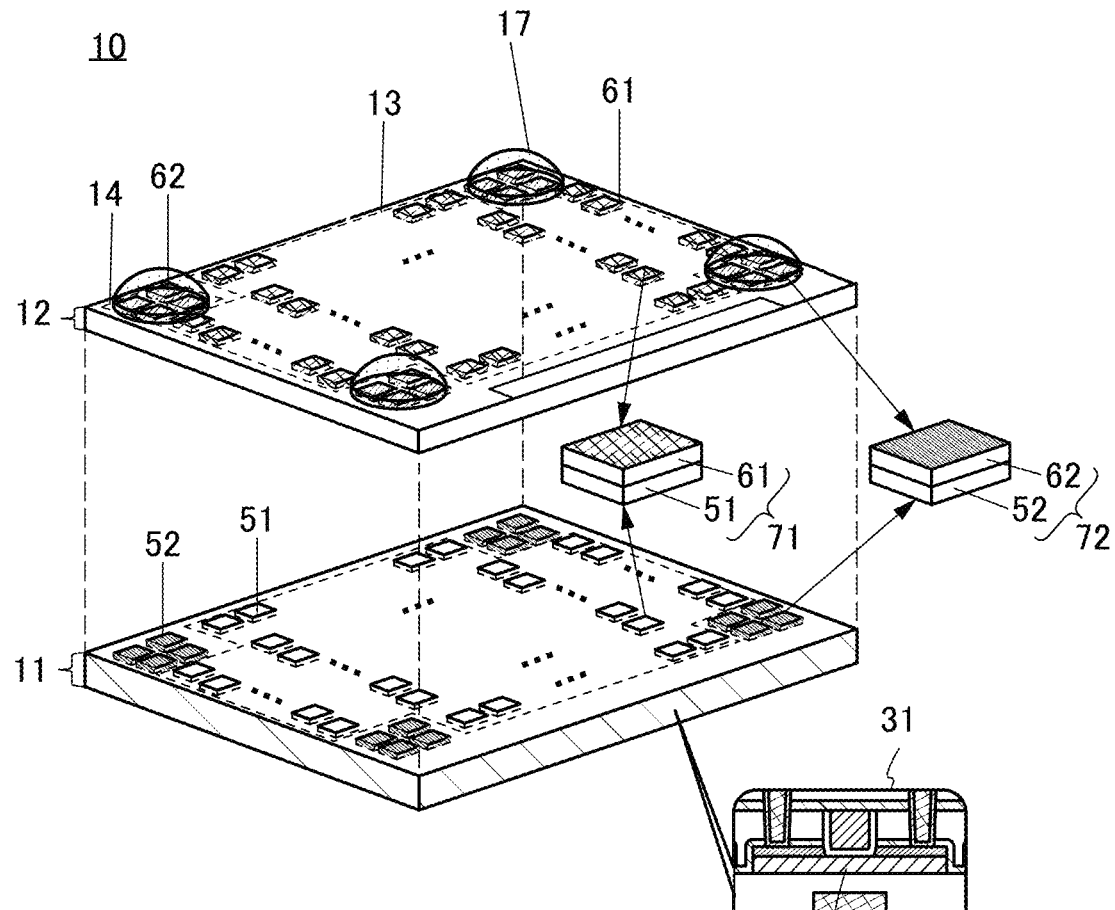
FIGS. 3A and 3B illustrate a structure example of a display apparatus.

FIG. 3A is a perspective view schematically illustrating structures of the layers 11 and 12 of the display apparatus 10 illustrated in FIG. 1B.

In the layer 11, a pixel circuit 51 and a pixel circuit 52 are provided. In the layer 12, the light-emitting element 61 and the light-receiving element 62 are provided.

The pixel circuit 51 and the light-emitting element 61 function as a unit element for controlling the intensity of light. Here, the unit element for controlling the intensity of light means a "subpixel" that is the minimum unit performing independent operation in a "pixel"; however, description is sometimes made with the "pixel" rephrased as a "region" or a "subpixel". In FIG. 3A, a pixel including the pixel circuit 51 and the light-emitting element 61 and being provided in the display region 13 is illustrated as a pixel 71.

The pixel circuit 52 and the light-receiving element 62 function as a unit element for controlling image capturing of reflected light. Here, the unit element for controlling image capturing of reflected light means a "subpixel" that is the minimum unit performing independent operation in a "pixel"; however, description is sometimes made with the "pixel" rephrased as a "region" or a "subpixel". In FIG. 3A, a pixel including the pixel circuit 52 and the light-receiving element 62 and being provided in the light-receiving region 14 is illustrated as a pixel 72.

The pixel circuit 51 and the pixel circuit 52 in the layer 11 each include a transistor 31 including a metal oxide (also referred to as an oxide semiconductor) in a channel formation region 32 (the transistor is also referred to as an OS transistor). The pixel circuit 51 and the pixel circuit 52 can each include an OS transistor. Note that the layer 12 can be formed by stacking layers each including an OS transistor.

When the light-receiving element 62 in the layer 12 contains an organic semiconductor in its active layer, the light-emitting layer of the light-emitting element 61 and the active layer of the light-receiving element 62 can be formed by the same method (e.g., a vacuum evaporation method), so that the pixels 71 and the pixels 72 can be arranged at extremely high density. For example, the pixels can be arranged in the display region 13 of the display apparatus 10 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi. The display apparatus 10 has an extremely high resolution and thus can be suitably used for a device for VR such as a head-mounted display or a glasses-type device for AR.

Figure 3B:
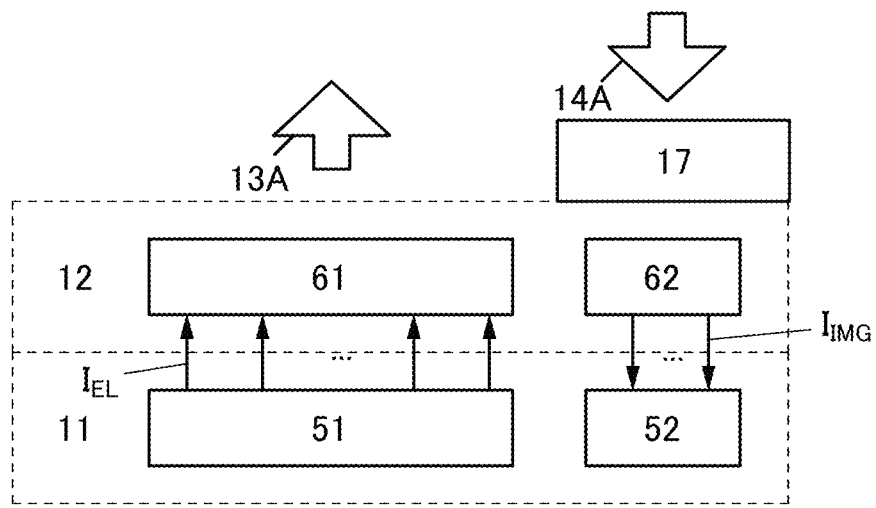

FIG. 3B is a block diagram illustrating the structures of the layer 11, the layer 12, and the optical lens 17 in FIG. 3A. The pixel circuit 51 in the layer 11 outputs a current $I_{EL}$ corresponding to image data to the light-emitting element 61 in the layer 12. The light-emitting element 61 emits light 13A corresponding to the current $I_{EL}$. The light-receiving element 62 in the layer 12 supplies a photocurrent $I_{IMG}$ to the pixel circuit 52 when receiving light 14A through the optical lens 17, and the pixel circuit 52 outputs reading data generated by the photocurrent $I_{IMG}$.

Figure 4A:
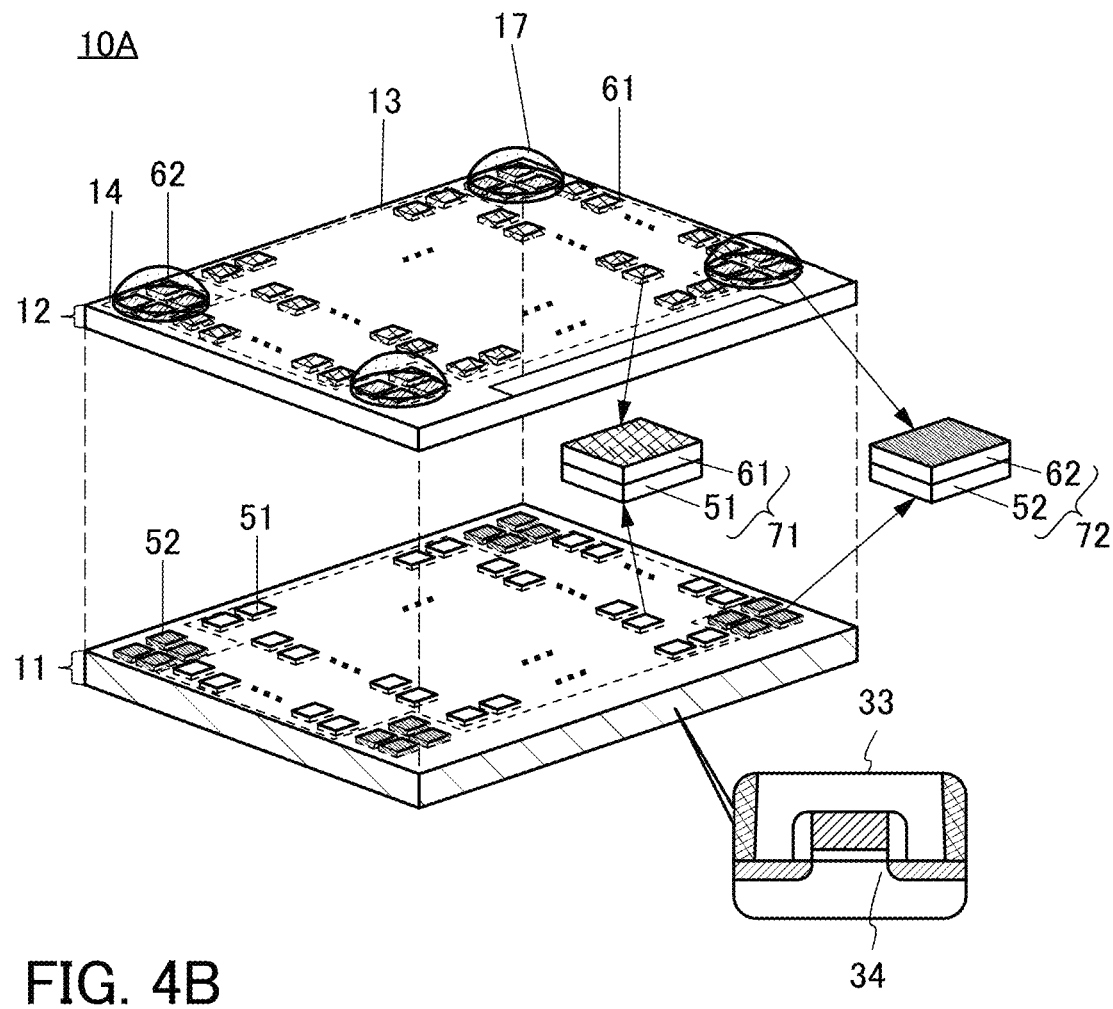
FIGS. 4A and 4B illustrate a structure example of a display apparatus.

FIG. 4A is a perspective view of a display apparatus 10A that is different from the display apparatus 10 illustrated in FIG. 3A in the structures of the layers 11 and 12.

In the layer 11, the pixel circuit 51 and the pixel circuit 52 are provided. In the layer 12, the light-emitting element 61 and the light-receiving element 62 are provided.

The pixel circuit 51 and the light-emitting element 61 function as a unit element for controlling the intensity of light. Here, the unit element for controlling the intensity of light means a "subpixel" that is the minimum unit performing independent operation in a "pixel"; however, description is sometimes made with the "pixel" rephrased as a "region" or a "subpixel". In FIG. 4A, a pixel provided in the display region 13 including the pixel circuit 51 and the light-emitting element 61 is illustrated as the pixel 71.

The pixel circuit 52 and the light-receiving element 62 function as a unit element for controlling image capturing of reflected light. Here, the unit element for controlling image capturing of reflected light means a "subpixel" that is the minimum unit performing independent operation in a "pixel"; however, description is sometimes made with the "pixel" rephrased as a "region" or a "subpixel". In FIG. 4A, a pixel provided in the light-receiving region 14 including the pixel circuit 52 and the light-receiving element 62 is illustrated as the pixel 72.

The pixel circuit 51 and the pixel circuit 52 in the layer 11 each include a transistor 33 containing silicon in a channel formation region 34 (the transistor is also referred to as a Si transistor).

The transistor 33 can be a transistor containing single crystal silicon in its channel formation region (the transistor is also referred to as a "c-Si transistor"), for example. In particular, the use of a transistor containing single crystal silicon in its channel formation region as the transistor provided in the layer 11 can increase the on state-current of the transistor. This is preferable because the circuits included in the layer 11 can be driven at a high speed. The c-Si transistor can be formed by minute processing to have a channel length of 3 nm to 10 nm, for example; therefore, the display apparatus 10 can be provided with a CPU, an accelerator such as a GPU, an application processor, or the like together with the display portion.

As the transistor provided in the layer 11, a transistor containing polycrystalline silicon in its channel formation region (the transistor is also referred to as a "Poly-Si transistor") may be used. As the polycrystalline silicon, low-temperature polysilicon (LTPS) may be used. Note that a transistor containing LTPS in its channel formation region is also referred to as an "LTPS transistor".

A Si transistor may be provided in the layer 11. For example, the pixel circuit 51 and the pixel circuit 52 may each include a transistor containing single crystal silicon or polycrystalline silicon in its channel formation region. LTPS may be used as the polycrystalline silicon. It is also possible to form a layer including a Si transistor over another substrate and bond the substrate to the layer 11 of the display apparatus 10, for example.

Alternatively, for example, the pixel circuit 51 and the pixel circuit 52 may each include a plurality of kinds of transistors formed using different semiconductor materials. In the case where the pixel circuit 51 and the pixel circuit 52 each include a plurality of kinds of transistors formed using different semiconductor materials, the transistors formed using different semiconductor materials may be provided in different layers. For example, in the case where the pixel circuit 51 and the pixel circuit 52 each include a Si transistor and an OS transistor, the Si transistor and the OS transistor may be provided to overlap with each other. Providing the transistors to overlap with each other reduces the area occupied by the pixel circuit 51 and the pixel circuit 52. Thus, the resolution of the display apparatus 10 can be increased. Note that a structure in which the LTPS transistor and the OS transistor are combined is referred to as LTPO in some cases.

When the light-receiving element 62 in the layer 12 contains an organic semiconductor in its active layer, the light-emitting layer of the light-emitting element 61 and the active layer of the light-receiving element 62 can be formed by the same method (e.g., a vacuum evaporation method), so that the pixels 71 and the pixels 72 can be arranged at extremely high density. For example, the pixels can be arranged in the display region 13 of the display apparatus 10 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi. The display apparatus 10 has an extremely high resolution and thus can be suitably used for a device for VR such as a head-mounted display or a glasses-type device for AR.

Figure 4B:
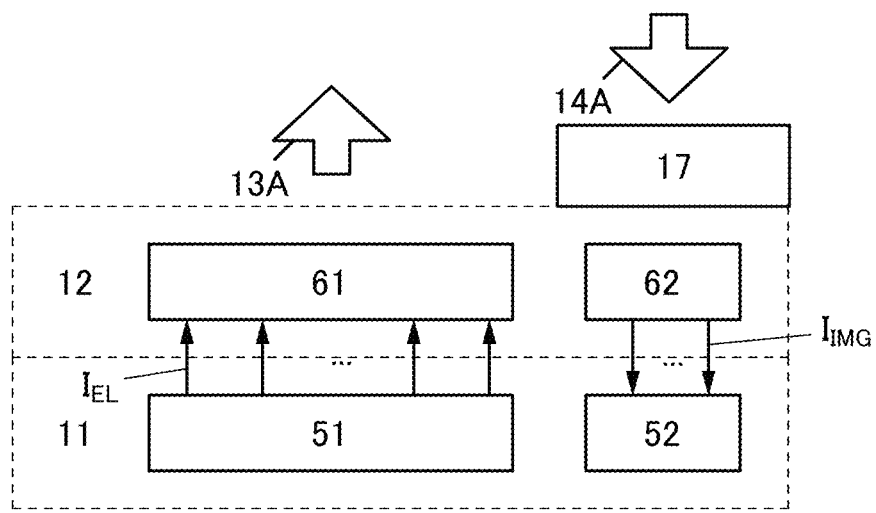

FIG. 4B is a block diagram illustrating the structures of the layer 11, the layer 12, and the optical lens 17 in FIG. 4A. The pixel circuit 51 in the layer 11 outputs the current $I_{EL}$ corresponding to image data to the light-emitting element 61 in the layer 12. The light-emitting element 61 emits the light 13A corresponding to the current $I_{EL}$. The light-receiving element 62 in the layer 12 supplies the photocurrent $I_{IMG}$ to the pixel circuit 52 when receiving the light 14A through the optical lens 17, and the pixel circuit 52 outputs reading data generated by the photocurrent $I_{IMG}$.

The pixel circuits 52 and the light-receiving elements 62 in the light-receiving region 14 illustrated in FIG. 3A are preferably arranged at high density. With this structure, the resolution of the light-receiving element 62 can be increased and thus favorable image capturing can be performed.

Figure 5:
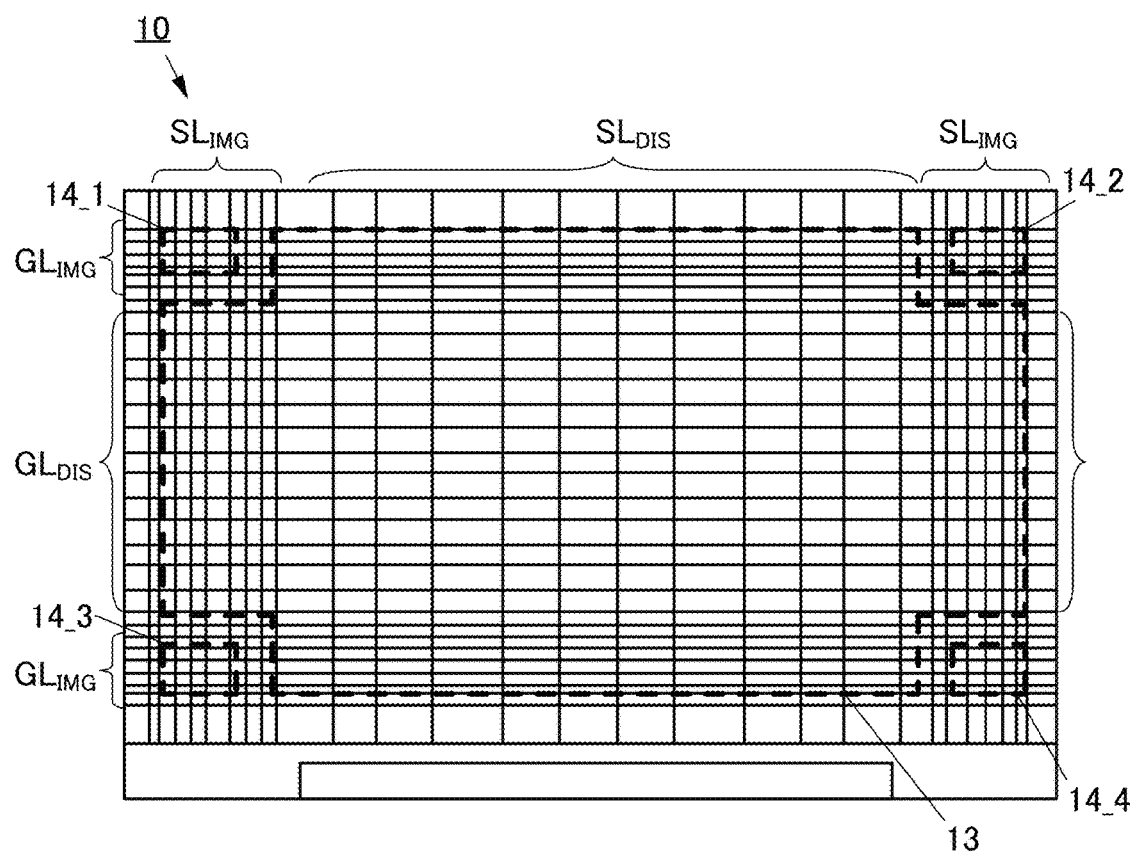
FIG. 5 illustrates a structure example of a display apparatus.

The above structure is described with reference to FIG. 5, for example. The display apparatus 10 illustrated in FIG. 5 includes the display region 13 and a plurality of light-receiving regions 14_1 to 14_4. A wiring $SL_{DIS}$ in FIG. 5 schematically represents a signal line electrically connected to the pixel circuit 51 (not illustrated). A wiring $SL_{IMG}$ in FIG. 5 schematically represents a signal line electrically connected to the pixel circuit 52 (not illustrated). A wiring $GL_{DIS}$ in FIG. 5 schematically represents a scan line electrically connected to the pixel circuit 51 (not illustrated). A wiring $GL_{IMG}$ in FIG. 5 schematically represents a scan line electrically connected to the pixel circuit 52 (not illustrated).

As illustrated in FIG. 5, in one embodiment of the present invention, distances between the wirings $GL_{IMG}$ and the wirings $SL_{IMG}$ provided in the light-receiving regions 14_1 to 14_4 and used for controlling the pixel circuits 52 are preferably smaller than distances between the wirings $GL_{DIS}$ and the wirings $SL_{DIS}$ provided in the display region 13 and used for controlling the pixel circuits 51. In other words, the resolution of an image captured by the light-receiving element 62 provided in the light-receiving regions 14_1 to 14_4 is preferably higher than that of an image displayed by the light-emitting element 61 provided in the display region 13. This structure allows the elements to be arranged at different densities depending on the regions; thus, the resolution of the light-receiving element 62 can be increased and favorable imaging can be performed.

As described above, the display apparatus of one embodiment of the present invention can include the light-emitting element of the display region and the light-receiving element of the light-receiving region in the same layer. Thus, as compared with the case where a display apparatus and a light-receiving apparatus are provided separately, the number of components can be reduced, leading to a reduction in size and weight of an electronic device including the display apparatus.

In the display apparatus of one embodiment of the present invention, the light-receiving regions are provided around the display region and overlap with the optical lenses. Thus, a clear image can be captured even when a distance between the display apparatus and an object is short, for example, when an image of the user's eyes is captured. When one embodiment of the present invention has a structure where an optical lens for image capturing is placed in a region overlapping with the light-receiving region, light emitted from the light-emitting element in the display region can be inhibited from being blocked by the optical lens. In one embodiment of the present invention where the light-receiving region and the optical lens can be placed to overlap with each other, a clear image can be captured while a high-quality image can be displayed in the display region; thus, both displaying a high-quality image and capturing a clear image can be achieved.

Structure Example 2 of Display Apparatus

Figure 6A:
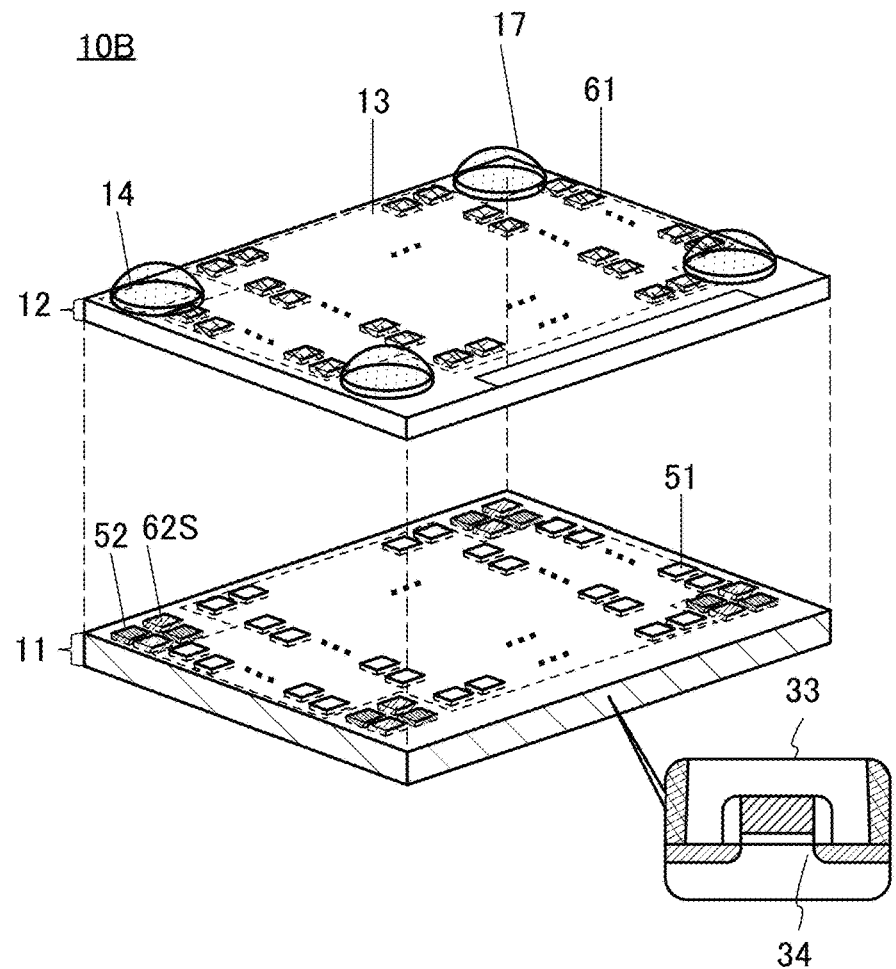
FIGS. 6A and 6B illustrate a structure example of a display apparatus.
Figure 6B:
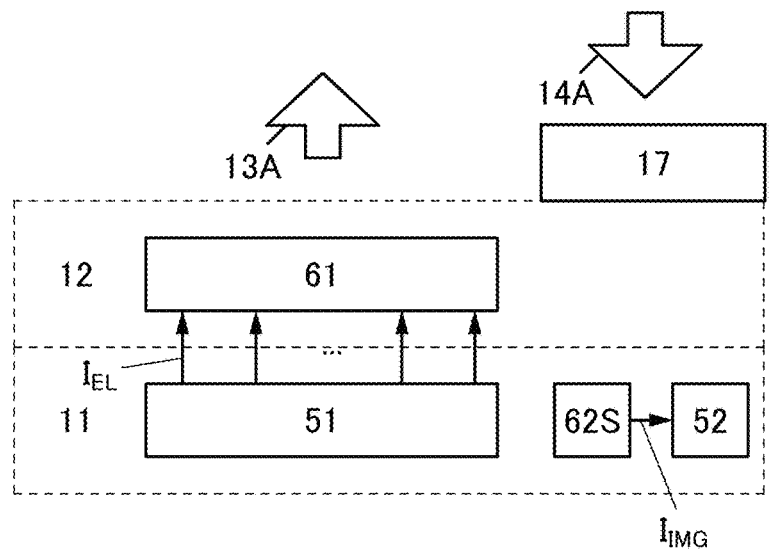

FIGS. 6A and 6B illustrate a structure different from that of the display apparatus 10A illustrated in FIGS. 4A and 4B.

FIG. 6A is a perspective view illustrating a display apparatus 10B having a structure in which a light-receiving element 62S as well as the pixel circuit 52 is provided in the layer 11, which includes the transistor 33 that is a Si transistor, in a region overlapping with the light-receiving region 14.

The layer 11 illustrated in FIG. 6A can be provided using a silicon substrate, and thus can include the light-receiving element 62S that is a Si photodiode or the like. The Si photodiode can be formed as a pn diode, a pin diode, or the like that is formed by adding an impurity element to the silicon substrate. With the structure in FIG. 6A, one embodiment of the present invention can be achieved without forming the light-emitting layer of the light-emitting element 61 and the active layer of the light-receiving element 62 in the layer 12 by the same method (e.g., a vacuum evaporation method).

FIG. 6B is a block diagram illustrating the structures of the layer 11, the layer 12, and the optical lens 17 in FIG. 6A. The pixel circuit 51 in the layer 11 outputs the current $I_{EL}$ corresponding to image data to the light-emitting element 61 in the layer 12. The light-emitting element 61 emits the light 13A corresponding to the current $I_{EL}$. The light-receiving element 62S in the layer 11 supplies the photocurrent $I_{IMG}$ to the pixel circuit 52 when receiving the light 14A through the layer 12 and the optical lens 17, and the pixel circuit 52 outputs reading data generated by the photocurrent $I_{IMG}$.

Structure Example 3 of Display Apparatus

Figure 7A:
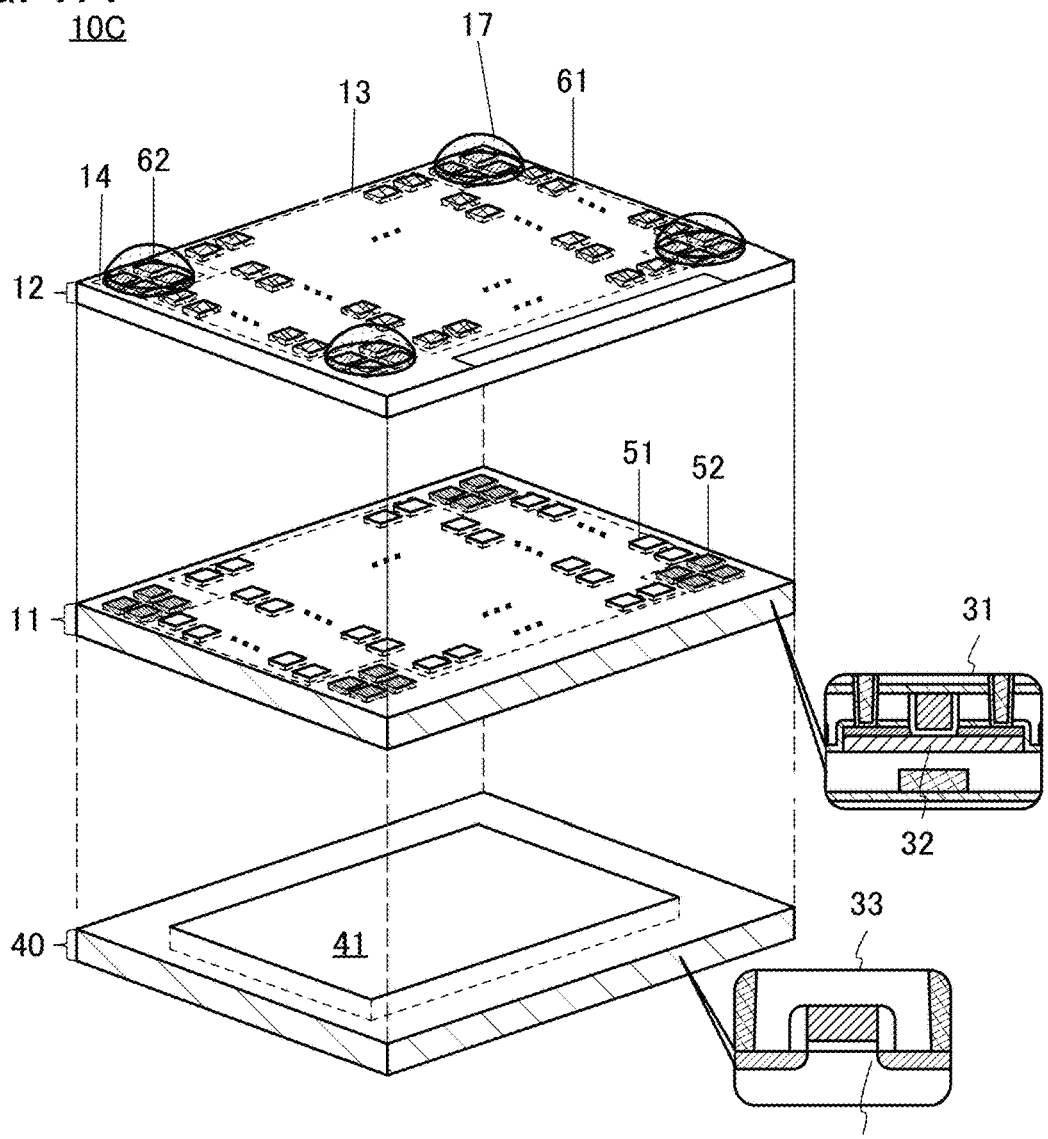
FIGS. 7A and 7B illustrate a structure example of a display apparatus.
Figure 7B:
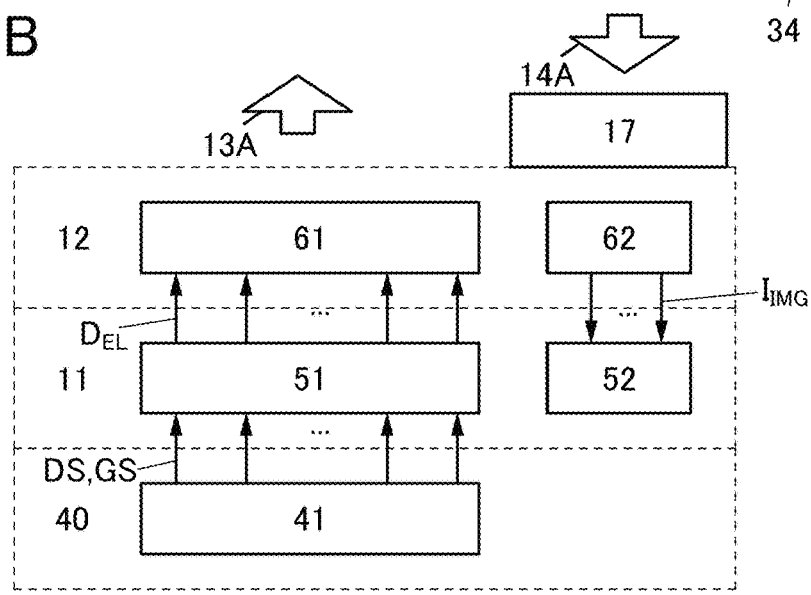

FIGS. 7A and 7B illustrate a structure different from that of the display apparatus 10 illustrated in FIGS. 3A and 3B.

FIG. 7A is a perspective view of a display apparatus 10C having a structure in which a layer 40 is added to the structure illustrated in FIG. 3A. The layer 40 includes a driver circuit 41 that outputs a variety of signals for driving the pixel circuit 51.

The driver circuit 41 included in the layer 40 illustrated in FIG. 7A includes the transistor 33 containing silicon in the channel formation region 34. Since the layer 40 can be provided using a silicon substrate, an OS transistor in the layer 11 can be directly formed over the layer 40. For the electrical connection between the layer 11 and the layer 40, it is possible to employ copper-to-copper (Cu-to-Cu) direct bonding (a technique for achieving electrical continuity by connecting copper (Cu) pads).

The driver circuit 41 includes a gate driver circuit, a source driver circuit, or the like, for example. In addition, an arithmetic circuit, a memory circuit, a power supply circuit, or the like may be included. Since the gate driver circuit, the source driver circuit, and other circuits can be placed to overlap with the display region 13, the width of a non-display region (also referred to as a bezel) provided along the outer periphery of the display region 13 of the display apparatus 10C can be extremely narrow compared with the case where these circuits are placed in the same plane as the display region 13, whereby the small display apparatus 10C can be achieved.

FIG. 7B is a block diagram illustrating the structures of the layer 40, the layer 11, the layer 12, and the optical lens 17 in FIG. 7A. The driver circuit 41 in the layer 40 outputs a data signal DS and a scan signal GS for driving the pixel circuit 51 in the layer 11. The pixel circuit 51 in the layer 11 outputs the current $I_{EL}$ corresponding to image data to the light-emitting element 61 in the layer 12. The light-emitting element 61 emits the light 13A corresponding to the current $I_{EL}$. The light-receiving element 62 in the layer 12 supplies the photocurrent $I_{IMG}$ to the pixel circuit 52 when receiving the light 14A through and the optical lens 17, and the pixel circuit 52 outputs reading data generated by the photocurrent $I_{IMG}$.

Figure 8A:
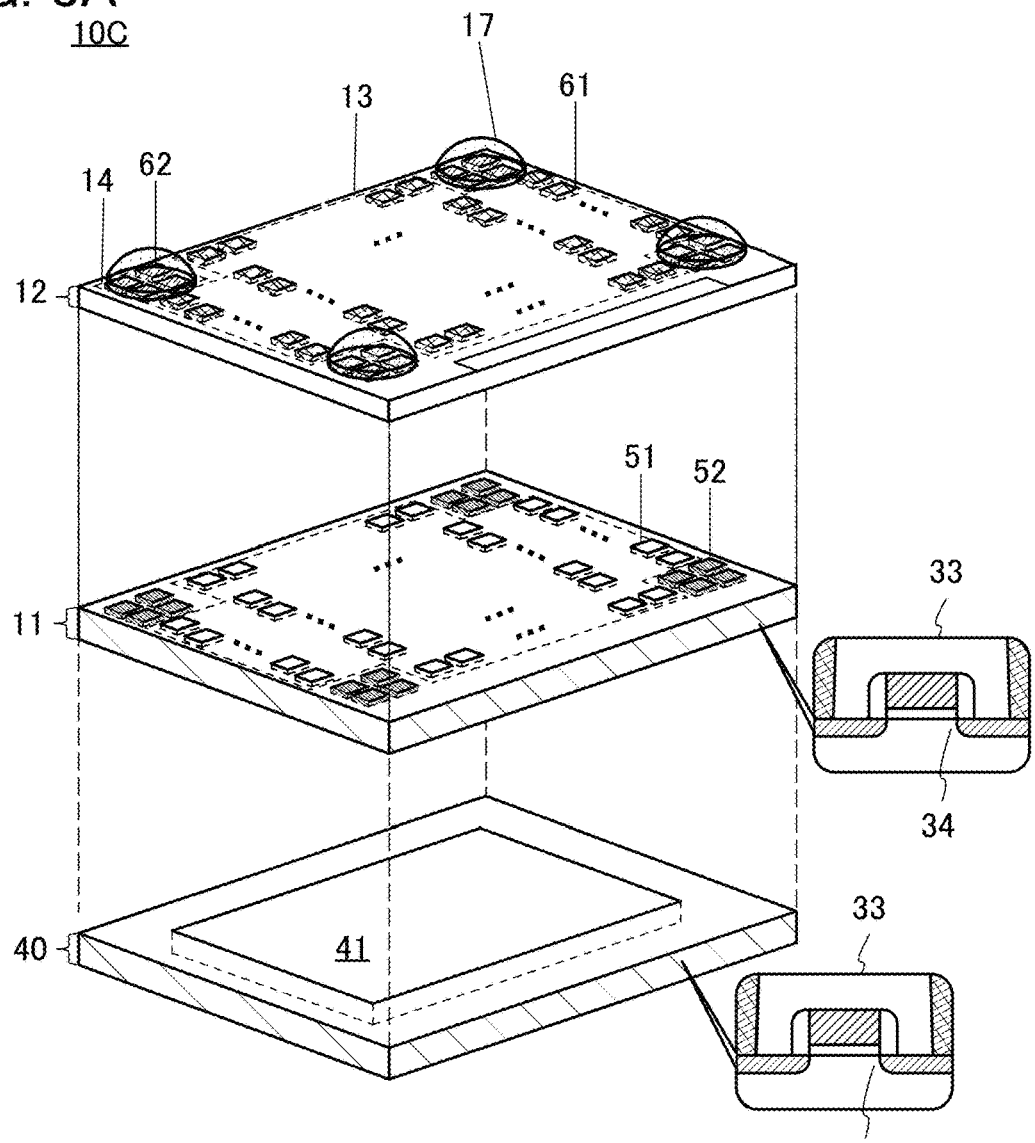
FIGS. 8A and 8B illustrate a structure example of a display apparatus.
Figure 8B:
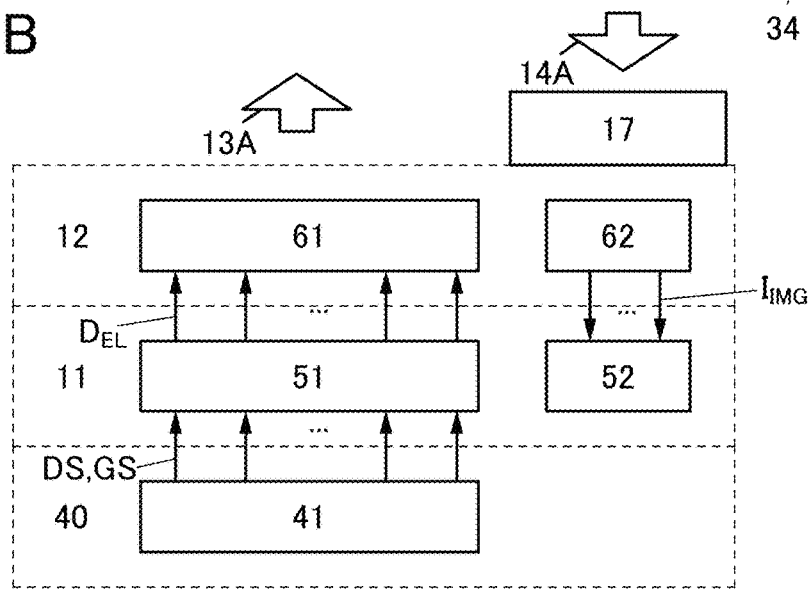

The structure of the layer 40 illustrated in FIGS. 7A and 7B can be applied to the display apparatus 10A illustrated in FIGS. 4A and 4B. For the electrical connection between the layer 11 and the layer 40 in this case, it is possible to employ copper-to-copper (Cu-to-Cu) direct bonding (a technique for achieving electrical continuity by connecting copper (Cu) pads). A structure example in this case are illustrated in FIGS. 8A and 8B.

Structure Example 4 of Display Apparatus

Figure 9A:
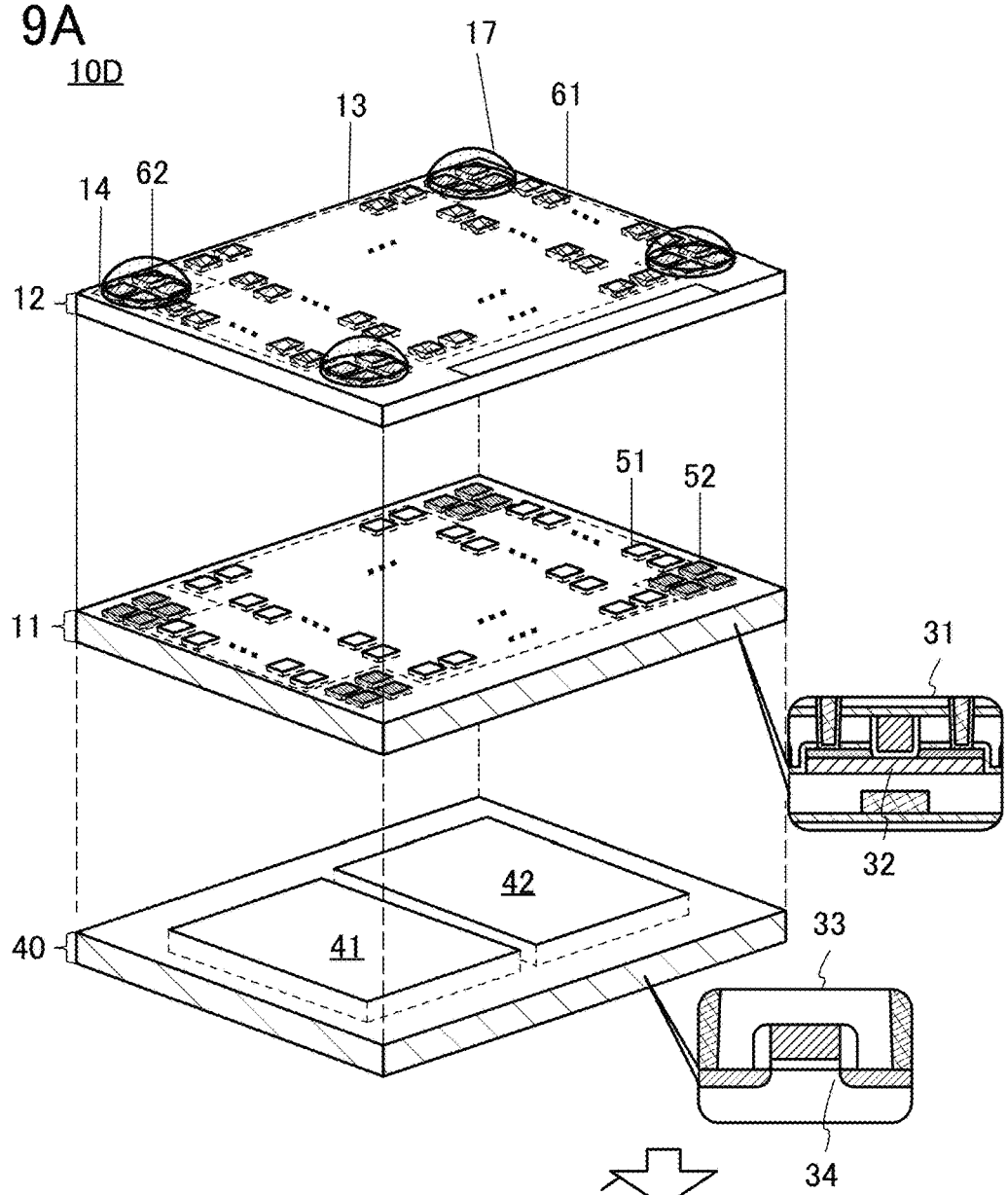
FIGS. 9A and 9B illustrate a structure example of a display apparatus.
Figure 9B:
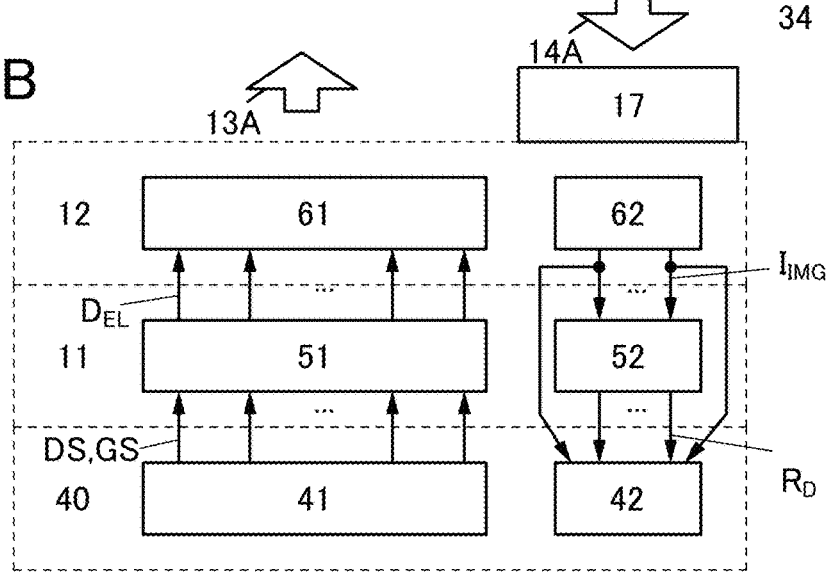

FIGS. 9A and 9B illustrate a structure different from that of the display apparatus 10 illustrated in FIGS. 3A and 3B.

FIG. 9A is a perspective view of a display apparatus 10D having a structure in which the layer 40 is added to the structure illustrated in FIG. 3A. The layer 40 includes the driver circuit 41 outputting a variety of signals for driving the pixel circuit 51 and an arithmetic circuit 42 for performing arithmetic operation on reading data obtained in the pixel circuit 52.

The driver circuit 41 and the arithmetic circuit 42 included in the layer 40 illustrated in FIG. 9A includes the transistor 33 containing silicon in the channel formation region 34. Since the layer 40 can be provided using a silicon substrate, an OS transistor in the layer 11 can be directly formed over the layer 40. For the electrical connection between the layer 11 and the layer 40, it is possible to employ copper-to-copper (Cu-to-Cu) direct bonding (a technique for achieving electrical continuity by connecting copper (Cu) pads).

The driver circuit 41 includes a gate driver circuit, a source driver circuit, or the like, for example. In addition, an arithmetic circuit, a memory circuit, a power supply circuit, or the like may be included. Since the gate driver circuit, the source driver circuit, and other circuits can be placed to overlap with the display region 13, the width of a non-display region (also referred to as a bezel) provided along the outer periphery of the display region 13 of the display apparatus 10D can be extremely narrow compared with the case where these circuits are placed in the same plane as the display region 13, whereby the small display apparatus 10D can be achieved.

The arithmetic circuit 42 is, for example, a circuit having a function of executing a product-sum operation processing in an artificial neural network. For example, the arithmetic circuit 42 is a circuit having a function of performing inference processing based on a hierarchical neural network such as a deep neural network (DNN) or a convolutional neural network (CNN). The arithmetic circuit 42 can perform eye tracking using a captured image of the user's eyes, by performing arithmetic operation using a current flowing through the light-receiving element 62 or the reading data obtained in the pixel circuit 52 as the input data.

As the eye tracking method, any of a pupil center corneal reflection method, a bright/dark pupil effect method, and the like may be employed. Alternatively, one embodiment of the present invention may employ a plurality of methods in an appropriate combination, e.g., the pupil center corneal reflection method and the bright/dark pupil effect method. Note that the reflected light is preferably intensified to perform eye tracking with high accuracy, and in this case, an infrared light source is preferably placed near eyeballs.

The arithmetic circuit 42 may have a function of correcting a data signal or the like to be supplied to the pixel circuit 51 in accordance with the amount of current flowing to the pixel circuit 51. That is, the arithmetic circuit 42 may function as a correcting circuit for monitoring and correcting the amount of current flowing to the pixel circuit 51. For example, the arithmetic circuit 42 can estimate the amount of current flowing from the pixel circuit 51 when the display apparatus 10D is started up, and can correct a signal for controlling the intensity of light from the light-emitting element 61 in accordance with the amount of current. This can reduce display defects due to variation in the amount of current flowing to the pixel circuit 51.

FIG. 9B is a block diagram illustrating the structures of the layer 40, the layer 11, the layer 12, and the optical lens 17 in FIG. 9A. The driver circuit 41 in the layer 40 outputs the data signal DS and the scan signal GS for driving the pixel circuit 51 in the layer 11. The pixel circuit 51 in the layer 11 outputs the current $I_{EL}$ corresponding to image data to the light-emitting element 61 in the layer 12. The light-emitting element 61 emits the light 13A corresponding to the current $I_{EL}$. The light-receiving element 62 in the layer 12 supplies the photocurrent $I_{IMG}$ to the pixel circuit 52 when receiving the light 14A through the optical lens 17, and the pixel circuit 52 outputs reading data $R_D$ generated by the photocurrent $I_{IMG}$. The arithmetic circuit 42 in the layer 40 can perform eye tracking of the user using the photocurrent $I_{IMG}$ and/or the reading data $R_D$ as the input data.

Figure 10A:
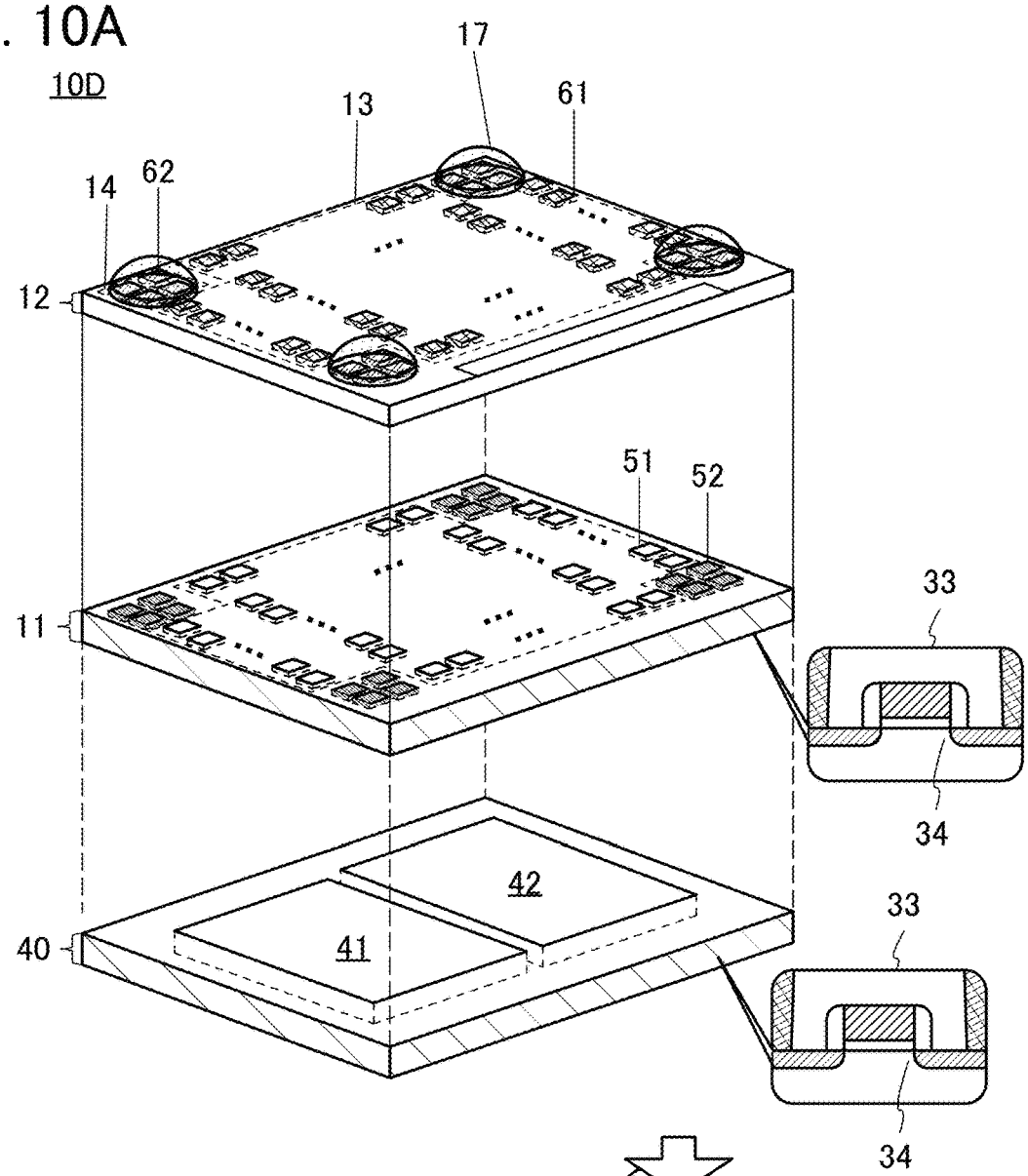
FIGS. 10A and 10B illustrate a structure example of a display apparatus.
Figure 10B:
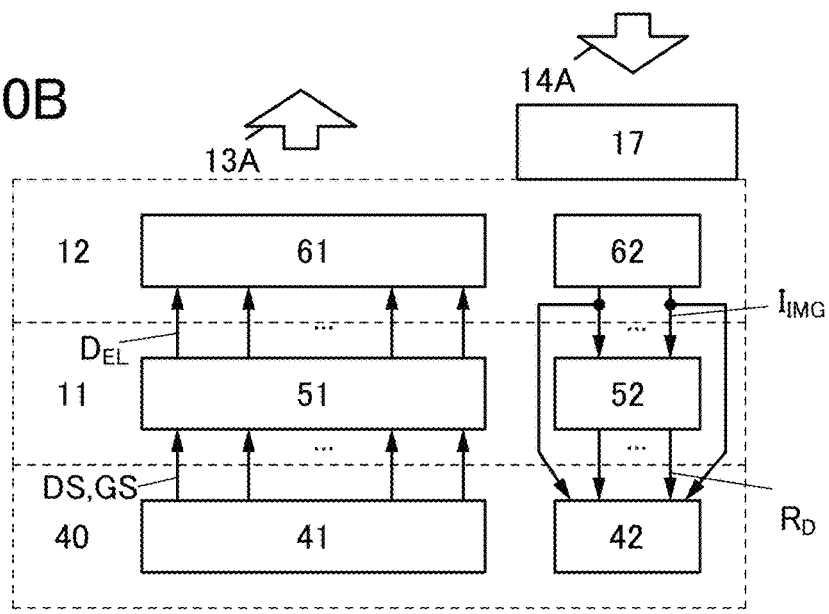

The structure of the layer 40 illustrated in FIGS. 9A and 9B can be applied to the display apparatus 10A illustrated in FIGS. 4A and 4B. FIGS. 10A and 10B illustrate a structure example in which the layer 11 including the transistor 33 is provided over the layer 40 including the transistor 33. In the case of the structure in FIGS. 10A and 10B, the electrical connection between the layer 11 and the layer 40 can be made by employing copper-to-copper (Cu-to-Cu) direct bonding (a technique for achieving electrical continuity by connecting copper (Cu) pads).

Figure 11A:
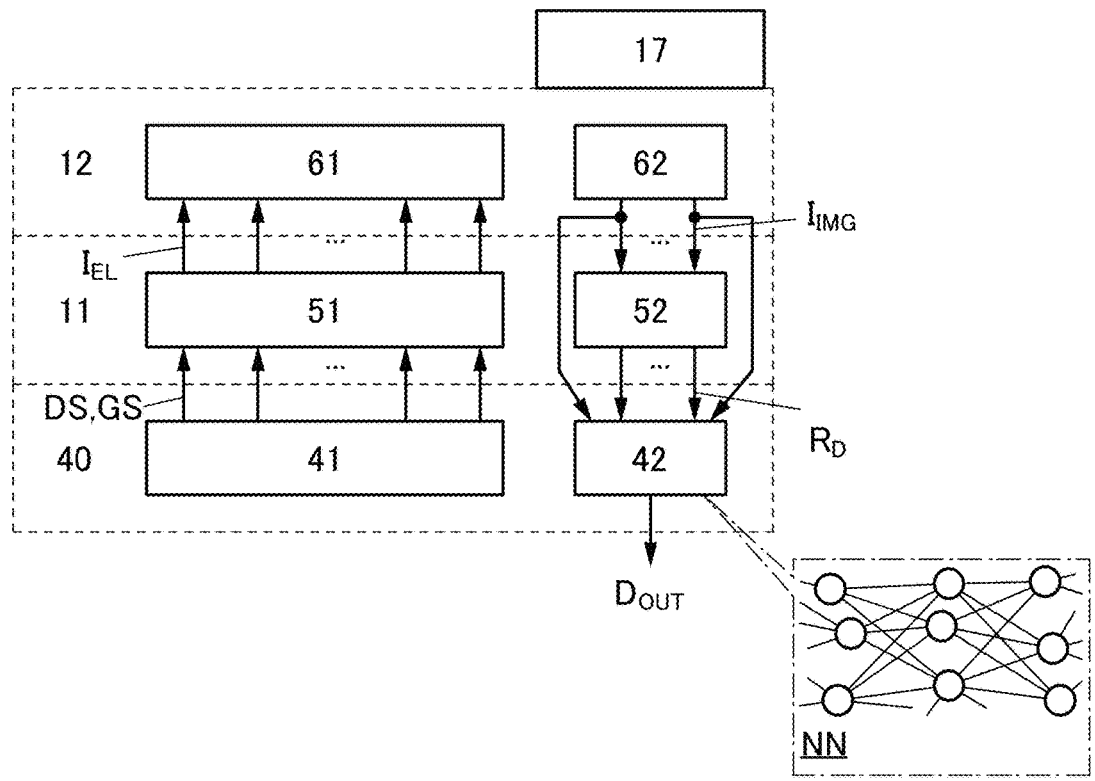
FIGS. 11A and 11B show inference processing based on a neural network NN.

FIG. 11A illustrates output data $D_{OUT}$ that is output when the arithmetic circuit 42 performs inference processing based on a neural network NN included in the arithmetic circuit 42 in the block diagram in FIG. 9B.

Figure 11B:
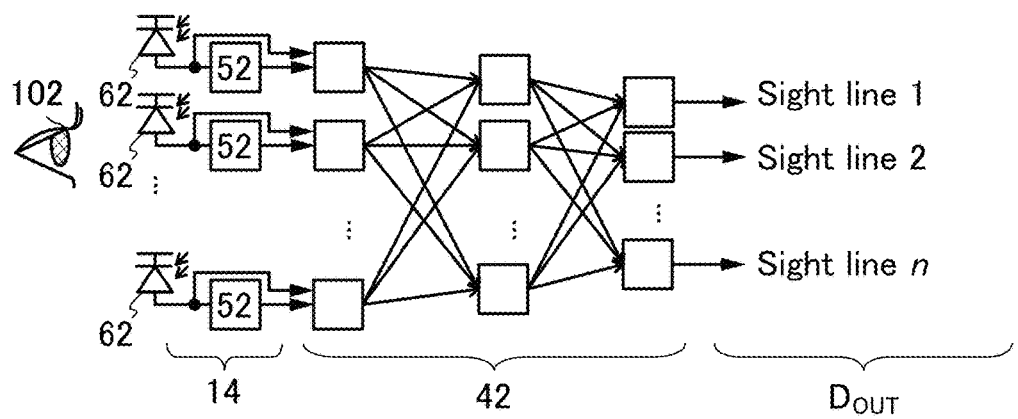

An example of inference processing in the neural network NN will be described with reference to FIG. 11B. The arithmetic circuit 42 that can perform arithmetic operation based on the neural network NN uses, as input data, a current flowing through the light-receiving element 62 and/or the reading data $R_D$ obtained when the light-receiving element 62 in the light-receiving region 14 captures an image of the eyes 102 of the user and their surroundings. The arithmetic circuit 42 performs product-sum operation using weight data or the like retained therein, and performs arithmetic operation based on the neural network. As the output data $D_{OUT}$ obtained in the arithmetic circuit 42, a plurality of sight lines such as a "sight line 1" to a "sight line n" can be inferred from the eyes 102 of the user and their surroundings.

As the neural network NN, a convolutional neural network (CNN), a recurrent neural network (RNN), an autoencoder (AE), a variational autoencoder (VAE), random forest, a support vector machine, gradient boosting, a generative adversarial network (GAN), or the like can be used, for example.

Figure 12A:
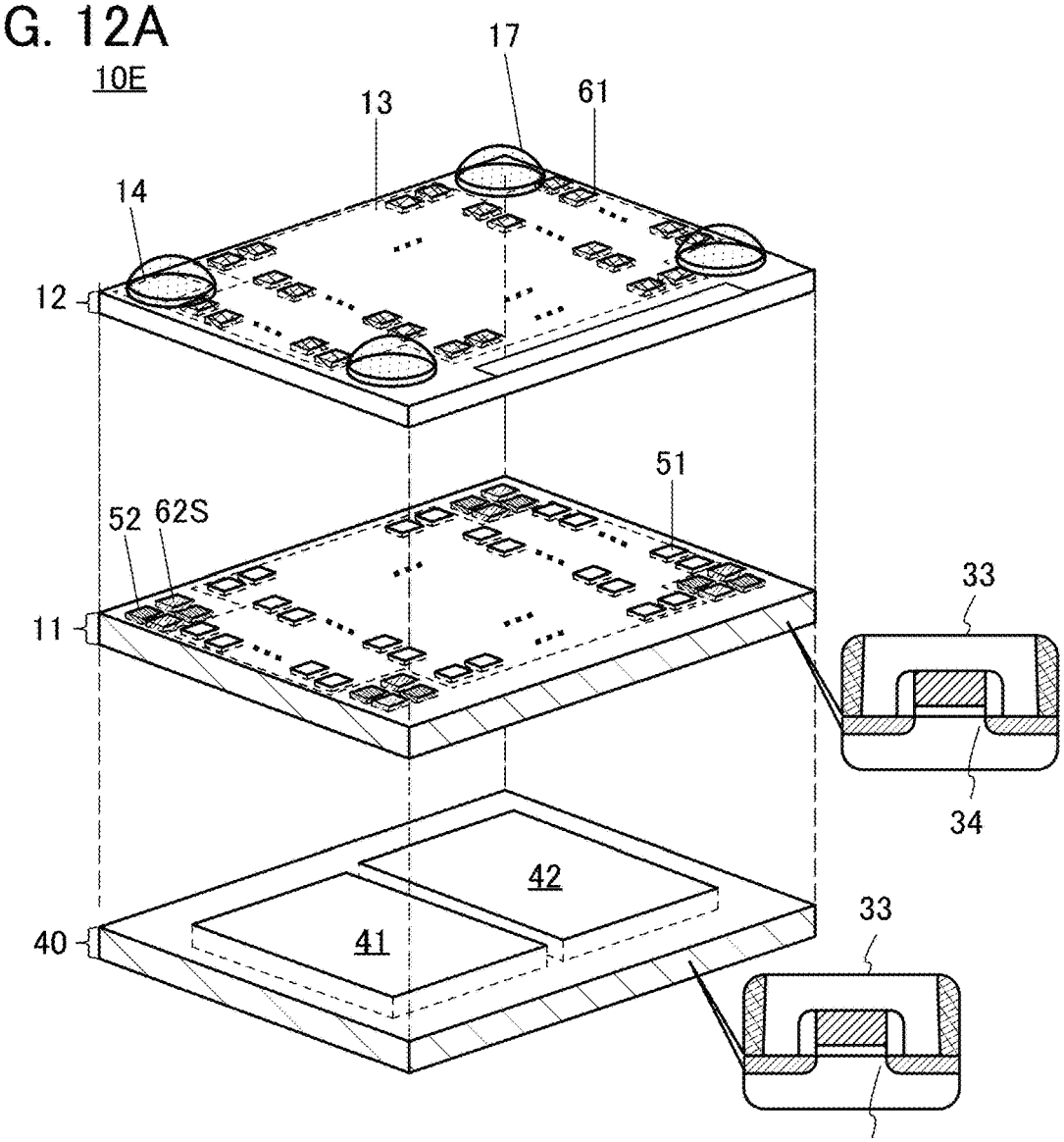
FIGS. 12A and 12B illustrate a structure example of a display apparatus.
Figure 12B:
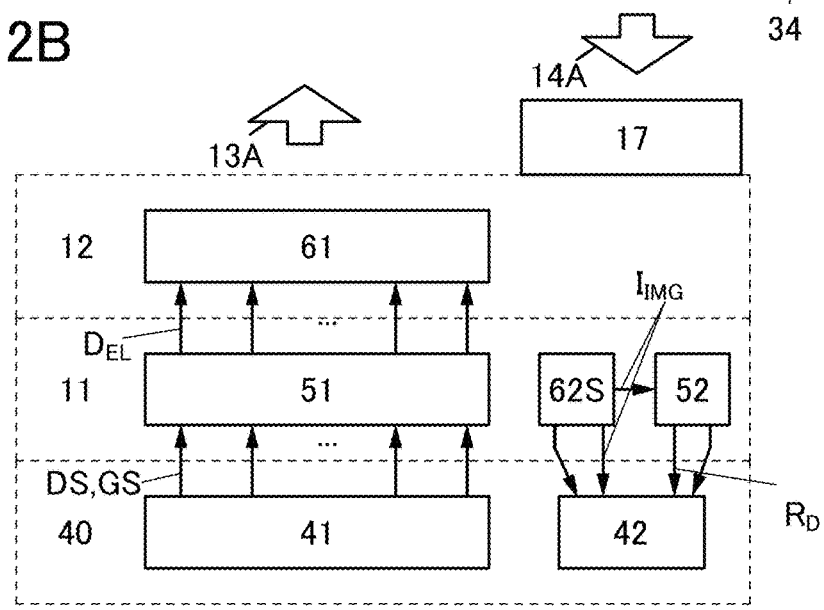

The structure illustrated in FIGS. 9A and 9B can be applied to the display apparatus 10B illustrated in FIGS. 6A and 6B. FIG. 12A is a perspective view of this case and FIG. 12B is a block diagram corresponding to the perspective view in FIG. 12A. A display apparatus 10E illustrated in FIGS. 12A and 12B can operate in a manner similar to that of the display apparatus 10D illustrated in FIGS. 9A and 9B. For the electrical connection between the layer 11 and the layer 40, it is possible to employ copper-to-copper (Cu-to-Cu) direct bonding (a technique for achieving electrical continuity by connecting copper (Cu) pads).

Figure 13:
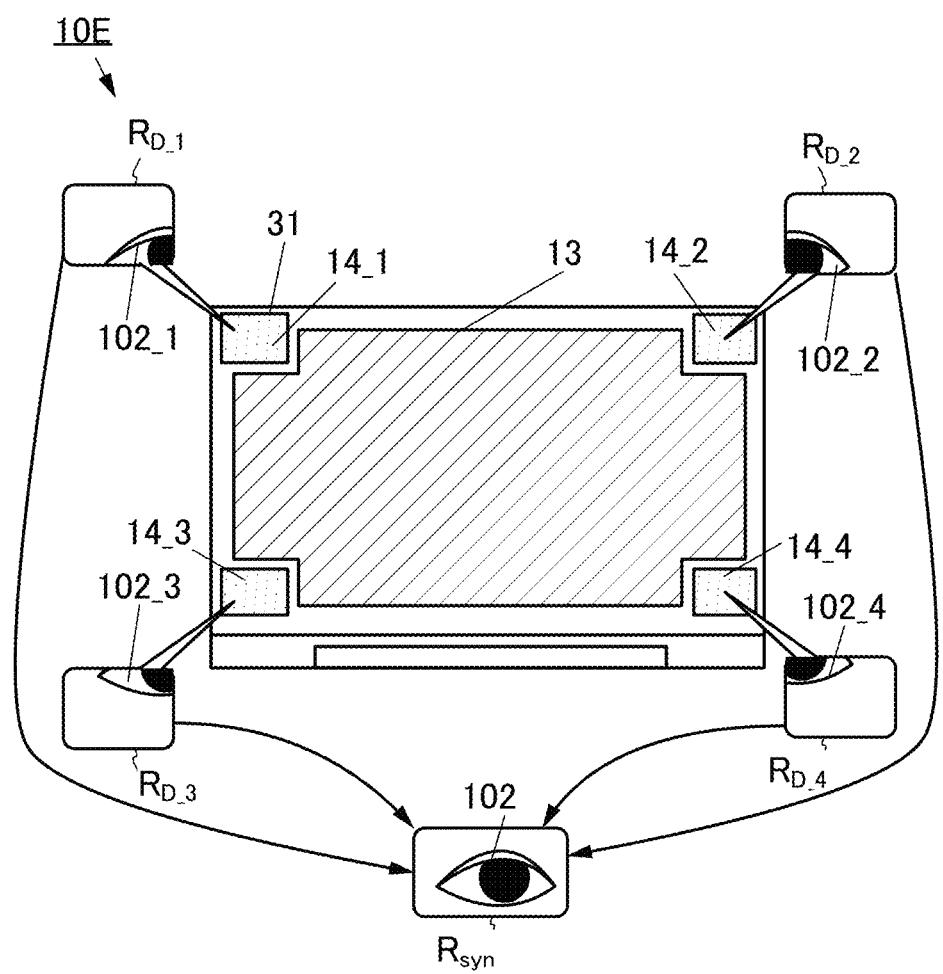
FIG. 13 illustrates a structure example of a display apparatus.

The eye tracking is not limited to being performed by arithmetic operation based on the neural network, and may be performed on the basis of imaging data obtained in the plurality of light-receiving regions. For example, as illustrated in a schematic view in FIG. 13, eye tracking may be performed in such a manner that a plurality of eye images 102_1 to 102_4 are obtained from imaging data $R_{D\_1}$ to $R_{D\_4}$ obtained respectively in the light-receiving regions 14_1 to 14_4 provided around the display region 13, image data $R_{syn}$ is synthesized on the basis of the eye images 102_1 to 102_4 to obtain an image of the eye 102, and then image analysis is performed in the arithmetic circuit 42.

Structure Example 5 of Display Apparatus

Figure 14:
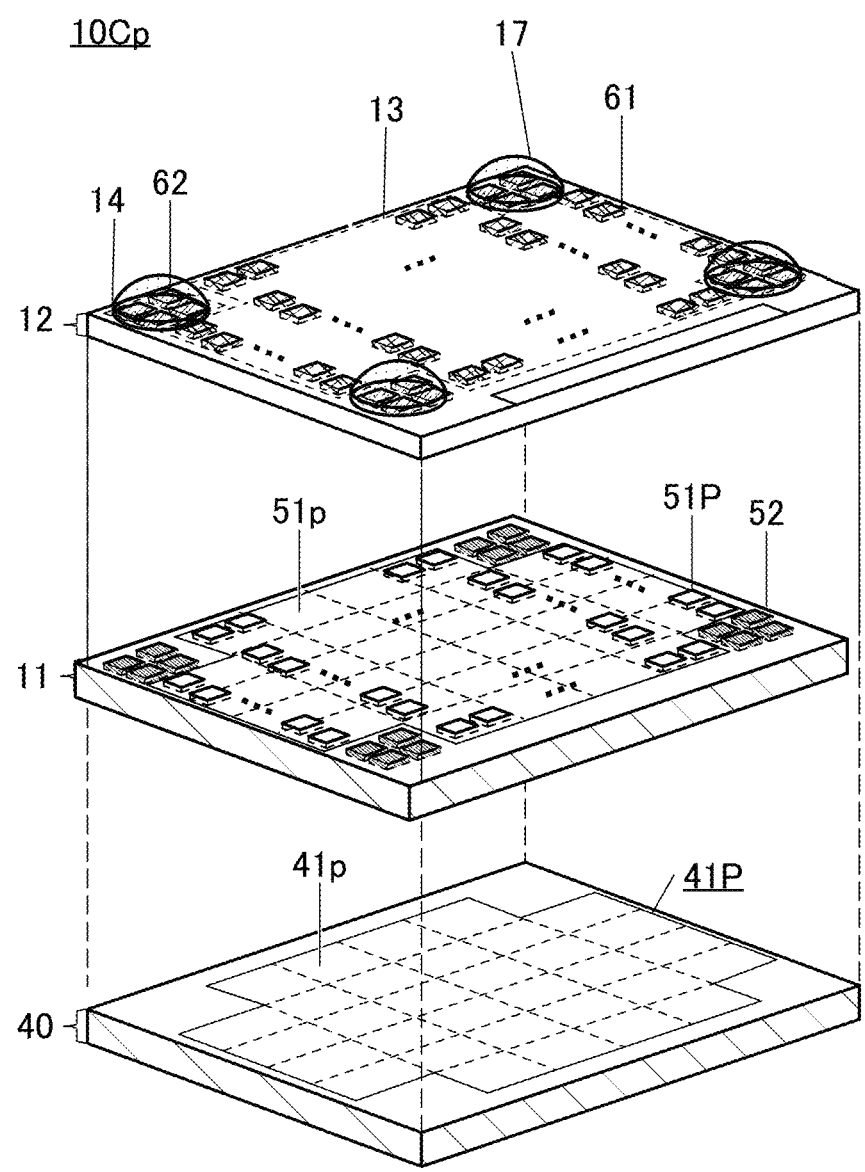
FIG. 14 illustrates a structure example of a display apparatus.

FIGS. 14 to 16 illustrate variation examples of the display apparatus 10C illustrated in FIG. 7A. Note that description is made mainly on portions different from those of the display apparatus 10C to reduce repeated description.

In a perspective view of a display apparatus 10Cp illustrated in FIG. 14, a section 51p of a pixel circuit portion 51P and a section 41p of a driver circuit portion 41P are provided to overlap with each other. The pixel circuit portion 51P is a region where a plurality of pixel circuits 51 illustrated in FIG. 7A are provided. The driver circuit portion 41P is a region where a plurality of driver circuits 41 illustrated in FIG. 7A are provided. In the display apparatus 10Cp, the pixel circuit portion 51P is divided into a plurality of sections 51p and the driver circuit portion 41P is divided into a plurality of sections 41p. The plurality of sections 41p each include a source driver circuit 43 and a gate driver circuit 44.

Figure 15A:
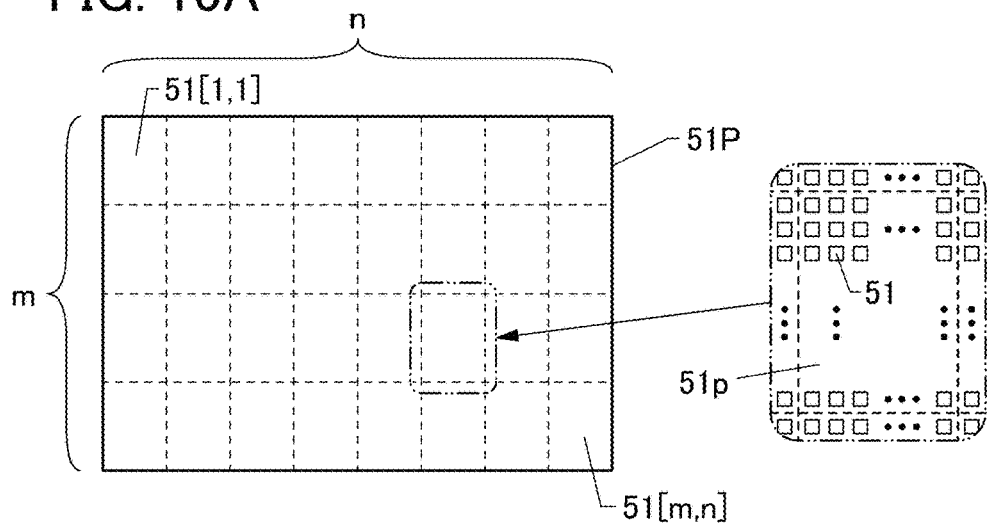
FIGS. 15A to 15C illustrate a structure example of a display apparatus.
Figure 15B:
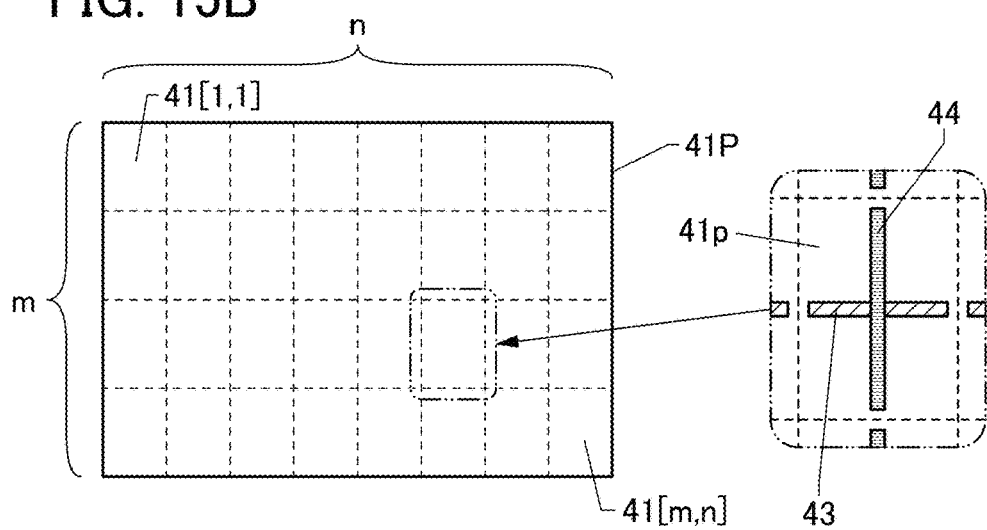

FIG. 15A illustrates a structure example of the pixel circuit portion 51P included in the display apparatus 10Cp. FIG. 15B illustrates a structure example of the driver circuit portion 41P included in the display apparatus 10Cp. The sections 51p and the sections 41p are each arranged in a matrix of m rows and n columns (m and n are each an integer of 1 or more). In this specification and the like, the section 51p in the first row and the first column is denoted by a section 51[1,1], and the section 51p in the m-th row and the n-th column is denoted by a section 51[m,n]. Similarly, the section 41p in the first row and the first column is denoted by a section 41[1,1], and the section 41p in the m-th row and the n-th column is denoted by a section 41[m,n]. FIGS. 15A and 15B illustrate a case where m is 4 and n is 8. That is, the pixel circuit portion 51P and the driver circuit portion 41P are each divided into 32 sections.

The plurality of sections 51p each include a plurality of pixel circuits 51, a plurality of wirings SL, and a plurality of wirings GL. In each of the sections 51p, one of the pixel circuits 51 is electrically connected to one of the wirings SL and one of the wirings GL.

Figure 15C:
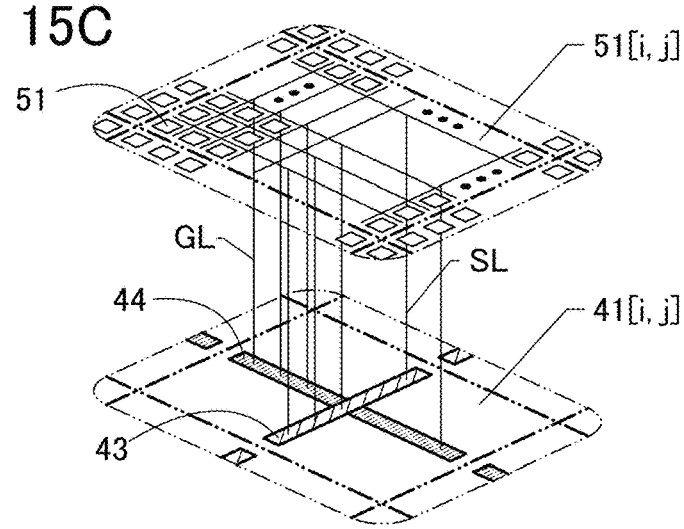

One of the sections 51p and one of the sections 41p are provided to overlap with each other (see FIG. 15C). For example, a section 51[i,j] (i is an integer greater than or equal to 1 and less than or equal to m, and j is an integer greater than or equal to 1 and less than or equal to n) and a section 41[i,j] are provided to overlap with each other. The source driver circuit 43 included in the section 41[i,j] is electrically connected to the wiring SL included in the section 51[i,j]. The gate driver circuit 44 included in the section 41[i,j] is electrically connected to the wiring GL included in the section 51[i,j]. The gate driver circuit 44 included in the section 41[i,j] has a function of controlling the pixel circuits 51 included in the section 41[i,j].

When the section 51[i,j] and the section 41[i,j] are provided to overlap with each other, a connection distance (wiring length) between the pixel circuit 51 included in the section 51[i,j] and each of the source driver circuit 43 and the gate driver circuit 44 included in the section 41[i,j] can be made extremely short. As a result, the wiring resistance and the parasitic capacitance are reduced, and thus time taken for charging and discharging can be reduced and high-speed driving can be achieved. Moreover, power consumption can be reduced.

In addition, the display apparatus 10Cp includes the source driver circuit 43 and the gate driver circuit 44 in each section 41p. Thus, the display region 13 can be divided to correspond to the section 51p and the section 41p therebelow, and image rewriting can be performed in each section. For example, the display region 13 can perform image rewriting only in a section with an image change and can retain image data in a section with no change, thereby reducing the power consumption.

Figure 16A:
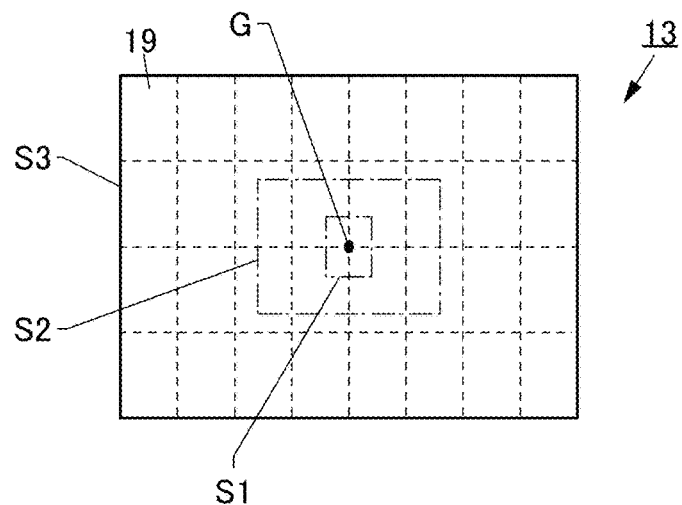
FIGS. 16A to 16C each illustrate a structure example of a display apparatus.
Figure 16B:
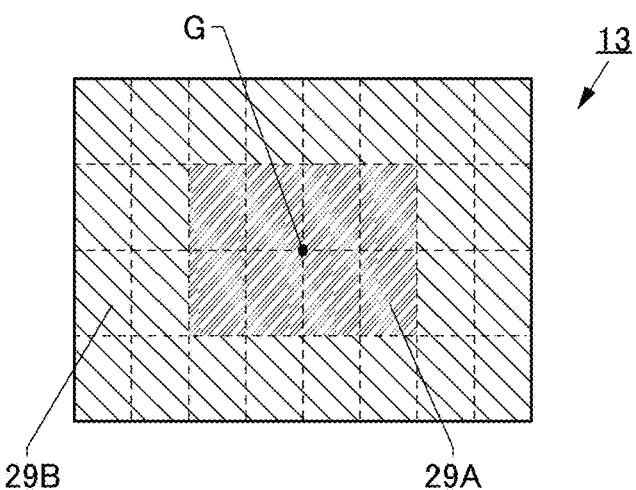

In this embodiment or the like, one of the display regions 13 divided for each section 51p is referred to as a sub-display portion 19. FIG. 16A illustrates a case where the display region 13 of the display apparatus 10Cp described with reference to FIG. 14 and FIGS. 15A to 15C is divided into 32 sub-display portions 19. The sub-display portion 19 includes a plurality of pixels 71. Specifically, one sub-display portion 19 includes one section 51p including a plurality of pixel circuits 51, and a plurality of light-emitting elements 61. One section 41p has a function of controlling the plurality of pixels 71 included in one sub-display portion 19.

In the display apparatus 10Cp, driving frequency (e.g., frame frequency) for displaying an image can be set freely in each sub-display portion 19 by a timing controller that controls the driver circuit 41. Thus, the driving frequency can be set freely in each sub-display portion 19.

The display apparatus of one embodiment of the present invention, in which the pixel circuit and the driver circuit are stacked and the driving frequency is set freely in each sub-display portion 19 in accordance with the eye movement, can achieve low power consumption.

FIG. 16A illustrates the display region 13 including the sub-display portions 19 in four rows and eight columns. FIG. 16A also illustrates a first region 51 to a third region S3 with a gaze point G as a center. Each of the sub-display portions 19 included in the display region 13 belongs to a first section 29A overlapping with the first region 51 or the second region S2, or a section 29B overlapping with the third region S3. In this case, the first section 29A overlapping with the first region 51 or the second region S2 that is close to the gaze point G of the user includes the gaze point G and the sub-display portions 19 in the vicinity of the gaze point G, and the second section 29B positioned in the outer periphery of the first section 29A includes the sub-display portions 19 positioned far from the gaze point G of the user (see FIG. 16B).

The operation of the driver circuits (the source driver circuit 43 and the gate driver circuit 44) included in each of the sections 41p is controlled by a timing controller. For example, when the driving frequency of the second section 29B is set lower than that of the first section 29A, power consumed by display in regions far from the gaze point G, which is perceived by the user with low visibility, can be reduced. Thus, a reduction in power consumption of the display apparatus 10Cp can be achieved. By reducing the frequency of rewriting image data depending on the section, the power consumption can be reduced.

The driving frequency of the first section 29A can be higher than or equal to 30 Hz and lower than or equal to 500 Hz, preferably higher than or equal to 60 Hz and lower than or equal to 500 Hz. The driving frequency of the second section 29B is preferably lower than or equal to that of the first section 29A, further preferably lower than or equal to a half of that of the first section 29A, still further preferably lower than or equal to one fifth of that of the first section 29A.

Figure 16C:
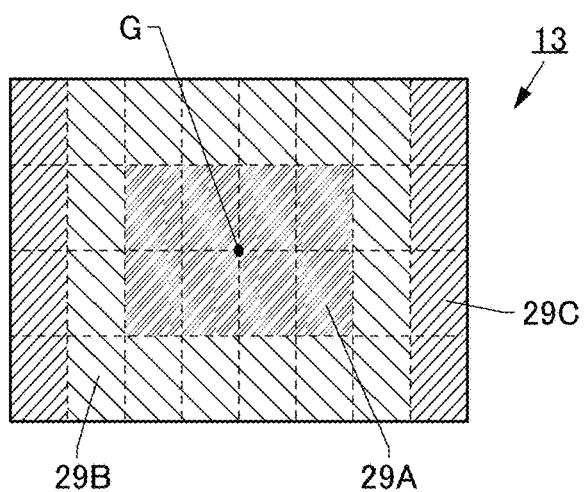

Among the sub-display portions 19 overlapping with the third region S3, the sub-display portions 19 positioned farther from the gaze point G may be set as a third section 29C, and image data rewriting (refreshing) may be stopped in the sub-display portions 19 included in the third section 29C (see FIG. 16C). Stopping image data rewriting can further reduce the power consumption.

When such a driving method is employed, a transistor with an extremely low off-state current is suitably used as a transistor included in the pixel circuit 51. For example, an OS transistor is suitably used as the transistor included in the pixel circuit 51. The OS transistor has an extremely low off-state current and thus can achieve long-term retention of image data supplied to the pixel circuit 51.

<Structure Example of Electronic Device Including Display Apparatus>

Figure 17A:
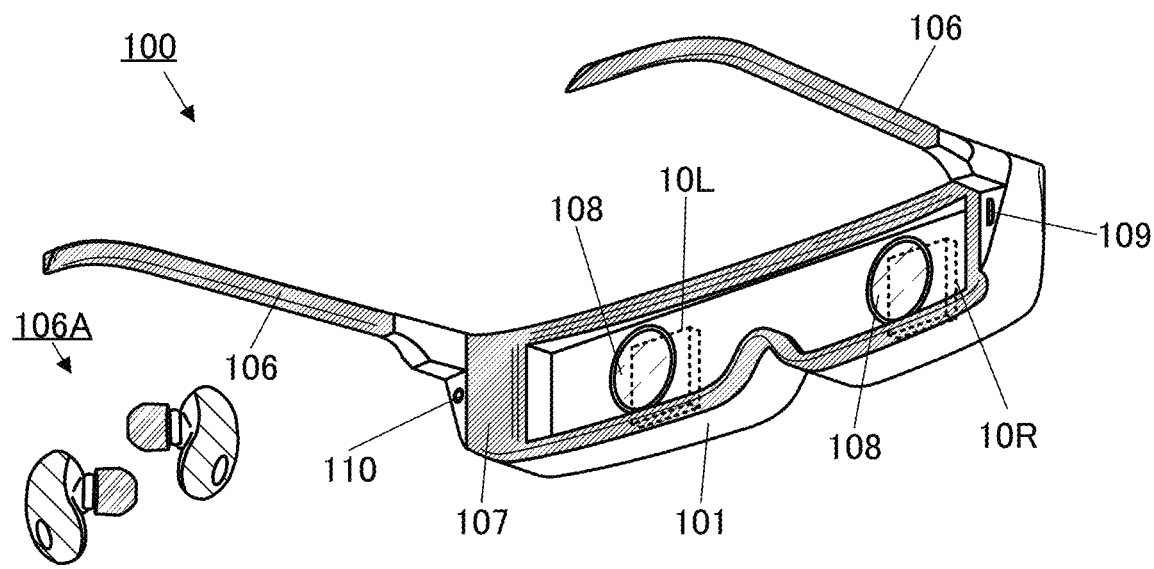
FIGS. 17A and 17B each illustrate a structure example of a display apparatus.

FIG. 17A is a perspective view illustrating a back, bottom, and right side of the electronic device 100 including the display apparatus 10 described above.

In FIG. 17A, the housing 101 of the electronic device 100 includes, for example, a mounting portion 106, a cushion 107, a pair of lenses 108, and the like, in addition to the pair of display apparatus 10_L and 10_R. The display region 13 in each of the pair of display apparatus 10_L and 10_R is provided at a position where the display region 13 can be seen through the lens 108 inside the housing 101.

The light-receiving region 14 in each of the pair of display apparatus 10_L and 10_R is provided at a position where data on the eyes 102 of the user and their surroundings can be acquired. The acquirement of data on the eyes 102 of the user and their surroundings in the light-receiving region 14 can be performed either through the lenses 108 inside the housing 101 or without the lenses 108.

In addition, an input terminal 109 and an output terminal 110 are provided in the housing 101 illustrated in FIG. 17A. To the input terminal 109, a cable for supplying an image signal (image data) from a video output device or the like, power for charging a battery provided in the housing 101, or the like can be connected. The output terminal 110 can function as, for example, an audio output terminal to which earphones, headphones, or the like can be connected.

In addition, the housing 101 preferably includes a mechanism by which the right and left positions of the lenses 108 and the display apparatuses 10_L and 10_R can be adjusted to the optimal positions in accordance with the positions of the user's eyes. The housing 101 preferably includes a mechanism for adjusting focus by changing the distance between the lenses 108 and the display apparatuses 10_L and 10_R.

The cushion 107 is in contact with the user's face (forehead, cheek, or the like). When the cushion 107 is in close contact with the user's face, light leakage can be prevented, which increases the sense of immersion. A soft material is preferably used for the cushion 107 so that the cushion 107 is in close contact with the user's face when the user wears the electronic device 100. Furthermore, using such a material is preferable because it provides a soft texture and the user does not feel cold when wearing the electronic device in a cold season, for example. A member in contact with user's skin, such as the cushion 107 or the mounting portion 106, is preferably detachable because cleaning or replacement can be easily performed.

The electronic device of one embodiment of the present invention may further include earphones 106A. The earphones 106A include a communication portion (not illustrated) and has a wireless communication function. The earphones 106A can output audio data with the wireless communication function. The earphones 106A may include a vibration mechanism to function as bone-conduction earphones.

Figure 17B:
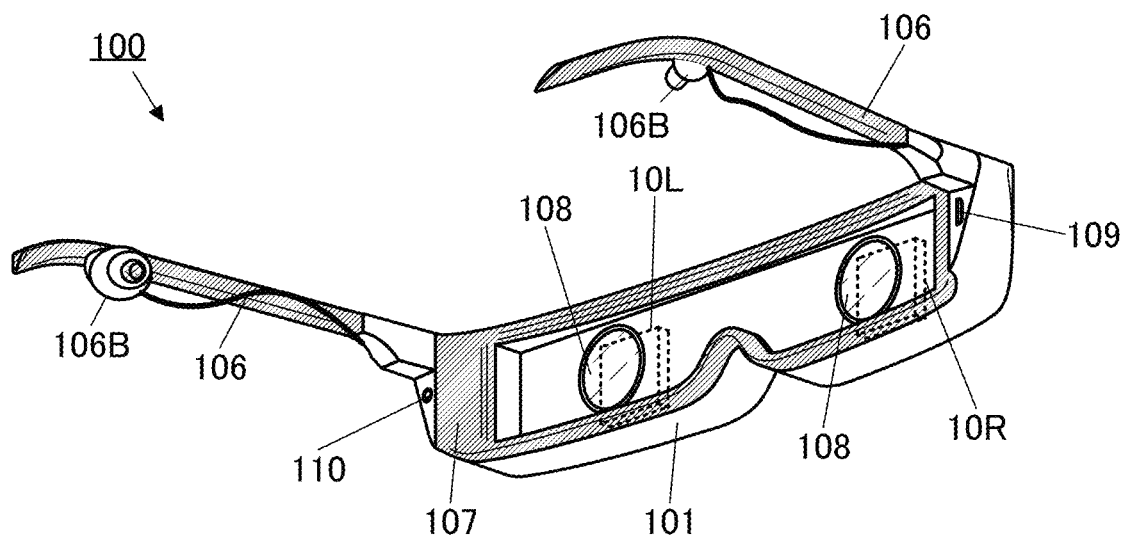

The earphones 106A can be directly connected to or connected with wire to the mounting portion 106 like earphones 106B illustrated in FIG. 17B. The earphones 106B and the mounting portion 106 may each have a magnet. This is preferred because the earphones 106B can be fixed to the mounting portion 106 with magnetic force and thus can be easily housed.

<Three-Dimensional Structure of Driver Circuit, Pixel Circuit, and Light-Emitting Element>

Figure 18A:
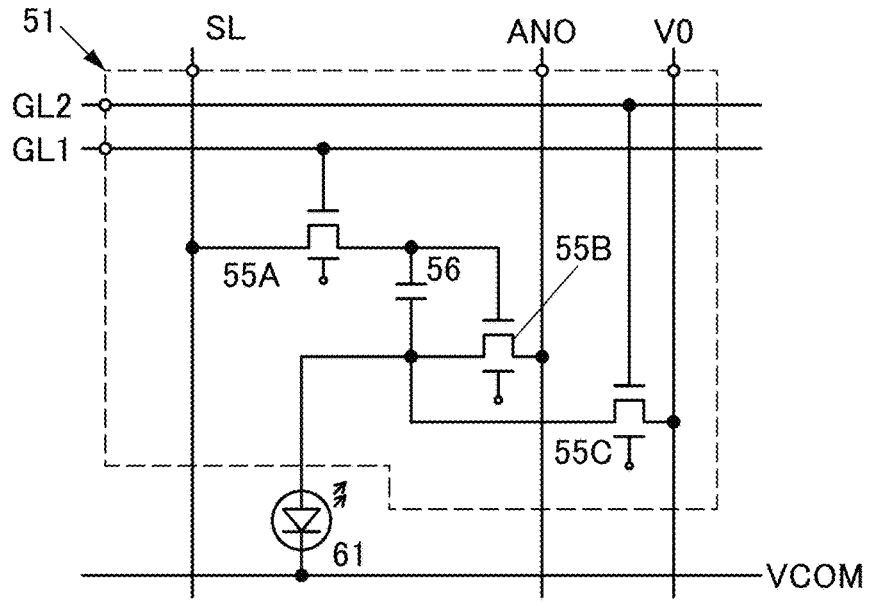
FIGS. 18A and 18B each illustrate a structure example of a display apparatus.
Figure 18B:
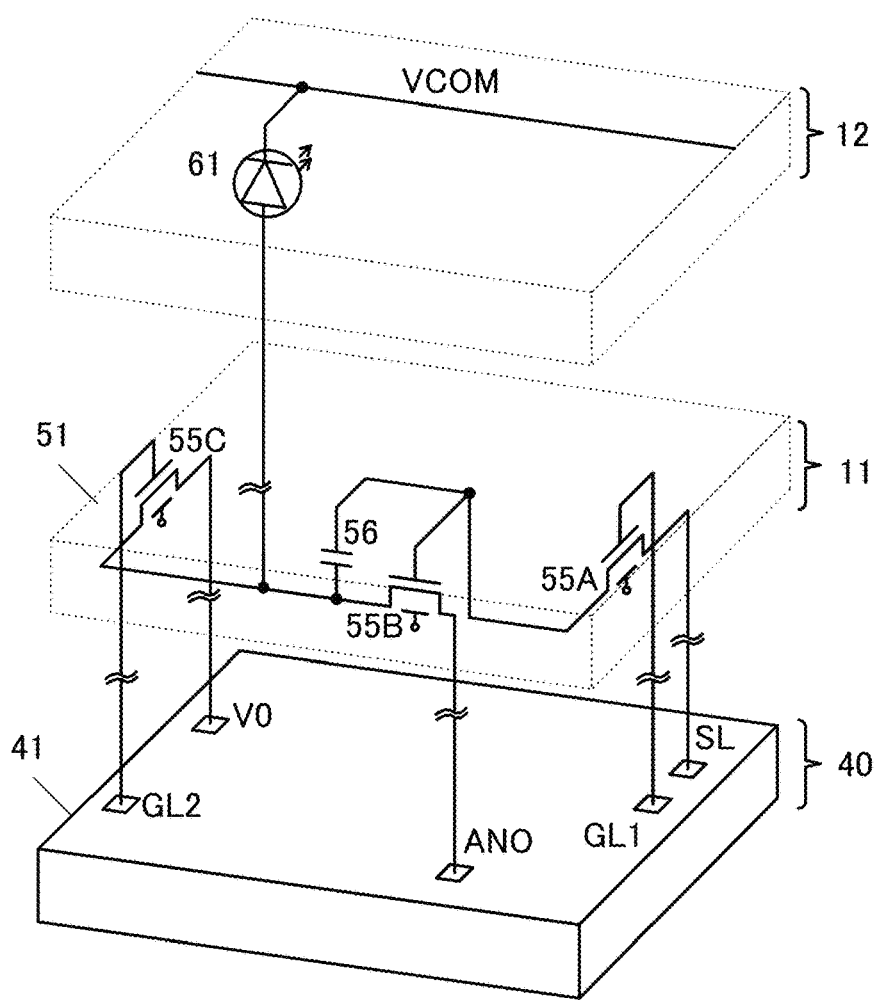

FIGS. 18A and 18B illustrate structure examples of the pixel circuit 51 and the light-emitting element 61 connected to the pixel circuit 51. FIG. 18A schematically illustrates the connection relation of the elements, and FIG. 18B schematically illustrates the vertical position relation of the layer 40 including the driver circuit 41, the layer 11 including a plurality of transistors of the pixel circuit 51, and the layer 12 including the light-emitting element 61.

The pixel circuit 51 illustrated as an example in FIGS. 18A and 18B includes a transistor 55A, a transistor 55B, a transistor 55C, and a capacitor 56. The transistor 55A, the transistor 55B, and the transistor 55C can be OS transistors. Each of the OS transistors of the transistor 55A, the transistor 55B, and the transistor 55C preferably includes a back gate electrode, in which case the back gate electrode and a gate electrode can be supplied with the same signals or different signals.

The transistor 55B includes the gate electrode electrically connected to the transistor 55A, a first electrode electrically connected to the light-emitting element 61, and a second electrode electrically connected to a wiring ANO. The wiring ANO supplies a potential for supplying a current to the light-emitting element 61.

The transistor 55A includes a first terminal electrically connected to the gate electrode of the transistor 55B, a second terminal electrically connected to the wiring SL functioning as a source line, and the gate electrode having a function of controlling the conduction state or the non-conduction state on the basis of the potential of a wiring GL1 functioning as a gate line.

The transistor 55C includes a first terminal electrically connected to a wiring V0, a second terminal electrically connected to the light-emitting element 61, and the gate electrode having a function of controlling the conduction state or the non-conduction state on the basis of the potential of a wiring GL2 functioning as a gate line. The wiring V0 supplies a reference potential and outputs a current flowing in the pixel circuit 51 to the driver circuit 41 or the arithmetic circuit 42.

The capacitor 56 includes a conductive film electrically connected to the gate electrode of the transistor 55B and a conductive film electrically connected to the second electrode of the transistor 55C.

The light-emitting element 61 includes a first electrode electrically connected to the first electrode of the transistor 55B and a second electrode electrically connected to a wiring VCOM. The wiring VCOM supplies a potential for supplying a current to the light-emitting element 61.

Accordingly, the intensity of light emitted by the light-emitting element 61 can be controlled in accordance with an image signal supplied to the gate electrode of the transistor 55B. Furthermore, variations in the gate-source voltage of the transistor 55B can be reduced by the reference potential of the wiring V0 supplied through the transistor 55C.

A current value that can be used for setting pixel parameters can be output from the wiring V0. Specifically, the wiring V0 can function as a monitor line for outputting a current flowing through the transistor 55B or a current flowing through the light-emitting element 61 to the outside. A current output to the wiring V0 is converted into a voltage by a source follower circuit or the like and output to the outside. Alternatively, a current output to the wiring V0 can be converted into a digital signal by an A-D converter or the like and output to the arithmetic circuit 42 or the like.

In the structure illustrated as an example in FIG. 18B, the wirings electrically connecting the pixel circuit 51 and the driver circuit 41 can be made short, so that the wiring resistance of the wirings can be reduced. Thus, data writing can be performed at high speed, leading to high-speed operation of the display apparatus 10. Therefore, even when the display apparatus 10 includes a large number of pixel circuits 51, a sufficiently long frame period can be ensured and thus the pixel density of the display apparatus 10 can be increased. In addition, the increased pixel density of the display apparatus 10 can increase the resolution of an image displayed by the display apparatus 10. Thus, the display apparatus 10 can be, for example, a display apparatus for VR or AR and can be suitably used in an electronic device with a short distance between the display region and the user, such as an HMD.

The layer 11, the layer 12, and the layer 40 illustrated in FIGS. 18A and 18B can also include the arithmetic circuit 42, the pixel circuit 52, and the light-receiving element 62. Specifically, the layer 11 can include the light-receiving element 62, the layer 12 can include the pixel circuit 52, and the layer 40 can include the arithmetic circuit 42.

Although FIGS. 18A and 18B illustrate, as an example, the pixel circuit 51 including three transistors in total, one embodiment of the present invention is not limited thereto. Structure examples which can be used for the pixel circuit 51 will be described below.

Figure 19A:
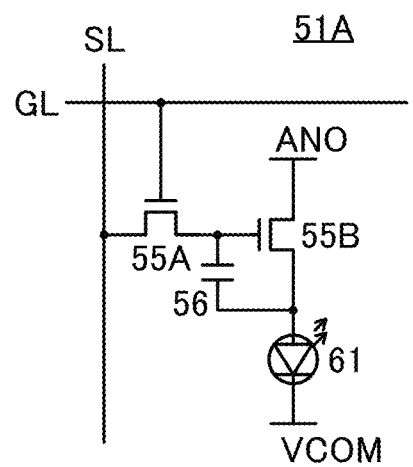
FIGS. 19A to 19D each illustrate a structure example of a display apparatus.

A pixel circuit 51A illustrated in FIG. 19A includes the transistor 55A, the transistor 55B, and the capacitor 56. FIG. 19A illustrates the light-emitting element 61 connected to the pixel circuit 51A. FIG. 19A also illustrates the wiring SL, the wiring GL, the wiring ANO, and the wiring VCOM.

A gate of the transistor 55A is electrically connected to the wiring GL, one of a source and a drain of the transistor 55A is electrically connected to the wiring SL, and the other of the source and the drain of the transistor 55A is electrically connected to the gate of the transistor 55B and one electrode (conductive film) of the capacitor 56. One of a source and a drain of the transistor 55B is electrically connected to the wiring ANO and the other of the source and the drain of the transistor 55B is electrically connected to an anode of the light-emitting element 61. The other electrode of the capacitor 56 is electrically connected to the anode of the light-emitting element 61. A cathode of the light-emitting element 61 is electrically connected to the wiring VCOM.

Figure 19B:
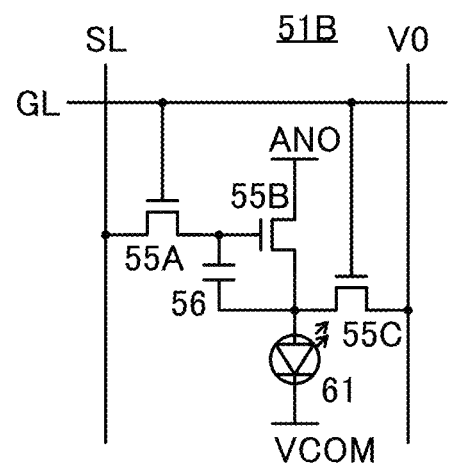

A pixel circuit 51B illustrated in FIG. 19B has a structure in which the transistor 55C is added to the pixel circuit 51A. In addition, the wiring V0 is electrically connected to the pixel circuit 51B.

Figure 19C:
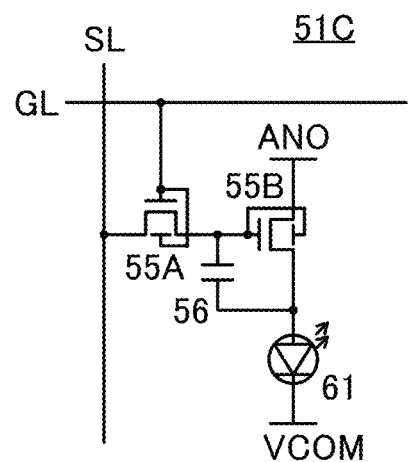
Figure 19D:
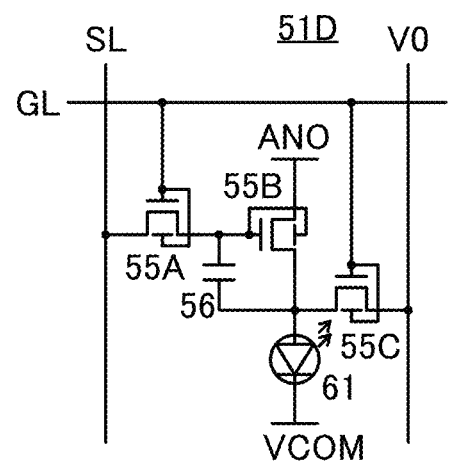

A pixel circuit 51C illustrated in FIG. 19C is an example in which a transistor including a pair of gates is used as each of the transistor 55A and the transistor 55B of the pixel circuit 51A. A pixel circuit 51D illustrated in FIG. 19D is an example of the case where such transistors are used in the pixel circuit 51B. With these structures, a current that can flow in the transistors can be increased. Although a transistor including a pair of gates is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 20A:
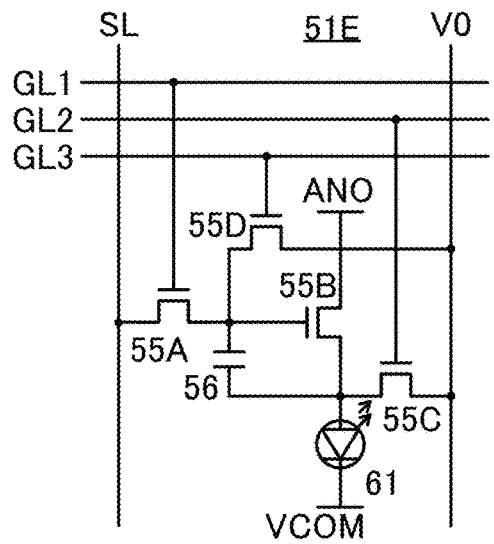
FIGS. 20A to 20D each illustrate a structure example of a display apparatus.

A pixel circuit 51E illustrated in FIG. 20A has a structure in which a transistor 55D is added to the pixel circuit 51B. Three wirings (wirings GL1, GL2, and GL3) functioning as gate lines are electrically connected to the pixel circuit 51E.

A gate of the transistor 55D is electrically connected to the wiring GL3, one of a source and a drain of the transistor 55D is electrically connected to the gate of the transistor 55B, and the other of the source and the drain of the transistor 55D is electrically connected to the wiring V0. The gate of the transistor 55A is electrically connected to the wiring GL1, and the gate of the transistor 55C is electrically connected to the wiring GL2.

When the transistors 55C and 55D are turned on at the same time, the source and the gate of the transistor 55B have the same potential, so that the transistor 55B can be turned off. Thus, a current flowing to the light-emitting element 61 can be blocked forcibly. Such a pixel circuit is suitable for the case of using a display method in which a display period and an off period are alternately provided.

Figure 20B:
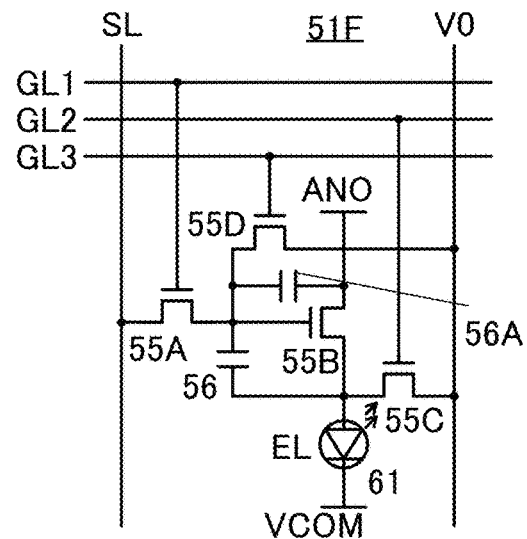

A pixel circuit 51F illustrated in FIG. 20B is an example of the case where a capacitor 56A is added to the pixel circuit 51E. The capacitor 56A functions as a storage capacitor.

Figure 20C:
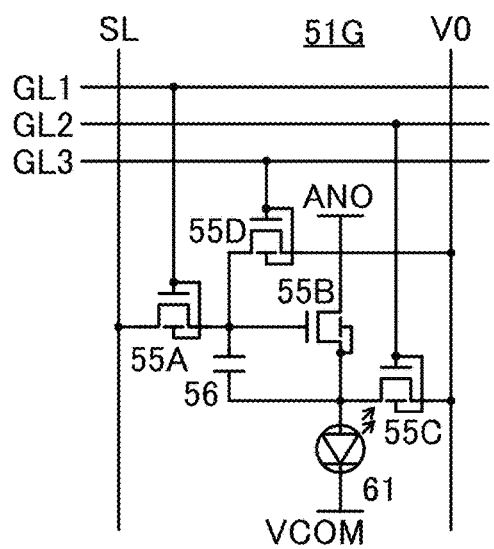
Figure 20D:
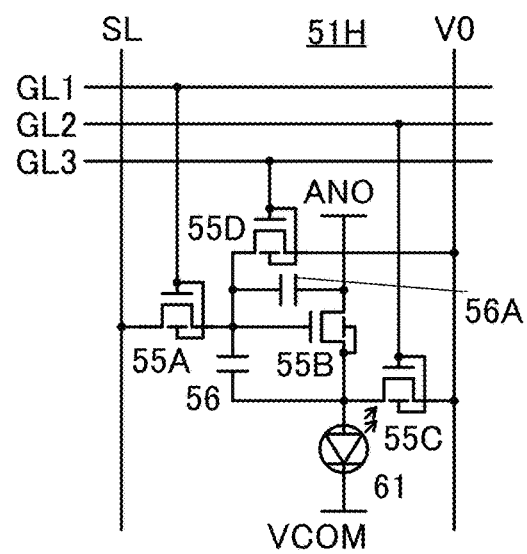

A pixel circuit 51G illustrated in FIG. 20C and a pixel circuit 51H illustrated in FIG. 20D are each an example of the case where a transistor including a pair of gates is used in the pixel circuit 51E or the pixel circuit 51F. A transistor in which a pair of gates are electrically connected to each other is used as each of the transistors 55A, 55C, and 55D, and a transistor in which one of gates is electrically connected to a source is used as the transistor 55B.

As structure examples of the pixel circuit that can be employed for the pixel circuit 52 electrically connected to the light-receiving element 62, FIGS. 21A to 21E illustrate pixel circuits 52A to 52E. FIGS. 21A to 21E also illustrate a wiring SE, a wiring RS, a wiring WX, and a wiring TX. The wiring SE is, for example, a wiring transmitting a selection signal for reading data from the pixel circuit. The wiring RS is, for example, a wiring transmitting a reset signal for initializing the pixel circuit. The wiring WX is, for example, a wiring transmitting a signal read from the pixel circuit. The wiring TX is, for example, a wiring transmitting a transmission signal for controlling a current flowing to the light-receiving element 62. The pixel circuit 52 is connected to a wiring transmitting a constant potential.

Figure 21A:
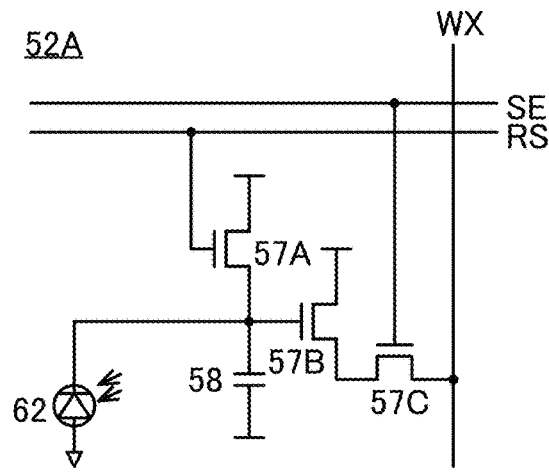
FIGS. 21A to 21E each illustrate a structure example of a display apparatus.

The pixel circuit 52A illustrated in FIG. 21A includes a transistor 57A, a transistor 57B, a transistor 57C, and a capacitor 58, and the transistors and the capacitor are electrically connected to each other as illustrated in FIG. 21A. FIG. 21A also illustrates the light-receiving element 62 connected to the pixel circuit 52A.

Figure 21B:
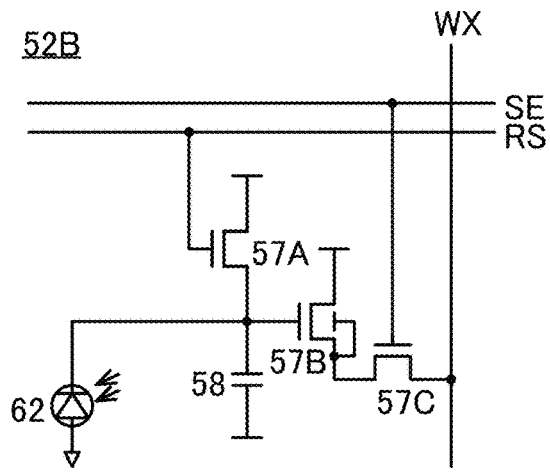
Figure 21C:
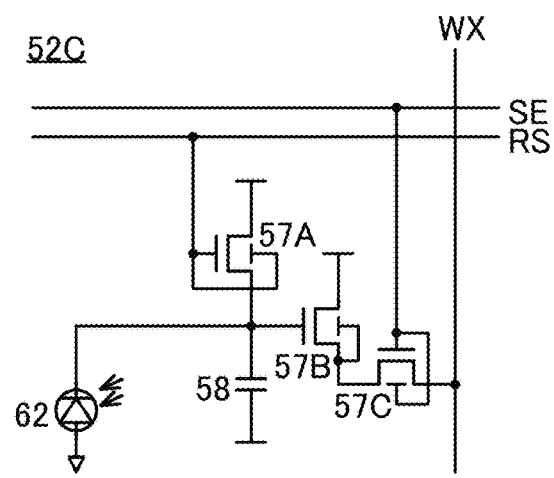
Figure 21D:
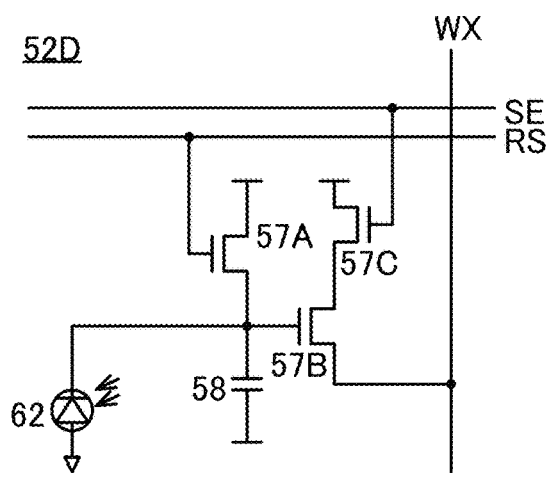
Figure 21E:
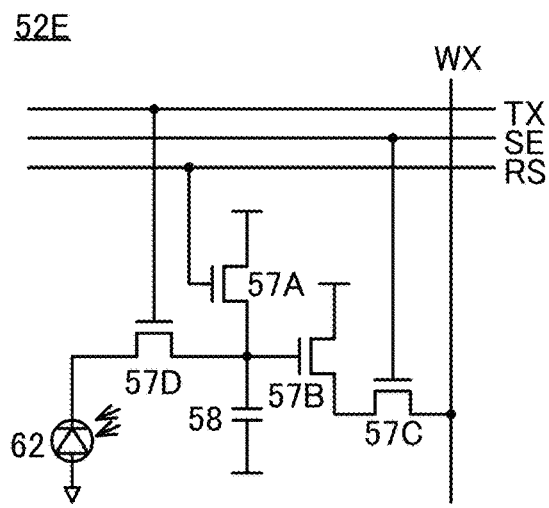

A pixel circuit 52B illustrated in FIG. 21B has a structure in which the transistor 57B in the pixel circuit 52A includes a pair of gates. A pixel circuit 52C illustrated in FIG. 21C is an example in which a transistor including a pair of gates is used as each of the transistors 57A to 57C in the pixel circuit 52A. A pixel circuit 52D illustrated in FIG. 21D is an example in which the position of the transistor 57C is changed. A pixel circuit 52E illustrated in FIG. 21E is an example in which a transistor 57D is added.

As described above, the display apparatus of one embodiment of the present invention can include the light-emitting element of the display region and the light-receiving element of the light-receiving region in the same layer. Thus, as compared with the case where a display apparatus and a light-receiving apparatus are provided separately, the number of components can be reduced, leading to a reduction in size and weight of an electronic device including the display apparatus.

In the display apparatus of one embodiment of the present invention, the light-receiving regions are provided around the display region and overlap with the optical lenses. Thus, a clear image can be captured even when a distance between the display apparatus and an object is short, for example, when an image of the user's eyes is captured. In one embodiment of the present invention where an optical lens for image capturing is placed in a region overlapping with the light-receiving region, light emitted from the light-emitting element in the display region can be inhibited from being blocked by the optical lens. In one embodiment of the present invention where the light-receiving region and the optical lens can be placed to overlap with each other, a clear image can be captured while a high-quality image can be displayed in the display region; thus, both displaying a high-quality image and capturing a clear image can be achieved.

At least part of any of the structure examples, the drawings corresponding thereto, and the like described in this embodiment can be implemented in combination with any of the other structure examples, the other drawings corresponding thereto, and the like as appropriate.

Embodiment 2

In this embodiment, the components of the display apparatus 10 of one embodiment of the present invention are described in detail.

<Cross-Sectional Structure Example of Light-Emitting Element and Transistor>

Figure 22:
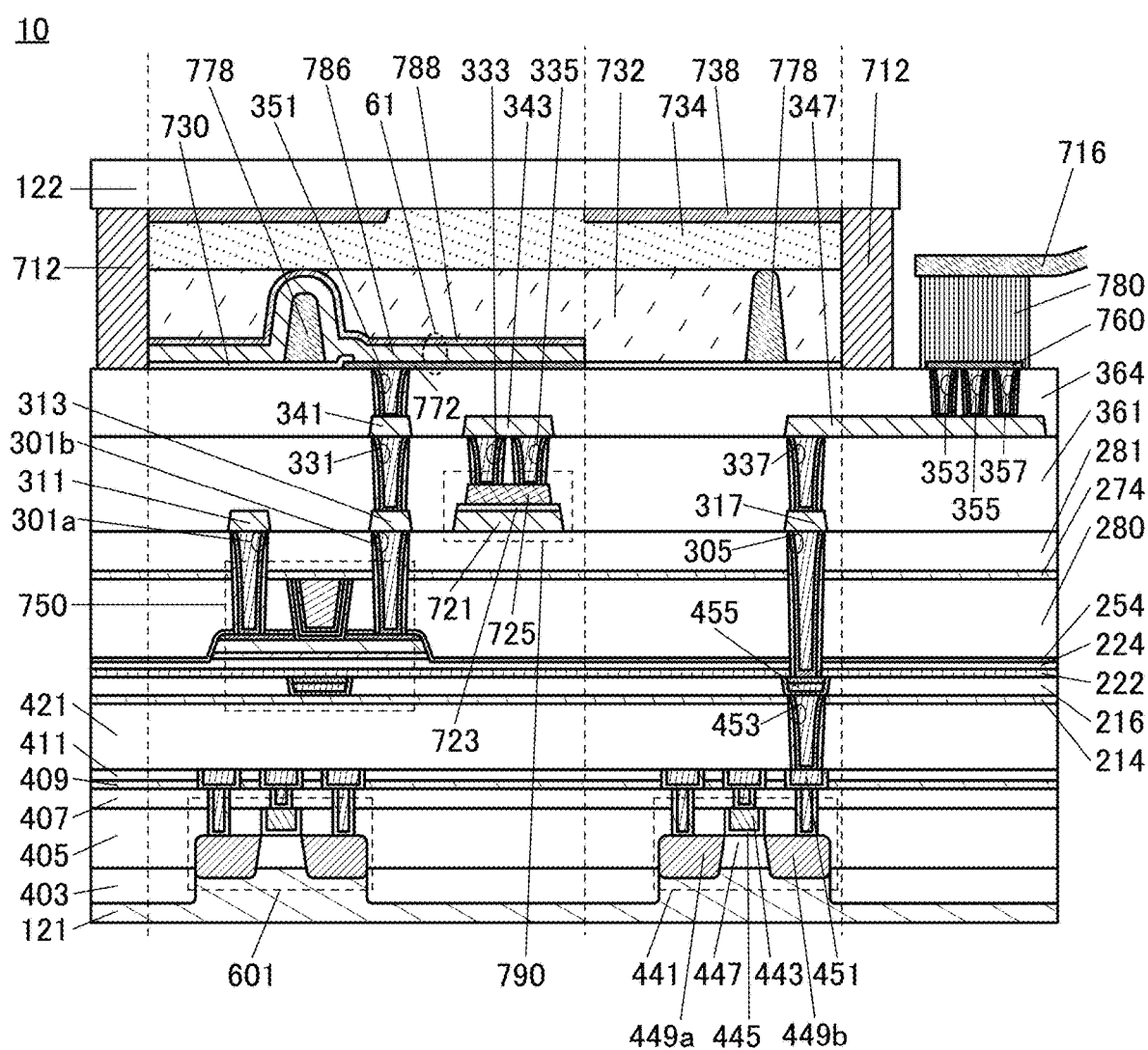
FIG. 22 illustrates a structure example of a display apparatus.

FIG. 22 is a cross-sectional view illustrating a structure example of the display apparatus 10. The display apparatus 10 includes a substrate 121 and a substrate 122, and the substrate 121 and the substrate 122 are attached to each other with a sealant 712.

As the substrate 121, a single crystal semiconductor substrate such as a single crystal silicon substrate can be used, for example. Note that a semiconductor substrate other than a single crystal semiconductor substrate may be used as the substrate 121.

A transistor 441 and a transistor 601 are provided on the substrate 121. The transistors 441 and 601 can each be the transistor (e.g., the transistor 33) provided in the layer 40 described in Embodiment 1.

The transistor 441 is formed of a conductor 443 functioning as a gate electrode, an insulator 445 functioning as a gate insulator, and part of the substrate 121 and includes a semiconductor region 447 including a channel formation region, a low-resistance region 449a functioning as one of a source region and a drain region, and a low-resistance region 449b functioning as the other of the source region and the drain region. The transistor 441 can be a p-channel transistor or an n-channel transistor.

The transistor 441 is electrically isolated from other transistors by an element isolation layer 403. FIG. 22 illustrates the case where the transistor 441 and the transistor 601 are electrically isolated from each other by the element isolation layer 403. The element isolation layer 403 can be formed by a local oxidation of silicon (LOCOS) method, a shallow trench isolation (STI) method, or the like.

Here, in the transistor 441 illustrated in FIG. 22, the semiconductor region 447 has a projecting shape. Moreover, the conductor 443 is provided to cover the side surface and the top surface of the semiconductor region 447 with the insulator 445 therebetween. Note that FIG. 22 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 22 illustrates the structure in which the projecting portion is formed by processing part of the substrate 121, a semiconductor having a projecting shape may be formed by processing an SOI substrate.

Note that the structure of the transistor 441 illustrated in FIG. 22 is only an example; the structure of the transistor 441 is not limited thereto and can be changed as appropriate in accordance with the circuit structure, an operation method of the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 121, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 421 and an insulator 214 are provided over the conductor 451 and the insulator 411. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 280, an insulator 274, and an insulator 281 are provided over the conductor 455 and the insulator 216. A conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 364 is provided over the conductor 337 and the insulator 361. A conductor 347, a conductor 353, a conductor 355, and a conductor 357 are embedded in the insulator 364. Here, the top surfaces of the conductor 353, the conductor 355, and the conductor 357 and the top surface of the insulator 364 can be substantially level with each other.

A connection electrode 760 is provided over the conductor 353, the conductor 355, the conductor 357, and the insulator 364. In addition, an anisotropic conductor 780 is provided to be electrically connected to the connection electrode 760, and a flexible printed circuit (FPC) 716 is provided to be electrically connected to the anisotropic conductor 780. A variety of signals and the like are supplied to the display apparatus 10 from the outside of the display apparatus 10 through the FPC 716.

As illustrated in FIG. 22, the low-resistance region 449b having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 22 illustrates three conductors of the conductor 353, the conductor 355, and the conductor 357 as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be the transistor (e.g., the transistor 31) provided in the layer 11 described in Embodiment 1. For example, the transistor 750 can be the transistor provided in the pixel circuit 51. An OS transistor can be suitably used as the transistor 750. The OS transistor has a feature of an extremely low off-state current. Consequently, the retention time for image data or the like can be increased, so that the frequency of the refresh operation can be reduced. Thus, power consumption of the display apparatus 10 can be reduced.

A conductor 301a and a conductor 301b are embedded in the insulator 254, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 364. Here, the top surface of the conductor 351 and the top surface of the insulator 364 can be substantially level with each other.

The insulator 405, the insulator 407, the insulator 409, the insulator 411, the insulator 421, the insulator 214, the insulator 280, the insulator 274, the insulator 281, the insulator 361, and the insulator 364 have a function of an interlayer film and may also have a function of a planarization film that covers unevenness thereunder. For example, the top surface of the insulator 364 may be planarized by planarization treatment using a chemical mechanical polishing (CMP) method or the like to have the increased evenness.

As illustrated in FIG. 22, the capacitor 790 includes a lower electrode 721 and an upper electrode 725. An insulator 723 is provided between the lower electrode 721 and the upper electrode 725. That is, the capacitor 790 has a stacked-layer structure in which the insulator 723 functioning as a dielectric is positioned between the pair of electrodes. Although FIG. 22 illustrates an example in which the capacitor 790 is provided over the insulator 281, the capacitor 790 may be provided over an insulator different from the insulator 281.

In the example illustrated in FIG. 22, the conductors 301a, 301b, and 305 are formed in the same layer. The conductors 311, 313, and 317 and the lower electrode 721 are formed in the same layer. The conductors 331, 333, 335, and 337 are formed in the same layer. The conductors 341, 343, and 347 are formed in the same layer. The conductors 351, 353, 355, and 357 are formed in the same layer. Forming a plurality of conductors in the same layer simplifies the manufacturing process of the display apparatus 10 and thus the manufacturing cost of the display apparatus 10 can be reduced. Note that these conductors may be formed in different layers or may contain different types of materials.

The display apparatus 10 illustrated in FIG. 22 includes the light-emitting element 61. The light-emitting element 61 includes a conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 364 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 22, an optical member (optical substrate) such as a polarizing member, a retardation member, or an anti-reflection member can be provided in the display apparatus 10 as appropriate, for example.

A light-blocking layer 738 and an insulator 734 that is in contact with the light-blocking layer 738 are provided on the substrate 122. The light-blocking layer 738 has a function of blocking light emitted from adjacent regions. Alternatively, the light-blocking layer 738 has a function of preventing external light from reaching the transistor 750 or the like.

In the display apparatus 10 illustrated in FIG. 22, an insulator 730 is provided over the insulator 364. Here, the insulator 730 can cover part of the conductor 772. Here, the light-emitting element 61 is a top-emission light-emitting element, which includes the conductor 788 having a light-transmitting property.

The light-blocking layer 738 is provided to include a region overlapping with the insulator 730. The light-blocking layer 738 is covered with the insulator 734. A space between the light-emitting element 61 and the insulator 734 is filled with a sealing layer 732.

A component 778 is provided between the insulator 730 and the EL layer 786. Moreover, the component 778 is provided between the insulator 730 and the insulator 734.

Figure 23:
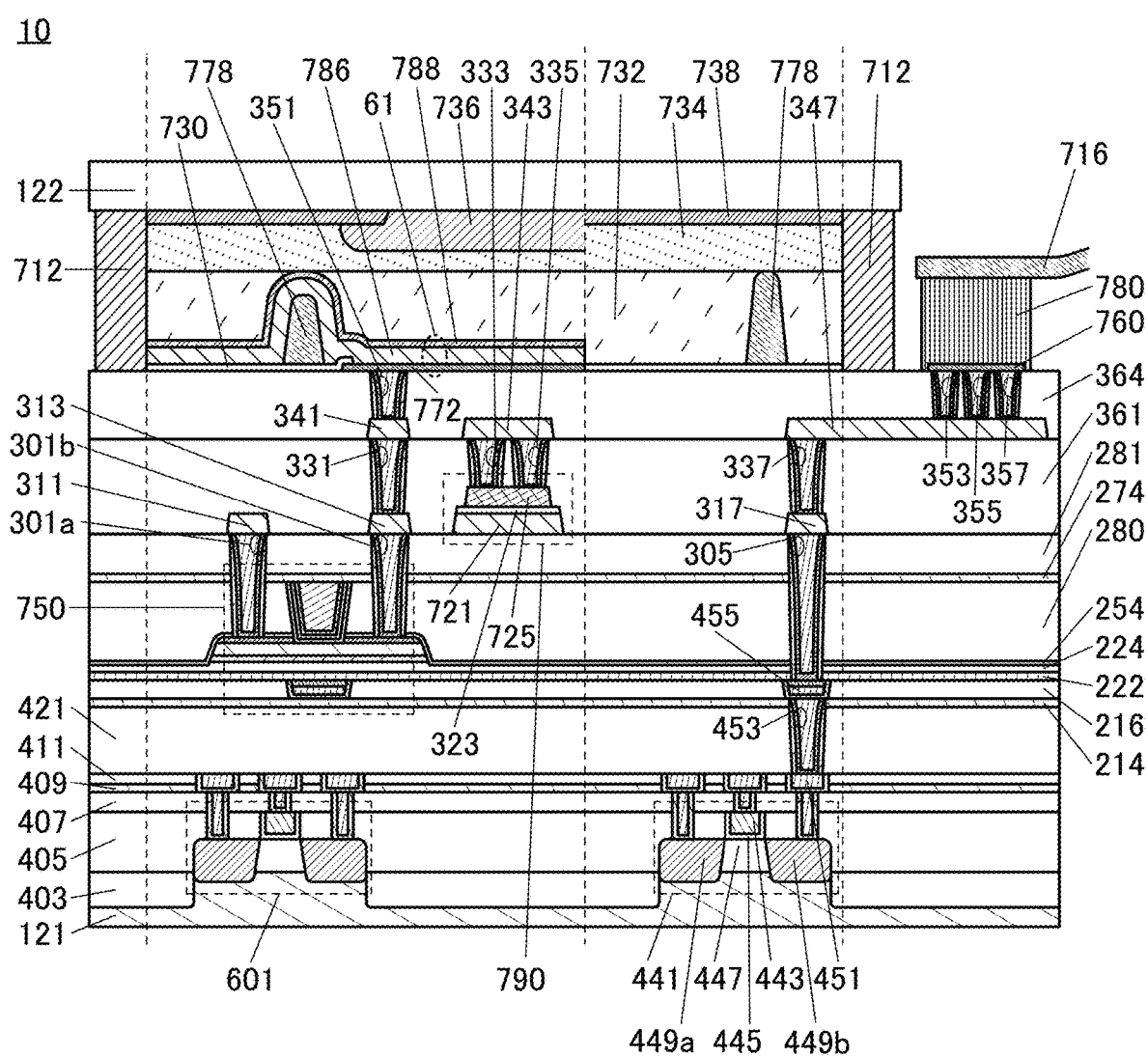
FIG. 23 illustrates a structure example of a display apparatus.

FIG. 23 illustrates a variation example of the display apparatus 10 illustrated in FIG. 22. The display apparatus 10 illustrated in FIG. 23 is different from the display apparatus 10 illustrated in FIG. 22 in that a coloring layer 736 is provided. The coloring layer 736 is provided to include a region overlapping with the light-emitting element 61. Providing the coloring layer 736 can improve the color purity of light emitted from the light-emitting element 61. Thus, the display apparatus 10 can display high-quality images. Furthermore, all the light-emitting elements 61, for example, in the display apparatus 10 can be light-emitting elements emitting white light; hence, the EL layers 786 are not necessarily formed separately for each color, leading to higher resolution of the display apparatus 10.

The light-emitting element 61 can have a micro-optical resonator (microcavity) structure. Thus, light of predetermined colors (e.g., RGB) can be extracted without a coloring layer, and the display apparatus 10 can perform color display. The structure without a coloring layer can prevent light absorption by the coloring layer. As a result, the display apparatus 10 can display high-luminance images, and power consumption of the display apparatus 10 can be reduced. Note that a structure without a coloring layer can be employed even when the EL layer 786 is formed into an island shape for each pixel or formed into a stripe shape for each pixel column, i.e., the EL layers 786 are formed separately for each color. Note that the luminance of the display apparatus 10 can be, for example, 500 cd/m$^2$ or higher, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

<Structure Example of OS Transistor>

FIGS. 24A to 24C are a top view and cross-sectional views of the transistor 750 that can be used in the display apparatus of one embodiment of the present invention, and the periphery of the transistor 750. The transistor 750 can be used in the display apparatus of one embodiment of the present invention.

FIG. 24A is the top view of the transistor 750. FIGS. 24B and 24C are the cross-sectional views of the transistor 750.

FIG. 24B is a cross-sectional view taken along dashed-dotted line A1-A2 in FIG. 24A, which corresponds to a cross-sectional view of the transistor 750 in the channel length direction. FIG. 24C is a cross-sectional view taken along the dashed-dotted line A3-A4 in FIG. 24A, which corresponds to a cross-sectional view of the transistor 750 in the channel width direction. Note that for simplification of the drawing, some components are not illustrated in the top view in FIG. 24A.

As illustrated in FIGS. 24A to 24C, the transistor 750 includes a metal oxide 230a placed over a substrate (not illustrated); a metal oxide 230b placed over the metal oxide 230a; a conductor 242a and a conductor 242b that are placed apart from each other over the metal oxide 230b; the insulator 280 that is placed over the conductor 242a and the conductor 242b and has an opening between the conductor 242a and the conductor 242b; a conductor 260 placed in the opening; an insulator 250 placed between the conductor 260 and the metal oxide 230b, the conductor 242a, the conductor 242b, and the insulator 280; and a metal oxide 230c placed between the insulator 250 and the metal oxide 230b, the conductor 242a, the conductor 242b, and the insulator 280. Here, as illustrated in FIGS. 24B and 24C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 750 illustrated in FIGS. 24A to 24C, the side surfaces of the conductor 242a and the conductor 242b on the conductor 260 side are substantially perpendicular. Note that the transistor 750 illustrated in FIGS. 24A to 24C is not limited thereto, and the angle formed between the side surface and the bottom surface of the conductor 242a and the conductor 242b may range from 10° to 80°, preferably from 30° to 60°. The side surfaces of the conductor 242a and the conductor 242b that face each other may have a plurality of surfaces.

As illustrated in FIGS. 24A to 24C, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 24B and FIG. 24C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 750, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 has a two-layer structure in the transistor 750, the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, in the transistor 750, the gate electrode can be placed between the source electrode and the drain electrode in a self-aligned manner. Thus, the conductor 260 can be formed without an alignment margin, resulting in a reduction in the area occupied by the transistor 750. Accordingly, the display apparatus can have higher resolution. In addition, the display apparatus can have a narrow bezel.

As illustrated in FIGS. 24A to 24C, the conductor 260 preferably includes a conductor 260a provided on the inner side of the insulator 250 and a conductor 260b provided to be embedded on the inner side of the conductor 260a.

The transistor 750 preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 230a is preferably placed over the insulator 224.

The insulator 274 and the insulator 281 functioning as interlayer films are preferably placed over the transistor 750. Here, the insulator 274 is preferably placed in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of hydrogen (e.g., at least one of a hydrogen atom and a hydrogen molecule). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom and an oxygen molecule). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of excess oxygen or impurities such as hydrogen contained in the insulator 280 and the insulator 281 into the insulator 224, the metal oxide 230a, the metal oxide 230b, and the insulator 250.

A conductor 240 (a conductor 240a and a conductor 240b) that is electrically connected to the transistor 750 and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. A structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the first conductor of the conductor 240 and the second conductor of the conductor 240 are stacked in the transistor 750, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 750, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 24B, the metal oxide 230b may have a smaller thickness in a region not overlapping with the conductor 242 than in a region overlapping with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in this manner can prevent formation of the channel in the region.

The structure of the transistor 750 that can be used in the display apparatus of one embodiment of the present invention is described in detail.

The conductor 205 is placed to include a region overlapping with the metal oxide 230 and the conductor 260. Furthermore, the conductor 205 is preferably provided to be embedded in the insulator 216.

The conductor 205 includes the conductors 205a, 205b, and 205c. The conductor 205a is provided in contact with the bottom surface and the side wall of the opening provided in the insulator 216. The conductor 205b is provided to be embedded in a recessed portion formed by the conductor 205a. Here, the level of the top surface of the conductor 205b is lower than the levels of the top surfaces of the conductor 205a and the insulator 216. The conductor 205c is provided in contact with the top surface of the conductor 205b and the side surface of the conductor 205a. Here, the top surface of the conductor 205c is substantially level with the top surfaces of the conductor 205a and the insulator 216. That is, the conductor 205b is surrounded by the conductor 205a and the conductor 205c.

The conductors 205a and 205c are preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductors 205a and 205c are preferably formed using a conductive material having a function of inhibiting diffusion of oxygen (e.g., at least one of an oxygen atom and an oxygen molecule).

When the conductors 205a and 205c are formed using a conductive material having a function of inhibiting diffusion of hydrogen, impurities such as hydrogen contained in the conductor 205b can be prevented from diffusing into the metal oxide 230 through the insulator 224 and the like. When the conductors 205a and 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride may be used for the conductor 205a.

A conductive material containing tungsten, copper, or aluminum as its main component is preferably used for the conductor 205b. For example, tungsten may be used for the conductor 205b.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 750 can be controlled. In particular, by applying a negative potential to the conductor 205, $V_{th}$ of the transistor 750 can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 24C. In other words, the conductor 205 and the conductor 260 preferably overlap with each other with the insulator positioned therebetween, in a region on the outer side of the side surface of the metal oxide 230 in the channel width direction.

With the above structure, the channel formation region in the metal oxide 230 can be electrically surrounded by electric fields of the conductor 260 functioning as the first gate electrode and electric fields of the conductor 205 functioning as the second gate electrode.

Furthermore, as illustrated in FIG. 24C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water and hydrogen to the transistor 750 from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of oxygen (e.g., at least one of an oxygen atom and an oxygen molecule) (an insulating material through which the oxygen is less likely to pass).

For example, aluminum oxide or silicon nitride is preferably used for the insulator 214. Accordingly, it is possible to inhibit diffusion of impurities such as water and hydrogen to the transistor 750 side from the substrate side through the insulator 214. Alternatively, it is possible to inhibit diffusion of oxygen contained in the insulator 224 and the like to the substrate side through the insulator 214.

The permittivity of each of the insulators 216, 280, and 281 functioning as an interlayer film is preferably lower than that of the insulator 214. When a material with a low permittivity is used for an interlayer film, the parasitic capacitance generated between wirings can be reduced. For example, for the insulators 216, 280, and 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like may be used as appropriate.

The insulators 222 and 224 have a function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 750.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. Note that the temperature of the film surface in the TDS analysis is preferably in the range of 100° C. to 700° C. or 100° C. to 400° C.

As illustrated in FIG. 24C, the insulator 224 is sometimes thinner in a region overlapping with neither the insulator 254 nor the metal oxide 230b than in the other regions. In the insulator 224, the region overlapping with neither the insulator 254 nor the metal oxide 230b preferably has a thickness with which the above oxygen can be adequately diffused.

Like the insulator 214 or the like, the insulator 222 preferably functions as a barrier insulating film that inhibits the entry of impurities such as water and hydrogen into the transistor 750 from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water and hydrogen into the transistor 750 from outside can be inhibited.

Furthermore, it is preferable that the insulator 222 have a function of inhibiting diffusion of oxygen (e.g., at least one of an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 can be prevented from diffusing to the substrate side. Moreover, the conductor 205 can be inhibited from reacting with oxygen contained in the insulator 224 or the metal oxide 230.

As the insulator 222, an insulator containing an oxide of aluminum and/or an oxide of hafnium, which are insulating materials, is preferably used. For the insulator containing an oxide of aluminum and/or an oxide of hafnium, aluminum oxide, hafnium oxide, an oxide containing aluminum and hafnium (hafnium aluminate), or the like is preferably used. The insulator 222 formed using such a material functions as a layer inhibiting oxygen release from the metal oxide 230 and entry of impurities such as hydrogen into the metal oxide 230 from the periphery of the transistor 750.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as a leakage current may arise because of a thinner gate insulator. When a high-k material is used for the insulator functioning as a gate insulator, a gate potential at the time of operation of the transistor can be reduced while the physical thickness is maintained.

Note that the insulators 222 and 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably higher than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably higher than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c continuously changes or is continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide having an atomic ratio of In:Ga:Zn=1:3:4 or In:Ga:Zn=1:1:0.5 can be used. As the metal oxide 230b, a metal oxide having an atomic ratio of In:Ga:Zn=4:2:3 or In:Ga:Zn=3:1:2 can be used. As the metal oxide 230c, a metal oxide having an atomic ratio of In:Ga:Zn=1:3:4, In:Ga:Zn=4:2:3, Ga:Zn=2:1, or Ga:Zn=2:5 can be used. Specific examples of a stacked-layer structure of the metal oxide 230c include a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, and a stacked-layer structure of a layer having an atomic ratio of In:Ga:Zn=4:2:3 and gallium oxide. Note that the atomic ratio described above and the atomic ratio to be described below each include the atomic ratio shown as an example and the neighborhood thereof.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 750 can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected. Specifically, the metal oxide 230c has a stacked-layer structure in which the upper layer is an oxide that does not contain In, whereby the amount of In that would diffuse to the insulator 250 side can be reduced. Since the insulator 250 functions as a gate insulator, the transistor would show poor characteristics when In diffuses into the insulator 250. Thus, the metal oxide 230c having a stacked-layer structure allows a highly reliable display apparatus to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such a case, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 functions as a gate insulator. The insulator 250 is preferably placed in contact with the top surface of the metal oxide 230c. For the insulator 250, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. In particular, silicon oxide and silicon oxynitride are preferable because of their thermal stability.

As in the insulator 224, the concentration of impurities such as water and hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although FIGS. 24A to 24C illustrate the conductor 260 having a two-layer structure, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of an oxygen atom and an oxygen molecule).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

As illustrated in FIG. 24A and FIG. 24C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 functioning as the first gate electrode are likely to act on the side surface of the metal oxide 230. Hence, the transistor 750 can have a higher on-state current and higher frequency characteristics.

Like the insulator 214 or the like, the insulator 254 preferably functions as a barrier insulating film that inhibits the entry of impurities such as water and hydrogen into the transistor 750 from the insulator 280 side. The insulator 254 preferably has lower hydrogen permeability than the insulator 224, for example. Furthermore, as illustrated in FIG. 24B and FIG. 24C, the insulator 254 is preferably in contact with the side surface of the metal oxide 230c, the top and side surfaces of the conductor 242a, the top and side surfaces of the conductor 242b, the side surfaces of the metal oxide 230a and the metal oxide 230b, and the top surface of the insulator 224. Such a structure can inhibit the entry of hydrogen contained in the insulator 280 into the metal oxide 230 through the top surfaces or the side surfaces of the conductor 242a, the conductor 242b, the metal oxide 230a, the metal oxide 230b, and the insulator 224.

Furthermore, it is preferable that the insulator 254 have a function of inhibiting diffusion of oxygen (e.g., at least one of an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 which is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. As the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from the outside of the transistor 750, resulting in favorable electrical characteristics and high reliability of the transistor 750.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. Silicon oxide and silicon oxynitride are particularly preferable because of their thermal stability. In particular, materials such as silicon oxide, silicon oxynitride, and porous silicon oxide are preferably used, in which case a region containing oxygen released by heating can be easily formed.

The concentration of impurities such as water and hydrogen in the insulator 280 is preferably reduced. In addition, the top surface of the insulator 280 may be planarized.

Like the insulator 214 or the like, the insulator 274 preferably functions as a barrier insulating film that inhibits entry of impurities such as water and hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water and hydrogen in the insulator 281 is preferably reduced.

The conductor 240a and the conductor 240b are placed in openings formed in the insulators 281, 274, 280, and 254. The conductors 240a and 240b are provided to face each other with the conductor 260 therebetween. Note that the top surfaces of the conductors 240a and 240b may be level with the top surface of the insulator 281.

The insulator 241a is provided in contact with the inner walls of the openings in the insulators 281, 274, 280, and 254, and a first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulators 281, 274, 280, and 254, and a first conductor of the conductor 240b is formed in contact with the side surface of the insulator 241b. The conductor 242b is positioned on at least part of the bottom portion of the opening, and the conductor 240b is in contact with the conductor 242b.

The conductors 240a and 240b are preferably formed using a conductive material containing tungsten, copper, or aluminum as its main component. The conductors 240a and 240b may each have a stacked-layer structure.

In the case where the conductor 240 has a stacked-layer structure, the aforementioned conductor having a function of inhibiting diffusion of impurities such as water and hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water and hydrogen can be used as a single layer or stacked layers. The use of the conductive material can inhibit oxygen added to the insulator 280 from being absorbed by the conductor 240a and the conductor 240b. Moreover, impurities such as water and hydrogen can be inhibited from entering the metal oxide 230 through the conductor 240a and the conductor 240b from a layer above the insulator 281.

As the insulator 241a and the insulator 241b, the insulator that can be used as the insulator 254 or the like can be used, for example. Since the insulator 241a and the insulator 241b are provided in contact with the insulator 254, impurities such as water and hydrogen in the insulator 280 or the like can be inhibited from entering the metal oxide 230 through the conductor 240*a* and the conductor 240*b*. Furthermore, oxygen contained in the insulator 280 can be inhibited from being absorbed by the conductor 240*a* and the conductor 240*b*.

Although not illustrated, a conductor functioning as a wiring may be provided in contact with the top surfaces of the conductors 240*a* and 240*b*. For the conductor functioning as a wiring, a conductive material containing tungsten, copper, or aluminum as its main component is preferably used. Furthermore, the conductor may have a stacked-layer structure and may be a stack of any of the above conductive materials and titanium or titanium nitride. Note that the conductor may be formed to be embedded in an opening provided in an insulator.

<Materials for Transistor>

Materials that can be used for the transistor will be described.

[Substrate]

As a substrate over which the transistor is formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Other examples include any of the above semiconductor substrates including an insulator region, e.g., a silicon on insulator (SOI) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided over the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With miniaturization and high integration of a transistor, for example, a problem such as generation of a leakage current may arise because of a thinner gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, a structure where silicon oxide or silicon oxynitride that includes a region containing oxygen released by heating is provided in contact with the metal oxide 230 can compensate for oxygen vacancies in the metal oxide 230.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed.

Alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may also be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<Classification of Crystal Structure of Oxide Semiconductor>

The classification of crystal structures of an oxide semiconductor will be described with reference to FIG. 25A. FIG. 25A shows the classification of crystal structures of an oxide semiconductor, typically IGZO (a metal oxide containing In, Ga, and Zn).

As shown in FIG. 25A, oxide semiconductors are roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 25A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 25B shows an XRD spectrum, which is obtained by grazing-incidence XRD (GIXD) measurement, of a CAAC-IGZO film classified into "Crystalline". Note that a GIXD method is also referred to as a thin film method or a Seemann-Bohlin method. The XRD spectrum that is shown in FIG. 25B and obtained by GIXD measurement is hereinafter simply referred to as an XRD spectrum. The CAAC-IGZO film in FIG. 25B has an atomic ratio of In:Ga:Zn=4:2:3 or a neighborhood thereof. The CAAC-IGZO film in FIG. 25B has a thickness of 500 nm.

As shown in FIG. 25B, a clear peak indicating crystallinity is observed in the XRD spectrum of the CAAC-IGZO film. Specifically, a peak indicating c-axis alignment is observed at $2\theta$ of around 31° in the XRD spectrum of the CAAC-IGZO film. As shown in FIG. 25B, the peak at $2\theta$ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 25C shows a diffraction pattern of the CAAC-IGZO film. FIG. 25C shows a diffraction pattern obtained by the NBED method in which an electron beam is incident in the direction parallel to the substrate. The CAAC-IGZO film in FIG. 25C has an atomic ratio of In:Ga:Zn=4:2:3 or a neighborhood thereof. In the nanobeam electron diffraction method, electron diffraction is performed with a probe diameter of 1 nm.

As shown in FIG. 25C, a plurality of spots indicating c-axis alignment are observed in the diffraction pattern of the CAAC-IGZO film.

[Structure of Oxide Semiconductor]

Oxide semiconductors might be classified in a manner different from the one in FIG. 25A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer)

and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low arrangement density of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor; thus, the CAAC-OS can be referred to as an oxide semiconductor having a small amount of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS and an amorphous oxide semiconductor depending on the analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility ($\mu$) and favorable switching operation can be achieved.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is one of Group 14 elements, is contained in the oxide semiconductor, defect states are formed in the oxide semiconductor. Thus, the concentration of each of silicon and carbon in the oxide semiconductor and in the vicinity of an interface with the oxide semiconductor (the concentration measured by secondary ion mass spectrometry (SIMS)) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of any of the structure examples, the drawings corresponding thereto, and the like described in this embodiment can be combined with any of the other structure examples, the other drawings corresponding thereto, and the like as appropriate.

Embodiment 3

The light-emitting element 61 and the light-receiving element 62 that can be used in the display apparatus of one embodiment of the present invention will be described.
<Layer Structure of Light-Emitting Element>

Figure 26A:
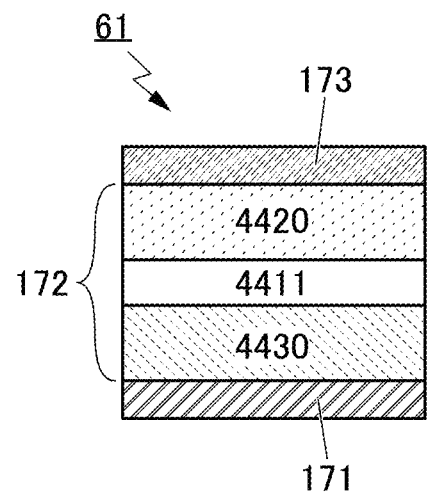
FIGS. 26A to 26D each illustrate a structure example of a display apparatus.

As illustrated in FIG. 26A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 26A is referred to as a single structure in this specification and the like.

Figure 26B:
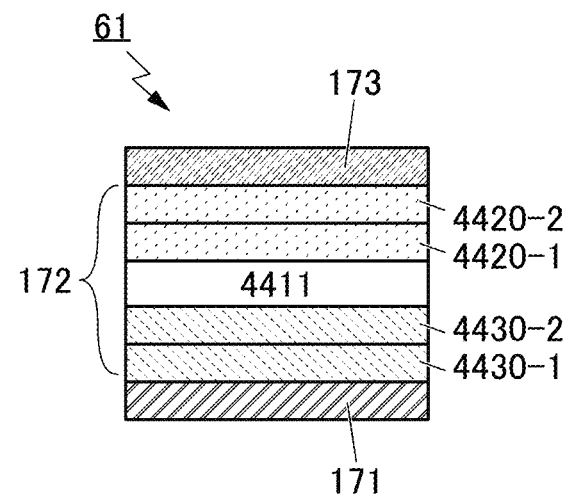

FIG. 26B is a variation example of the EL layer 172 included in the light-emitting element 61 illustrated in FIG. 26A. Specifically, the light-emitting element 61 illustrated in FIG. 26B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. For example, in the case where the conductive layer 171 serves as an anode and the conductive layer 173 serves as a cathode, the layer 4430-1 serves as a hole-injection layer, the layer 4430-2 serves as a hole-transport layer, the layer 4420-1 serves as an electron-transport layer, and the layer 4420-2 serves as an electron-injection layer. Alternatively, in the case where the conductive layer 171 serves as a cathode and the conductive layer 173 serves an anode, the layer 4430-1 serves as an electron-injection layer, the layer 4430-2 serves as an electron-transport layer, the layer 4420-1 serves as a hole-transport layer, and the layer 4420-2 serves as a hole-injection layer. With such a layer structure, carriers can be efficiently injected to the light-emitting layer 4411, and the efficiency of the recombination of carriers in the light-emitting layer 4411 can be enhanced.

Figure 26C:
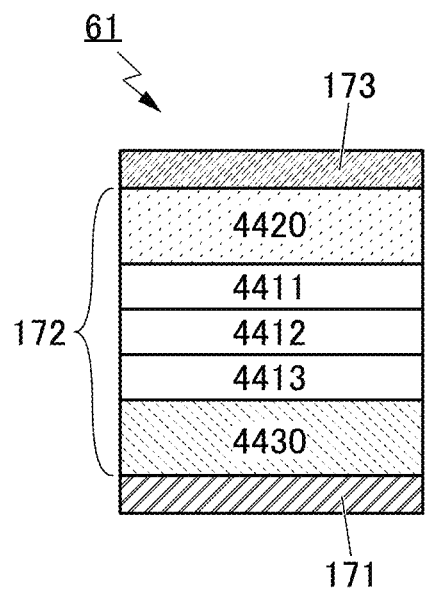

The structure in which a plurality of light-emitting layers (the light-emitting layer 4411, a light-emitting layer 4412, and a light-emitting layer 4413) is provided between the layer 4420 and the layer 4430 as illustrated in FIG. 26C is another example of the single structure.

Figure 26D:
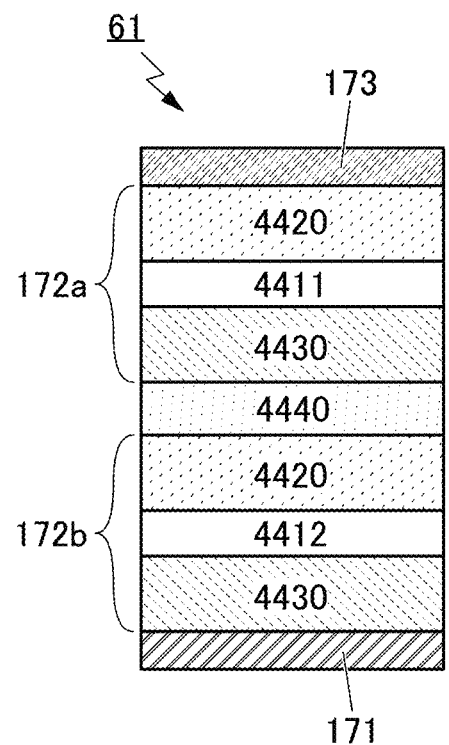

The structure in which a plurality of light-emitting units (an EL layer 172a and an EL layer 172b) are connected in series with an intermediate layer (charge-generation layer) 4440 therebetween as illustrated in FIG. 26D is referred to as a tandem structure or a stack structure in this specification and the like. The tandem structure can achieve a light-emitting element capable of high luminance light emission.

In the case where the light-emitting element 61 has the tandem structure illustrated in FIG. 26D, the EL layers 172a and 172b may emit light of the same color. For example, the EL layers 172a and 172b may both emit green light.

Note that full color display can be achieved by forming one pixel with three subpixels of the light-emitting element 61 emitting red light (R), the light-emitting element 61 emitting green light (G), and the light-emitting element 61 emitting blue light (B). In the case where the display region 13 includes three kinds of subpixels of R, G, and B, the light-emitting elements may each have a tandem structure. Specifically, the EL layers 172a and 172b in the subpixel of R each contain a material capable of emitting red light, the EL layers 172a and 172b in the subpixel of G each contain a material capable of emitting green light, and the EL layers 172a and 172b in the subpixel of B each contain a material capable of emitting blue light. In other words, the light-emitting layers 4411 and 4412 may contain the same material. When the EL layers 172a and 172b emit light of the same color, the current density per unit emission luminance can be reduced. Thus, the reliability of the light-emitting element 61 can be improved.

The emission color of the light-emitting element can be changed to red, green, blue, cyan, magenta, yellow, white, or the like depending on the material of the EL layer 172. When the light-emitting element has a microcavity structure, the color purity can be further increased.

The light-emitting layer may contain two or more substances selected from light-emitting substances emitting light of red (R), green (G), blue (B), yellow (Y), orange (O), and the like. In a light-emitting element emitting white light, a light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that a light-emitting element can emit white light as a whole. This can be applied to a light-emitting element including three or more light-emitting layers.

The light-emitting layer preferably contains two or more substances selected from light-emitting substances emitting light of red (R), green (G), blue (B), yellow (Y), orange (O), and the like. Alternatively, the light-emitting layer preferably contains two or more light-emitting substances emitting light containing two or more of spectral components of R, G, and B.

Examples of a light-emitting substance include a substance exhibiting fluorescence (fluorescent material), a substance exhibiting phosphorescence (phosphorescent material), an inorganic compound (e.g., quantum dot material), and a substance exhibiting thermally activated delayed fluorescence (a thermally activated delayed fluorescent (TADF) material). As a TADF material, a material that is in thermal equilibrium between a singlet excited state and a triplet excited state may be used. Since such a TADF material enables a short emission lifetime (excitation lifetime), an efficiency decrease of a light-emitting element in a high-luminance region can be inhibited.
<Method for Forming Light-Emitting Element>

An example of a method for forming the light-emitting element 61 is described below.

Figure 27A:
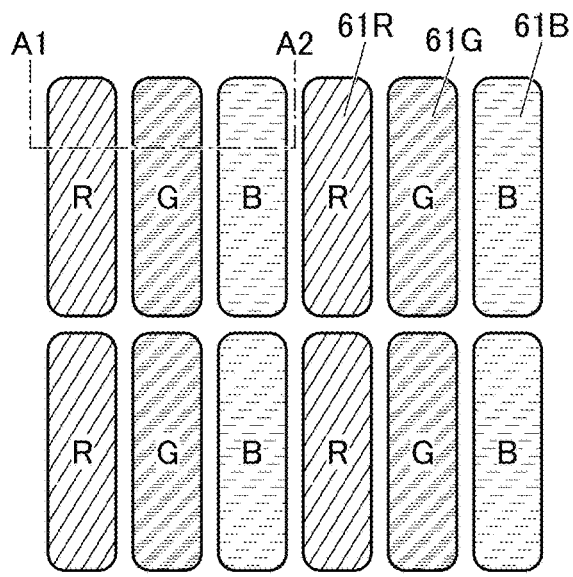
FIGS. 27A to 27D illustrate a structure example of a display apparatus.

FIG. 27A is a schematic top view of a display apparatus including the light-emitting element 61. The display apparatus includes a plurality of light-emitting elements 61R emitting red light, a plurality of light-emitting elements 61G emitting light, and a plurality of light-emitting elements 61B emitting blue light. In FIG. 27A, light-emitting regions of the light-emitting elements are denoted by R, G, and B to easily differentiate the light-emitting elements. Note that the structure of the light-emitting element 61 illustrated in FIG. 27A may be referred to as a side-by-side (SBS) structure. Although the structure illustrated in FIG. 27A has three emission colors of red (R), green (G), and blue (B), one embodiment of the present invention is not limited thereto. For example, the structure may have four or more colors.

The light-emitting elements 61R, the light-emitting elements 61G, and the light-emitting elements 61B are arranged in a matrix. Although FIG. 27A illustrates what is called a stripe arrangement in which the light-emitting elements of the same color are arranged in one direction, the arrangement of the light-emitting elements is not limited thereto. As another arrangement of the light-emitting elements, a delta arrangement, a zig-zag arrangement, an S-Stripe RGB arrangement, a pentile arrangement, or the like can be employed.

As the light-emitting elements 61R, 61G, and 61B, an organic EL device such as an organic light-emitting diode (OLED) or a quantum-dot organic light-emitting diode (QOLED) is preferably used. Examples of a light-emitting substance contained in the EL element include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material).

Figure 27B:
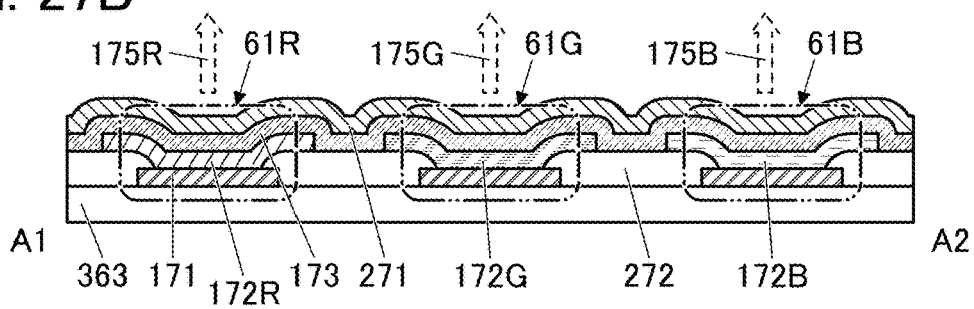

FIG. 27B is a schematic cross-sectional view taken along dashed-dotted line A1-A2 in FIG. 27A. FIG. 27B illustrates a cross section of the light-emitting elements 61R, 61G, and 61B. The light-emitting elements 61R, 61G, and 61B are provided over an insulating layer 363, and include the conductive layer 171 functioning as a pixel electrode and the conductive layer 173 functioning as a common electrode. For the insulating layer 363, one or both of an inorganic insulating film and an organic insulating film can be used. An inorganic insulating film is preferably used for the insulating layer 363. Examples of the inorganic insulating film include an oxide insulating film and a nitride insulating film, such as a silicon oxide film, a silicon oxynitride film, a silicon nitride oxide film, a silicon nitride film, an aluminum oxide film, an aluminum oxynitride film, and a hafnium oxide film.

The light-emitting element 61R includes an EL layer 172R between the conductive layer 171 functioning as a pixel electrode and the conductive layer 173 functions as a common electrode. The EL the layer 172R contains a light-emitting organic compound that emits light with intensity at least in a red wavelength range. An EL layer 172G included in the light-emitting element 61G contains a light-emitting organic compound that emits light with intensity at least in a green wavelength range. An EL layer 172B included in the light-emitting element 61B contains a light-emitting organic compound that emits light with intensity at least in a blue wavelength range.

The EL layers 172R, 172G, and 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided for each of the light-emitting elements. The conductive layer 173 functioning as a common electrode is provided as a common layer to the light-emitting elements. A conductive film that has a property of transmitting visible light is used for either the conductive layer 171 functioning as a pixel electrode or the conductive layer 173 functioning as a common electrode, and a reflective conductive film is used for the other. When the conductive layer 171 functioning as a pixel electrode is a light-transmitting electrode and the conductive layer 173 functioning as a common electrode is a reflective electrode, a bottom-emission display apparatus can be obtained. When the conductive layer 171 functioning as a pixel electrode is a reflective electrode and the conductive layer 173 functioning as a common electrode is a light-transmitting electrode, a top-emission display apparatus can be obtained. Note that when both the conductive layer 171 functioning as a pixel electrode and the conductive layer 173 functioning as a common electrode transmit light, a dual-emission display apparatus can be obtained.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover an end portion of the conductive layer 171 functioning as a pixel electrode. An end portion of the insulating layer 272 is preferably tapered. For the insulating layer 272, a material similar to the material that can be used for the insulating layer 363 can be used.

The insulating layer 272 is provided to prevent an unintentional electric short-circuit between adjacent light-emitting elements 61 and unintended light emission therefrom. The insulating layer 272 also has a function of preventing the contact of a metal mask with the conductive layer 171 in the case where the metal mask is used to form the EL layer 172.

The EL layers 172R, 172G, and 172B each include a region in contact with the top surface of the conductive layer 171 functioning as a pixel electrode and a region in contact with a surface of the insulating layer 272. End portions of the EL layers 172R, 172G, and 172B are positioned over the insulating layer 272.

As illustrated in FIG. 27B, there is a gap between the EL layers of two light-emitting elements with different colors. The EL layers 172R, 172G, and 172B are thus preferably provided not to be in contact with each other. This suitably prevents unintentional light emission (also referred to as crosstalk) from being caused by a current flowing through two adjacent EL layers. As a result, the contrast can be increased to achieve a display apparatus with high display quality.

The EL layers 172R, 172G, and 172B can be formed separately by a vacuum evaporation method or the like using a shadow mask such as a metal mask. These layers may be formed separately by a photolithography method. The use of the photolithography method achieves a display apparatus with high resolution, which is difficult to obtain in the case of using a metal mask.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure. A display apparatus having an MML structure is manufactured without using a metal mask and thus has higher flexibility in designing the pixel arrangement, the pixel shape, and the like than a display apparatus having an MM structure.

A protective layer 271 is provided over the conductive layer 173 functioning as a common electrode to cover the light-emitting elements 61R, 61G, and 61B. The protective layer 271 has a function of preventing diffusion of impurities such as water into each light-emitting element from the above.

The protective layer 271 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide (IGZO) may be used for the protective layer 271. The protective layer 271 may be formed by an ALD method, a CVD method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used for the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

Figure 27C:
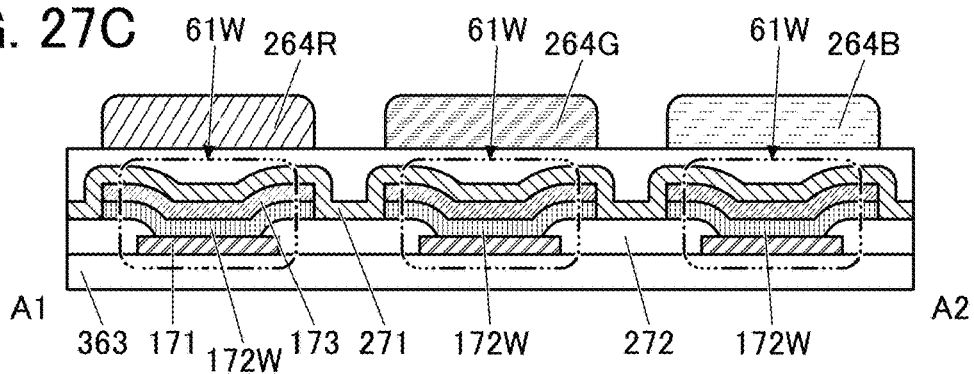

FIG. 27C illustrates an example different from the above. Specifically, in FIG. 27C, a light-emitting element 61W emitting white light is provided. The light-emitting element 61W includes an EL layer 172W emitting white light between the conductive layer 171 functioning as a pixel electrode and the conductive layer 173 functioning as a common electrode.

The EL layer 172W can have, for example, a stacked structure of two or more layers that are selected so as to emit light of complementary colors. It is also possible to use a stacked EL layer in which a charge-generation layer is provided between light-emitting layers.

FIG. 27C illustrates three light-emitting elements 61W side by side. A coloring layer 264R is provided above the left light-emitting element 61W. The coloring layer 264R functions as a band path filter transmitting red light. Similarly, a coloring layer 264G transmitting green light is provided above the middle light-emitting element 61W, and a coloring layer 264B transmitting blue light is provided above the right light-emitting element 61W. This enables the display apparatus to display color images.

The EL layer 172W and the conductive layer 173 functioning as a common electrode are each separated between adjacent two light-emitting elements 61W. This suitably prevents unintentional light emission from being caused by current flowing through the EL layers 172W in the two adjacent light-emitting elements 61W. Particularly when the EL layer 172W is a stacked EL layer in which a charge-generation layer is provided between two light-emitting layers, the effect of crosstalk is more significant as the resolution increases, i.e., as the distance between adjacent pixels decreases, leading to lower contrast. Thus, the above structure can achieve a display apparatus having both high resolution and high contrast.

The EL layer 172W and the conductive layer 173 functioning as a common electrode are preferably isolated by a photolithography method. This can reduce the distance between light-emitting elements, achieving a display apparatus with a higher aperture ratio than that formed using, for example, a shadow mask such as a metal mask.

Note that in the case of a bottom-emission light-emitting element, coloring layers may be provided between the conductive layer 171 functioning as a pixel electrode and the insulating layer 363.

Figure 27D:
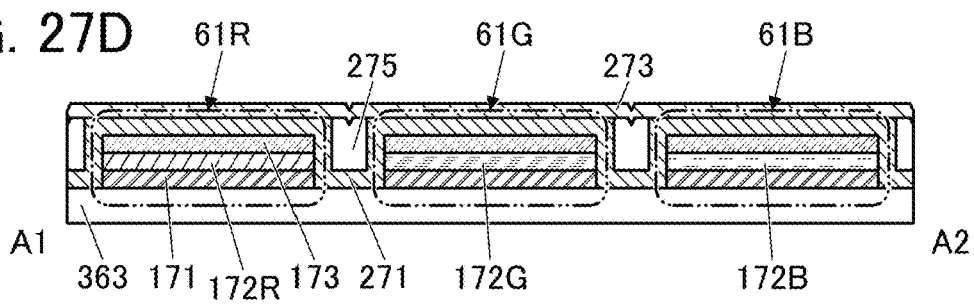

FIG. 27D illustrates an example different from the above. Specifically, in FIG. 27D, the insulating layers 272 are not provided between the light-emitting elements 61R, 61G, and 61B. With such a structure, a display apparatus with a high aperture ratio can be obtained. When the insulating layer 272 is not provided, unevenness formed by the light-emitting elements 61 can be reduced, thereby improving the viewing angle of the display apparatus. Specifically, the viewing angle can be greater than or equal to 150° and less than 180°, preferably greater than or equal to 160° and less than 180°, further preferably greater than or equal to 160° and less than 180°.

The protective layer 271 covers the side surfaces of the EL layers 172R, 172G, and 172B. With this structure, impurities (typically, water or the like) can be prevented from entering the EL layers 172R, 172G, and 172B through their side surfaces. In addition, a leak current between adjacent light-emitting elements 61 is reduced, so that color saturation and contrast ratio are improved and power consumption is reduced.

In the structure illustrated in FIG. 27D, the conductive layer 171, the EL layer 172R, and the conductive layer 173 have substantially the same top surface shape. This structure can be formed in such a manner that the conductive layer 171, the EL layer 172R, and the conductive layer 173 are formed, and collectively processed using a resist mask or the like. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

In FIG. 27D, a protective layer 273 is further provided over the protective layer 271. For example, the protective layer 271 can be formed with an apparatus that can form a film with excellent coverage (typically, an ALD apparatus), and the protective layer 273 can be formed with an apparatus that can form a film with coverage inferior to that of the protective layer 271 (typically, a sputtering apparatus), whereby a region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more selected from air, nitrogen, oxygen, carbon dioxide, and Group 18 elements (typically, helium, neon, argon, xenon, and krypton). Furthermore, a gas used during the formation of the protective layer 273 is sometimes contained in the region 275. For example, in the case where the protective layer 273 is formed using a sputtering method, one or more of the above-described Group 18 elements may be contained in the region 275. In the case where a gas is contained in the region 275, a gas can be identified with a gas chromatography method or the like. Alternatively, in the case where the protective layer 273 is formed using a sputtering method, a gas used in the sputtering is sometimes contained in the protective layer 273. In this case, an element such as argon may be detected when the protective layer 273 is analyzed by an energy dispersive X-ray (EDX) analysis or the like.

In the case where the refractive index of the region 275 is lower than that of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be prevented from entering an adjacent pixel in some cases. This can inhibit color mixture of light emitted from adjacent pixels and thus can improve the display quality of the display apparatus.

In the case of the structure illustrated in FIG. 27D, a region between the light-emitting elements 61R and 61G or a region between the light-emitting elements 61G and 61B (hereinafter simply referred to as a distance between the light-emitting elements) can be shortened. Specifically, the distance between the light-emitting elements can be 1 μm or shorter, preferably 500 nm or shorter, further preferably 200 nm or shorter, 100 nm or shorter, 90 nm or shorter, 70 nm or shorter, 50 nm or shorter, 30 nm or shorter, 20 nm or shorter, 15 nm or shorter, or 10 nm or shorter. In other words, the display apparatus includes a region in which an interval between a side surface of the EL layer 172R and a side surface of the EL layer 172G or an interval between a side surface of the EL layer 172G and a side surface of the EL layer 172B is 1 μm or shorter, preferably 0.5 μm (500 nm) or shorter, further preferably to 100 nm or shorter.

In the case where the region 275 contains a gas, for example, the light-emitting elements can be isolated from each other and color mixture of light from the light-emitting elements, crosstalk, or the like can be inhibited.

Alternatively, the region 275 may be filled with a filler. Examples of the filler include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the latter can have lower power consumption than the former. To reduce power consumption, a light-emitting device having an SBS structure is preferably used.

Meanwhile, the white light-emitting device is preferable in terms of lower manufacturing cost or higher manufacturing yield because the manufacturing process of the white light-emitting device is simpler than that of a light-emitting device having an SBS structure.

Figure 28A:
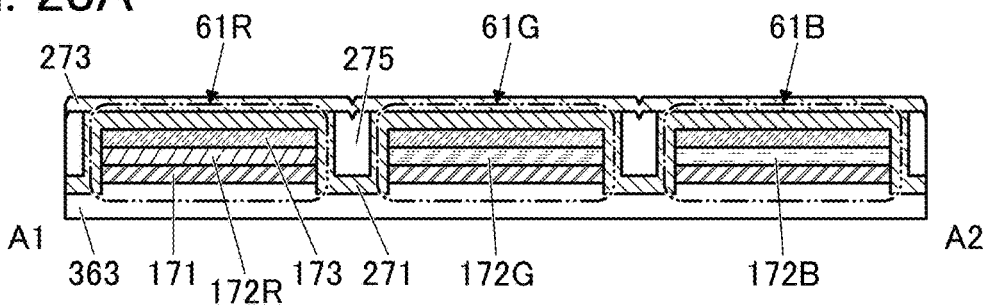
FIGS. 28A to 28D each illustrate a structure example of a display apparatus.

FIG. 28A illustrates an example different from the above example. Specifically, the structure illustrated in FIG. 28A is different from that in FIG. 27D in the structure of the insulating layer 363. The insulating layer 363 has a depressed portion in its top surface that is formed by being partially etched when the light-emitting elements 61R, 61G, and 61B are processed. In addition, the protective layer 271 is formed in the depressed portion. In other words, in the cross-sectional view, there is a region in which the bottom surface of the protective layer 271 is positioned below the bottom surface of the conductive layer 171. With the region, impurities (typically, water or the like) can be suitably prevented from entering the light-emitting elements 61R, 61G, and 61B from the bottom. It is likely that the depressed portion can be formed when impurities (also referred to as residue) that could be attached to the side surfaces of the light-emitting elements 61B, 61G, and 61B in processing of the light-emitting elements are removed by wet etching or the like. After the residue is removed, the side surfaces of the light-emitting elements are covered with the protective layer 271, whereby a highly reliable display apparatus can be provided.

Figure 28B:
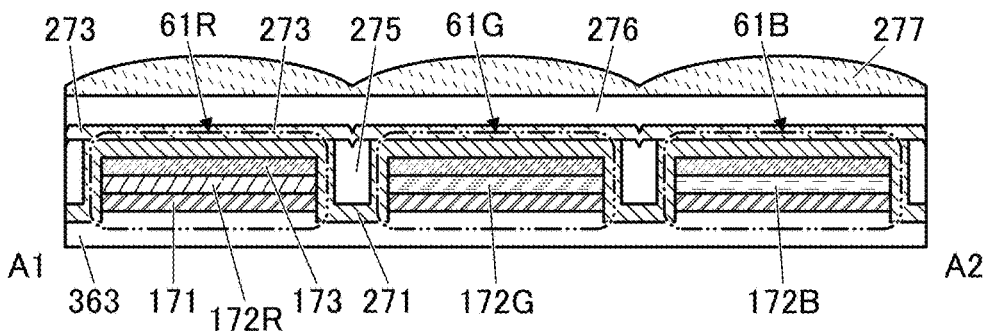

FIG. 28B illustrates an example different from the above example. Specifically, the structure illustrated in FIG. 28B includes an insulating layer 276 and a microlens array 277 in addition to the structure illustrated in FIG. 28A. The insulating layer 276 has a function of an adhesive layer. Note that when the refractive index of the insulating layer 276 is lower than that of the microlens array 277, the microlens array 277 can condense light emitted from the light-emitting elements 61R, 61G, and 61B. This can increase the outcoupling efficiency of the display apparatus. In particular, this is suitable, because a user can see bright images when the user sees the display surface from the front of the display apparatus. As the insulating layer 276, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. A two-component-mixture-type resin may be used. An adhesive sheet or the like may be used.

Figure 28C:
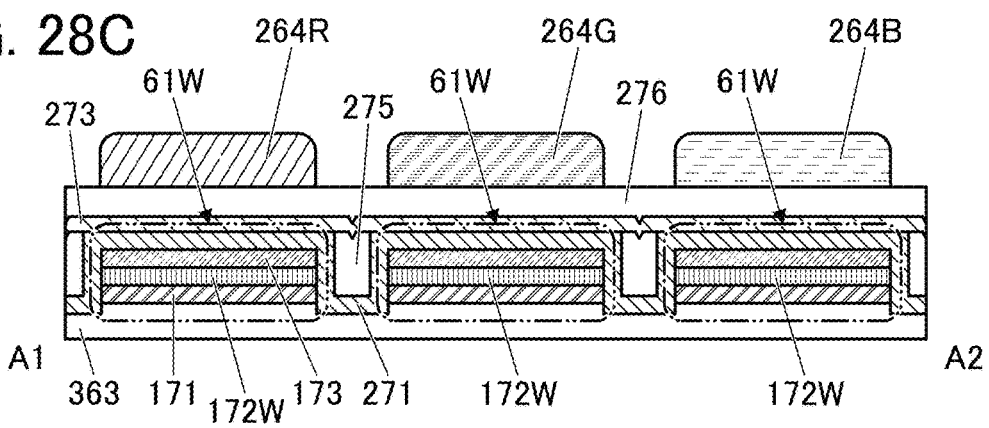

FIG. 28C illustrates an example different from the above. Specifically, the structure illustrated in FIG. 28C includes three light-emitting elements 61W instead of the light-emitting elements 61R, 61G, and 61B in the structure illustrated in FIG. 28A. In addition, the insulating layer 276 is provided over the three light-emitting elements 61W, and the coloring layers 264R, 264G, and 264B are provided over the insulating layer 276. Specifically, the coloring layer 264R transmitting red light is provided at a position overlapping with the left light-emitting element 61W, the coloring layer 264G transmitting green light is provided at a position overlapping with the middle light-emitting element 61W, and the coloring layer 264B transmitting blue light is provided at a position overlapping with the right light-emitting element 61W. This enables the display apparatus to display color images. The structure illustrated in FIG. 28C is a variation example of the structure illustrated in FIG. 27C.

Figure 28D:
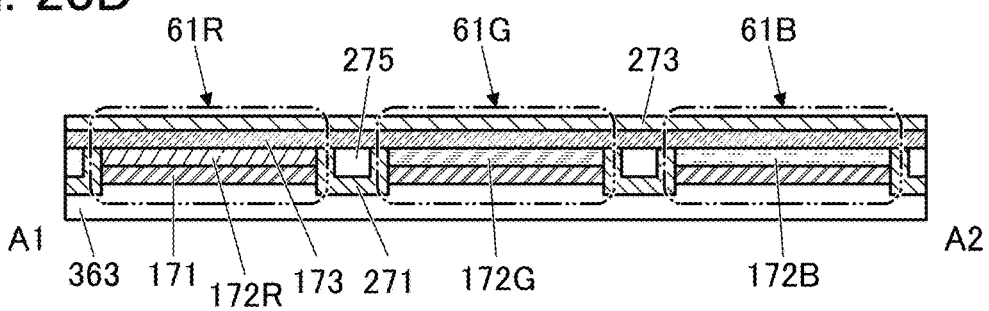

FIG. 28D illustrates an example different from the above. Specifically, in the structure illustrated in FIG. 28D, the protective layer 271 is provided to be in contact with the side surfaces of the conductive layer 171 and the EL layer 172. The conductive layer 173 is provided as a layer common to the light-emitting elements. In the structure illustrated in FIG. 28D, the region 275 is preferably filled with a filler.

When the light-emitting element 61 has a micro-optical resonator (microcavity) structure, the color purity of each emission color can be increased. In order that the light-emitting element 61 has a microcavity structure, a product of a distance d between the conductive layers 171 and 173 and a refractive index n of the EL layer 172 (optical path length) is set to m times greater than the half of a wavelength λ (m is an integer of 1 or more). The distance d can be obtained by Formula 1.

$$d = m \times \lambda / (2 \times n)$$ Formula 1

According to Formula 1, in the light-emitting element 61 having the microcavity structure, the distance d is determined in accordance with the wavelength (color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G in some cases.

To be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and indium tin oxide (ITO) that is a transparent conductive film and the ITO is positioned on the EL layer 172 side, the distance d suitable for the emission color can be set by adjusting the thickness of the ITO. That is, even when the EL layers 172R, 172G, and 172B have the same thickness, the distance d suitable for the emission color can be obtained by adjusting the thickness of the ITO.

However, it is sometimes difficult to determine the exact position of the reflection region in each of the conductive layers 171 and 173. In this case, it is assumed that the effect of the microcavity structure can be obtained sufficiently with a certain position in each of the conductive layers 171 and 173 being supposed as the reflective region.

The light-emitting element 61 includes a hole-injection layer, a hole-transport layer, a light-emitting layer, an electron-transport layer, an electron-injection layer, and the like. Note that a specific structure example of the light-emitting element 61 will be described in another embodiment. In order to increase the outcoupling efficiency in the microcavity structure, the optical path length from the conductive layer 171 functioning as a reflective electrode to the light-emitting layer is preferably set to an odd multiple of λ/4. In order to achieve this optical path length, the thicknesses of the layers in the light-emitting element 61 are preferably adjusted as appropriate.

In the case where light is emitted to the conductive layer 171 side, the reflectance of the conductive layer 173 is preferably higher than the transmittance thereof. The transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the reflectance is set high), the effect of the microcavity structure can be enhanced.

Figure 29A:
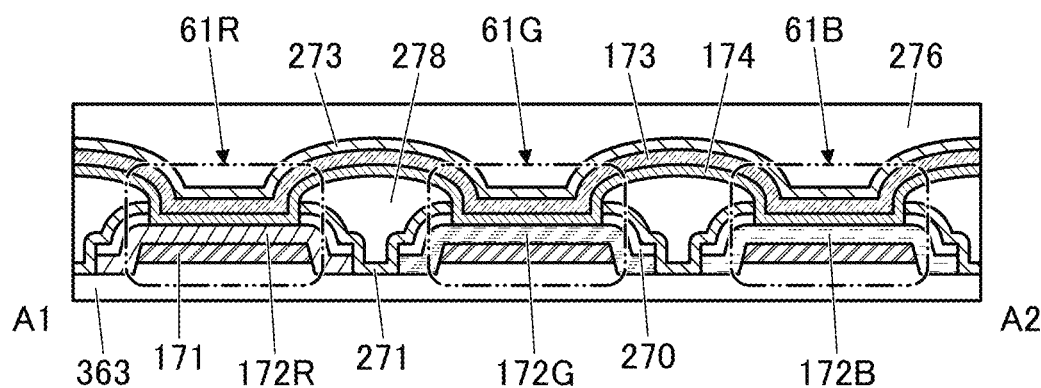
FIGS. 29A and 29B each illustrate a structure example of a display apparatus.

FIG. 29A illustrates an example different from the above. Specifically, in the structure illustrated in FIG. 29A, the EL layer 172 extends beyond an end portion of the conductive layer 171 in each of the light-emitting elements 61R, 61G, and 61B. For example, in the light-emitting element 61R, the EL layer 172R extends beyond the end portion of the conductive layer 171. In the light-emitting element 61G, the EL layer 172G extends beyond the end portion of the conductive layer 171. In the light-emitting element 61B, the EL layer 172B extends beyond the end portion of the conductive layer 171.

The light-emitting elements 61R, 61G, and 61B each include a region where the EL layer 172 and the protective layer 271 overlap with each other with an insulating layer 270 therebetween. In a region between adjacent light-emitting elements 61, an insulating layer 278 is provided over the protective layer 271.

For the insulating layer 278, an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like can be used. Alternatively, a photoresist may be used as the insulating layer 278. The photoresist used as the insulating layer 278 may be a positive photoresist or a negative photoresist.

A common layer 174 is provided over the light-emitting element 61R, the light-emitting element 61G, the light-emitting element 61B, and the insulating layer 278, and the conductive layer 173 is provided over the common layer 174. The common layer 174 includes a region in contact with the EL layer 172R, a region in contact with the EL layer 172G, and a region in contact with the EL layer 172B. The common layer 174 is shared by the light-emitting elements 61R, 61G, and 61B.

One or more of a hole-injection layer, a hole-transport layer, a hole-blocking layer, an electron-blocking layer, an electron-transport layer, and an electron-injection layer can be used as the common layer 174. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 is not necessarily provided in the EL layer 172.

In addition, the protective layer 273 is provided over the conductive layer 173, and the insulating layer 276 is provided over the protective layer 273.

Figure 29B:
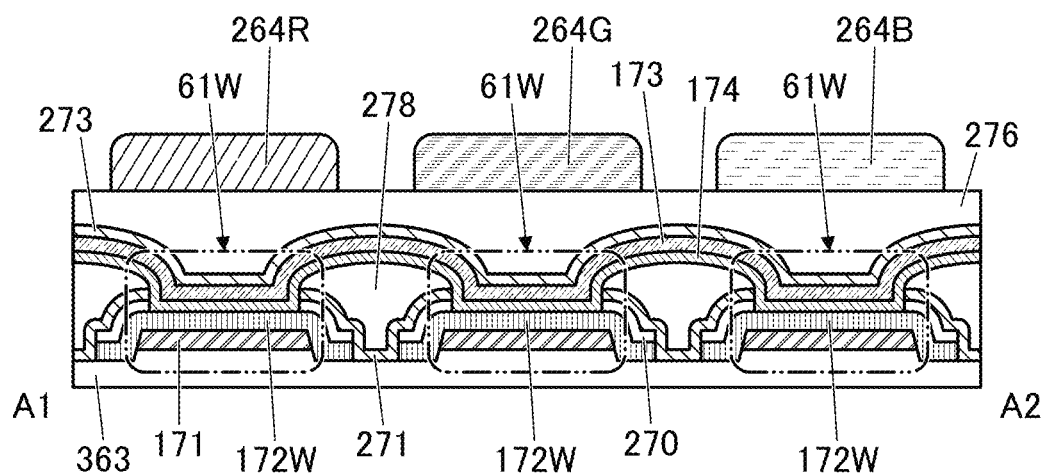

FIG. 29B illustrates an example different from the above. Specifically, the structure illustrated in FIG. 29B includes three light-emitting elements 61W instead of the light-emitting elements 61R, 61G, and 61B in the structure illustrated in FIG. 29A. In addition, the insulating layer 276 is provided over the three light-emitting elements 61W, and the coloring layers 264R, 264G, and 264B are provided over the insulating layer 276. Specifically, the coloring layer 264R transmitting red light is provided at a position overlapping with the left light-emitting element 61W, the coloring layer 264G transmitting green light is provided at a position overlapping with the middle light-emitting element 61W, and the coloring layer 264B is provided at a position overlapping with the right light-emitting element 61W. This enables the display apparatus to display color images. The structure illustrated in FIG. 29B is a variation example of the structure illustrated in FIG. 28C.

<Structure Example of Light-Emitting Element and Light-Receiving Element>

The display apparatus of one embodiment of the present invention is a top-emission display apparatus where light is emitted in the direction opposite to a substrate over which light-emitting elements are formed. In this embodiment, a top-emission display apparatus provided with light-emitting elements and a light-receiving element will be described as an example.

In this specification and the like, unless otherwise specified, in describing a structure including a plurality of elements (e.g., light-emitting elements and light-emitting layers), letters are not added when a common part of the elements is described. For example, the collective term "light-emitting layer 383" is sometimes used to describe a common part of a light-emitting layer 383R, a light-emitting layer 383G, and the like.

Figure 30A:
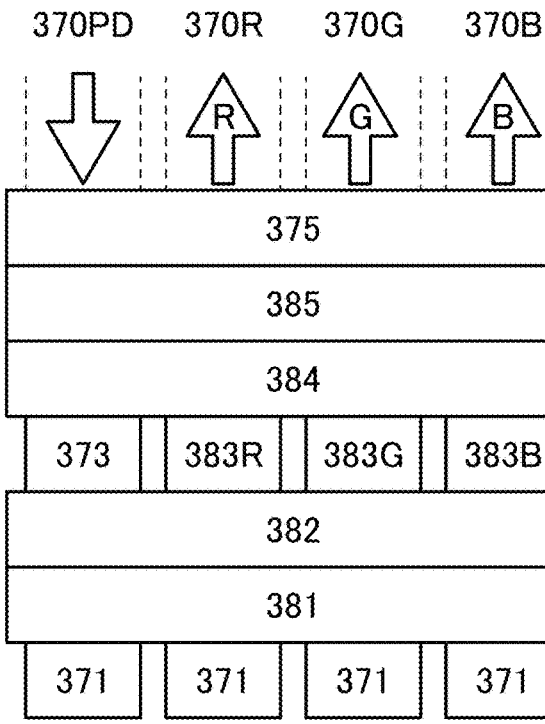
FIGS. 30A and 30B each illustrate a structure example of a display apparatus.

A display apparatus 380A illustrated in FIG. 30A includes a light-receiving element 370PD, a light-emitting element 370R emitting red (R) light, a light-emitting element 370G emitting green (G) light, and a light-emitting element 370B emitting blue (B) light.

Each of the light-emitting elements includes a pixel electrode 371, a hole-injection layer 381, a hole-transport layer 382, a light-emitting layer, an electron-transport layer 384, an electron-injection layer 385, and a common electrode 375 that are stacked in this order. The light-emitting element 370R includes the light-emitting layer 383R, the light-emitting element 370G includes the light-emitting layer 383G, and the light-emitting element 370B includes a light-emitting layer 383B. The light-emitting layer 383R includes a light-emitting substance emitting red light, the light-emitting layer 383G includes a light-emitting substance emitting green light, and the light-emitting layer 383B includes a light-emitting substance emitting blue light.

The light-emitting elements are electroluminescent elements emitting light toward the common electrode 375 by voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 that are stacked in this order.

The light-receiving element 370PD is a photoelectric conversion element that receives light incident from the outside of the display apparatus 380A and converts the light into an electric signal.

This embodiment is described assuming that the pixel electrode 371 functions as an anode and the common electrode 375 functions as a cathode in the light-emitting elements and the light-receiving element. In other words, the light-receiving element is driven by application of reverse bias between the pixel electrode 371 and the common electrode 375, whereby light incident on the light-receiving element can be sensed and charge can be generated and extracted as a current.

In the display apparatus of this embodiment, an organic compound is used for the active layer 373 of the light-receiving element 370PD. The light-receiving element 370PD can share the layers other than the active layer 373 with the light-emitting elements. Therefore, the light-receiving element 370PD can be formed concurrently with the formation of the light-emitting elements only by adding a step of forming the active layer 373 in the manufacturing process of the light-emitting elements. The light-emitting elements and the light-receiving element 370PD can be formed over the same substrate. Accordingly, the light-receiving element 370PD can be incorporated into the display apparatus without a significant increase in the number of manufacturing steps.

In the display apparatus 380A, for example, the light-receiving element 370PD and the light-emitting elements have a common structure except that the active layer 373 of the light-receiving element 370PD and the light-emitting layers 383 of the light-emitting elements are separately formed. The structures of the light-receiving element 370PD and the light-emitting elements are not limited thereto. The light-receiving element 370PD and the light-emitting elements may include separately formed layers in addition to the active layer 373 and the light-emitting layer 383. The light-receiving element 370PD and the light-emitting elements preferably include at least one layer used in common (common layer). Thus, the light-receiving element 370PD can be incorporated into the display apparatus without a significant increase in the number of manufacturing steps.

A conductive film transmitting visible light is used for the electrode through which light is extracted, which is either the pixel electrode 371 or the common electrode 375. A conductive film reflecting visible light is preferably used as the electrode through which light is not extracted.

The light-emitting elements included in the display apparatus of this embodiment preferably employ a micro-optical resonator (microcavity) structure. Therefore, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with wavelengths greater than or equal to 400 nm and less than 750 nm) transmittance higher than or equal to 40% is preferably used in the light-emitting element. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 383. In addition to the light-emitting layer 383, the light-emitting element may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

For example, the light-emitting elements and the light-receiving element can share at least one of the hole-injection layer, the hole-transport layer, the electron-transport layer, and the electron-injection layer. At least one of the hole-injection layer, the hole-transport layer, the electron-transport layer, and the electron-injection layer can be separately formed for the light-emitting elements and the light-receiving element.

The hole-injection layer injects holes from the anode to the hole-transport layer and contains a material with a high hole-injection property. As the material with a high hole-injection property, an aromatic amine compound and a composite material containing a hole-transport material and an acceptor material (electron-accepting material) can be used.

In the light-emitting elements, the hole-transport layer transports holes injected from the anode by the hole-injection layer, to the light-emitting layer. In the light-receiving element, the hole-transport layer transports holes generated in the active layer on the basis of incident light, to the anode. The hole-transport layer contains a hole-transport material. The hole-transport material preferably has a hole mobility higher than or equal to $1\times10^{-6}$ cm$^2$/Vs. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting elements, the electron-transport layer transports electrons injected from the cathode by the electron-injection layer, to the light-emitting layer. In the light-receiving element, the electron-transport layer transports electrons generated in the active layer on the basis of incident light, to the cathode. The electron-transport layer contains an electron-transport material. As the electron-transport material, a material with an electron mobility higher than or equal to $1\times10^{-6}$ cm$^2$/Vs is preferable. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 383 contains a light-emitting substance. The light-emitting layer 383 can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance emitting near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 383 may contain one or more kinds of organic compounds (e.g., a host material or an assist material) in addition to the light-emitting substance (guest material). As the one or more kinds of organic compounds, one or both of a hole-transport material and an electron-transport material can be used. Alternatively, as the one or more kinds of organic compounds, a bipolar material or a TADF material may be used.

The light-emitting layer 383 preferably includes a phosphorescent material and a combination of a hole-transport material and an electron-transport material that easily forms an exciplex. With such a structure, light emission can be efficiently obtained by exciplex-triplet energy transfer (Ex-TET), which is energy transfer from the exciplex to the light-emitting substance (phosphorescent material). When a combination of materials is selected so as to form an exciplex that emits light whose wavelength overlaps with a wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In a combination of materials for forming an exciplex, the highest occupied molecular orbital level (HOMO level) of the hole-transport material is preferably higher than or equal to that of the electron-transport material. The lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectra of each of the hole-transport material and the electron-transport material (or has another peak on the longer wavelength side), observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the hole-transport material and the electron-transport material, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of transient EL of the hole-transport material, the electron-transport material, and the mixed film of these materials.

The active layer 373 includes a semiconductor. Examples of the semiconductor include an inorganic semiconductor such as silicon and an organic semiconductor including an organic compound. This embodiment shows an example in which an organic semiconductor is used as the semiconductor contained in the active layer 373. The use of an organic semiconductor is preferable because the light-emitting layer 383 and the active layer 373 can be formed by the same method (e.g., a vacuum evaporation method) and thus the same manufacturing apparatus can be used.

Examples of an n-type semiconductor material contained in the active layer 373 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and thus is useful for light-receiving elements. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1",4',4"-tetrahydro-di[1,4]methanonaphthaleno[1,2:2',3',56,60:2",3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

The active layer 373 is preferably formed by co-evaporation of an n-type semiconductor and a p-type semiconductor, for example. Alternatively, the active layer 373 may be formed by stacking an n-type semiconductor and a p-type semiconductor.

Either a low molecular compound or a high molecular compound can be used for the light-emitting elements and the light-receiving element, and an inorganic compound may also be included. Each of the layers included in the light-emitting elements and the light-receiving element can be formed by any of the following methods, for example: an evaporation method (including a vacuum evaporation method), a transfer method, a printing method, an inkjet method, and a coating method.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer 373, a high molecular compound such as poly[[4,8-bis[5-(2-ethylhexyl)-2-thienyl]benzo[1,2-b:4,5-b']dithiophene-2,6-diyl]-2,5-th iophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

The active layer 373 may contain a mixture of three or more kinds of materials. For example, a third material may be mixed with an n-type semiconductor material and a p-type semiconductor material in order to extend the wavelength range. The third material may be a low molecular compound or a high molecular compound.

Figure 30B:
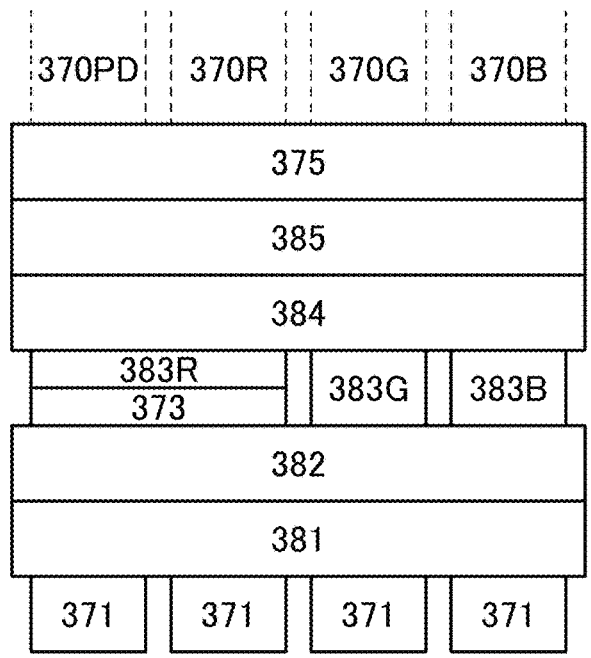

A display apparatus 380B illustrated in FIG. 30B is different from the display apparatus 380A in that the light-receiving element 370PD and the light-emitting element 370R have the same structure.

The light-receiving element 370PD and the light-emitting element 370R share the active layer 373 and the light-emitting layer 383R.

Here, the light-receiving element 370PD preferably has the same structure as the light-emitting element that emits light with a wavelength that is longer than the sensing-target light wavelength. For example, the light-receiving element 370PD with a structure for sensing blue light can have a structure similar to that of either or both of the light-emitting element 370R and the light-emitting element 370G. As another example, the light-receiving element 370PD with a structure for sensing green light can have the same structure as the light-emitting element 370R.

When the light-receiving element 370PD and the light-emitting element 370R have a common structure, the number of film formation steps and the number of masks can be reduced compared with the structure in which the light-receiving element 370PD and the light-emitting element 370R include separately formed layers. Consequently, the number of manufacturing steps and the manufacturing costs of the display apparatus can be reduced.

When the light-receiving element 370PD and the light-emitting element 370R have a common structure, a space provided to allow for misalignment can be reduced compared with the structure in which the light-receiving element 370PD and the light-emitting element 370R include separately formed layers. Accordingly, the aperture ratio of pixels can be increased, and the outcoupling efficiency of the display apparatus can be increased. This can extend the life of the light-emitting element. Furthermore, the display apparatus can exhibit a high luminance. Moreover, the resolution of the display apparatus can be increased.

The light-emitting layer 383R contains a light-emitting material emitting red light. The active layer 373 contains an organic compound that absorbs light with a wavelength shorter than that of red light (e.g., either or both of green light and blue light). The active layer 373 preferably contains an organic compound that does not easily absorb red light and absorbs light with a wavelength shorter than that of red light. In that case, red light can be efficiently extracted from the light-emitting element 370R, and the light-receiving element 370PD can sense light with a wavelength shorter than that of red light with high accuracy.

Although the display apparatus 380B is an example in which the light-emitting element 370R and the light-receiving element 370PD have the same structure, the light-emitting element 370R and the light-receiving element 370PD may include optical adjustment layers with different thicknesses.

A display apparatus 380C illustrated in FIGS. 31A and 31B includes a light-emitting and light-receiving element 370SR that emits red (R) light and has a light-receiving function, the light-emitting element 370G, and the light-emitting element 370B. The above description of the display apparatus 380A and the like can be referred to for the structures of the light-emitting elements 370G and 370B.

The light-emitting and light-receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 that are stacked in this order. The light-emitting and light-receiving element 370SR has the same structure as the light-emitting element 370R and the light-receiving element 370PD in the display apparatus 380B.

FIG. 31A shows the case where the light-emitting and light-receiving element 370SR functions as a light-emitting element. FIG. 31A illustrates an example in which the light-emitting element 370B emits blue light, the light-emitting element 370G emits green light, and the light-emitting and light-receiving element 370SR emits red light.

FIG. 31B shows the case where the light-emitting and light-receiving element 370SR functions as a light-receiving element. FIG. 31B illustrates an example in which the light-emitting and light-receiving element 370SR receives blue light emitted by the light-emitting element 370B and green light emitted by the light-emitting element 370G.

The light-emitting element 370B, the light-emitting element 370G, and the light-emitting and light-receiving element 370SR each include the pixel electrode 371 and the common electrode 375. In this embodiment, the case where the pixel electrode 371 functions as an anode and the common electrode 375 functions as a cathode is described as an example. The light-emitting and light-receiving element 370SR is driven by application of reverse bias between the pixel electrode 371 and the common electrode 375, whereby light incident on the light-emitting and light-receiving element 370SR can be sensed and charge can be generated and extracted as a current.

It can be said that the light-emitting and light-receiving element 370SR has a structure in which the active layer 373 is added to the light-emitting element. That is, the light-emitting and light-receiving element 370SR can be formed concurrently with the light-emitting elements only by adding a step of forming the active layer 373 in the manufacturing process of the light-emitting element. The light-emitting elements and the light-emitting and light-receiving element can be formed over the same substrate. Thus, one or both of an image capturing function and a sensing function can be provided to the display portion without a significant increase in the number of manufacturing steps.

The stacking order of the light-emitting layer 383R and the active layer 373 is not limited. In FIGS. 31A and 31B, the active layer 373 is provided over the hole-transport layer 382, and the light-emitting layer 383R is provided over the active layer 373. The stacking order of the light-emitting layer 383R and the active layer 373 may be reversed.

The light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

In the light-emitting and light-receiving element, a conductive film that transmits visible light is used for the electrode through which light is extracted. A conductive film that reflects visible light is preferably used for the electrode through which light is not extracted.

The functions and materials of the layers constituting the light-emitting and light-receiving element are similar to those of the layers constituting the light-emitting elements and the light-receiving element and are not described in detail here.

FIGS. 31C to 31G illustrate examples of stacked-layer structures of light-emitting and light-receiving elements.

The light-emitting and light-receiving element illustrated in FIG. 31C includes a first electrode 377, the hole-injection layer 381, the hole-transport layer 382, the light-emitting layer 383R, the active layer 373, the electron-transport layer 384, the electron-injection layer 385, and a second electrode 378.

FIG. 31C illustrates an example in which the light-emitting layer 383R is provided over the hole-transport layer 382, and the active layer 373 is stacked over the light-emitting layer 383R.

As illustrated in FIGS. 31A to 31C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a bipolar substance is preferably used for the buffer layer. Alternatively, as the buffer layer, at least one of a hole-injection layer, a hole-transport layer, an electron-transport layer, an electron-injection layer, a hole-blocking layer, an electron-blocking layer, and the like can be used. FIG. 31D illustrates an example in which the hole-transport layer 382 is used as the buffer layer.

The buffer layer provided between the active layer 373 and the light-emitting layer 383R can inhibit transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving element including the buffer layer between the active layer 373 and the light-emitting layer 383R.

FIG. 31E illustrates an example in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layers 382-1 and 382-2 may contain the same material or different materials. Instead of the hole-transport layer 382-2, any of the above layers that can be used as the buffer layer may be used. The positions of the active layer 373 and the light-emitting layer 383R may be interchanged.

The light-emitting and light-receiving element illustrated in FIG. 31F is different from the light-emitting and light-receiving element illustrated in FIG. 31A in not including the hole-transport layer 382. In this manner, the light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

The light-emitting and light-receiving element illustrated in FIG. 31G is different from the light-emitting and light-receiving element illustrated in FIG. 31A in including a layer 389 serving as both a light-emitting layer and an active layer instead of including the active layer 373 and the light-emitting layer 383R.

As the layer serving as both a light-emitting layer and an active layer, a layer containing three materials which are an n-type semiconductor that can be used for the active layer 373, a p-type semiconductor that can be used for the active layer 373, and a light-emitting substance that can be used for the light-emitting layer 383R can be used, for example.

An absorption band on the lowest energy side of the absorption spectrum of a mixed material of the n-type semiconductor and the p-type semiconductor and the maximum peak of an emission spectrum (PL spectrum) of the light-emitting substance preferably do not overlap each other and are further preferably positioned fully apart from each other.

At least part of this embodiment can be implemented in combination with any of the other embodiments described in this specification, as appropriate.

<Structure Example of Light-Emitting Element and Light-Receiving Element>

Figure 32:
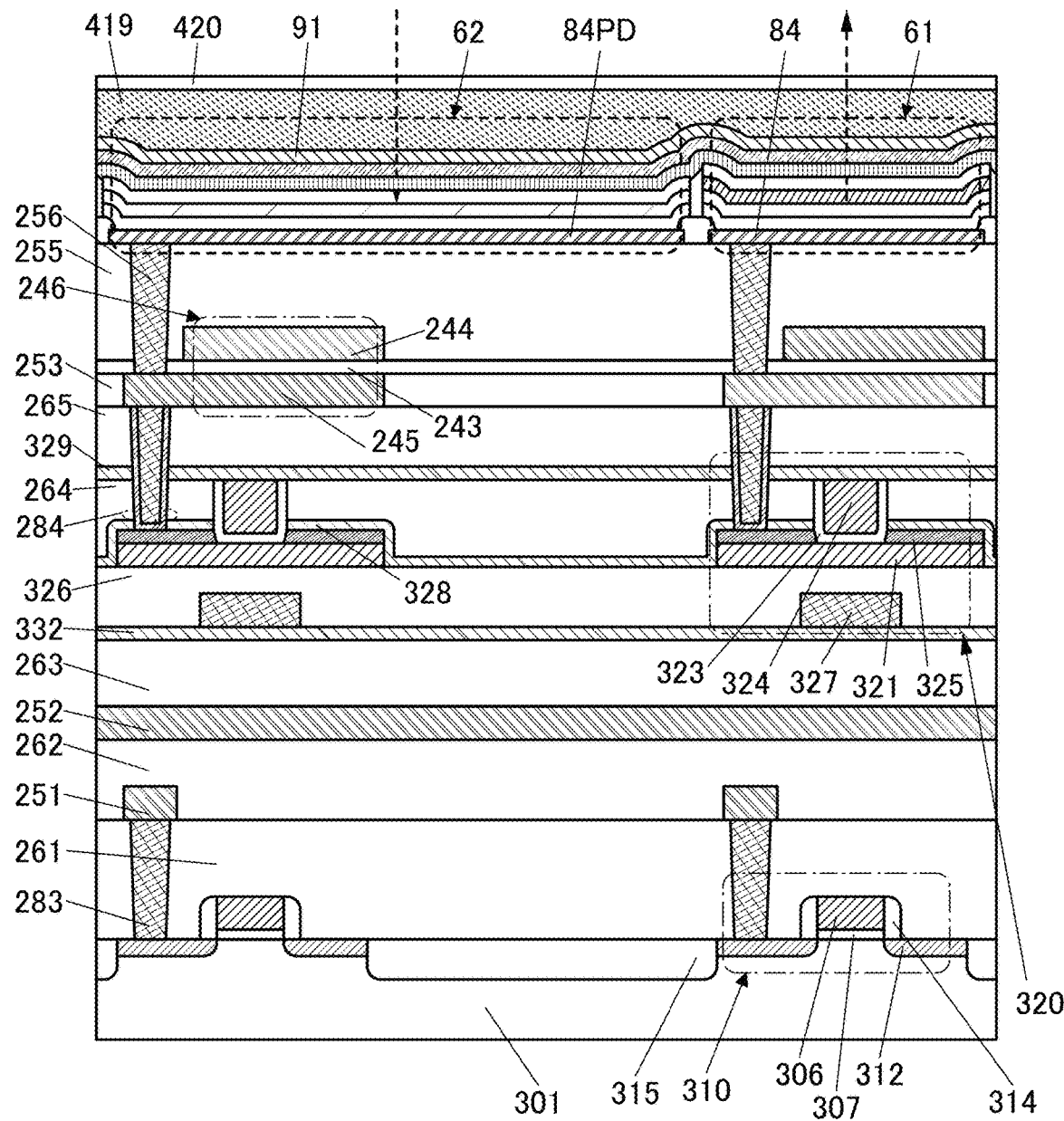
FIG. 32 illustrates a structure example of a display apparatus.

FIG. 32 is a cross-sectional view illustrating a structure example of the display apparatus 10. The display apparatus 10 has a structure in which a transistor 310 whose channel is formed in the substrate 301 and a transistor 320 including a metal oxide in a semiconductor layer where a channel is formed are stacked.

An insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and an insulating layer 332 are provided to cover the conductive layer 252, and the transistor 320 is provided over the insulating layer 332. An insulating layer 265 is provided to cover the transistor 320, and a capacitor 246 is provided over the insulating layer 265. The capacitor 246 and the transistor 320 are electrically connected to each other through a plug 284.

The transistor 320 can be used as a transistor included in a pixel circuit or a transistor included in a memory cell. The transistor 310 can be used as a transistor included in a memory cell, a transistor included in a driver circuit for driving the pixel circuit, or a transistor included in an arithmetic circuit. The transistor 310 and the transistor 320 can also be used as transistors included in a variety of circuits such as an arithmetic circuit and a memory circuit.

The transistor 310 includes a channel formation region in the substrate 301. As the substrate 301, a semiconductor substrate such as a single crystal silicon substrate can be used, for example. The transistor 310 includes part of the substrate 301, a conductive layer 306, low-resistance regions 312, an insulating layer 307, and an insulating layer 314. The conductive layer 306 functions as a gate electrode. The insulating layer 307 is positioned between the substrate 301 and the conductive layer 306 and functions as a gate insulating layer. The low-resistance region 312 is a region where the substrate 301 is doped with an impurity, and functions as one of a source and a drain. The insulating layer 314 is provided to cover the side surface of the conductive layer 306 and functions as an insulating layer.

An element isolation layer 315 is provided between two adjacent transistors 310 to be embedded in the substrate 301.

The transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

The insulating layer 332 functions as a barrier layer that prevents diffusion of impurities such as water and hydrogen from the insulating layer 263 side to the transistor 320 side and release of oxygen from the semiconductor layer 321 to the insulating layer 332 side. As the insulating layer 332, for example, a film in which hydrogen or oxygen is less likely to diffuse than in a silicon oxide film can be used. Examples of such a film include an aluminum oxide film, a hafnium oxide film, and a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 which is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. For the semiconductor layer 321, a metal oxide containing at least one of indium, zinc, and the element M (the element M is aluminum, gallium, yttrium, or tin) is preferably used. An OS transistor including such a metal oxide in a channel formation region has a feature of an extremely low off-state current. Thus, it is preferable that such an OS transistor be used as a transistor provided in a pixel circuit, in which case analog data written to the pixel circuit can be retained for a long time. Similarly, it is preferable that such an OS transistor be used as a transistor provided in a memory cell, in which case analog data written to the memory cell can be retained for a long time.

The pair of conductive layers 325 are provided over and in contact with the semiconductor layer 321, and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328 and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and the insulating layer 265 are provided to cover these layers.

The insulating layers 264 and 265 each function as an interlayer insulating layer. The insulating layer 329 functions as a barrier layer that prevents diffusion of impurities such as water and hydrogen from the insulating layer 265 and the like to the transistor 320. As the insulating layer 329, an insulating film similar to the insulating layers 328 and 332 can be used.

The plug 284 electrically connected to one of the pair of conductive layers 325 is provided to be embedded in the insulating layers 265, 329, and 264.

The capacitor 246 includes a conductive layer 244, a conductive layer 245, and an insulating layer 243 positioned between the conductive layers 244 and 245. The conductive layer 244 functions as one electrode of the capacitor 246, the conductive layer 245 functions as the other electrode of the capacitor 246, and the insulating layer 243 functions as a dielectric of the capacitor 246.

The conductive layer 245 is provided over the insulating layer 265 and is embedded in an insulating layer 253. The conductive layer 244 is electrically connected to one of the source and the drain of the transistor 310 through a plug 283 embedded in the insulating layer 261. The insulating layer 243 is provided to cover the conductive layer 245. The conductive layer 245 is provided in a region overlapping with the conductive layer 244 with the insulating layer 243 therebetween.

An insulating layer 255 is provided to cover the capacitor 246, and the light-emitting element 61, the light-receiving element 62, and the like are provided over the insulating layer 255. A protective layer 91 is provided over the light-emitting element 61 and the light-receiving element 62, and a substrate 420 is bonded to the top surface of the protective layer 91 with a resin layer 419. A light-transmitting substrate can be used as the substrate 420.

A pixel electrode 84 of the light-emitting element 61 and a pixel electrode 84PD of the light-receiving element 62 are electrically connected to one of the source and the drain of the transistor 310 through a plug 256 embedded in the insulating layer 255, the conductive layer 244 embedded in the insulating layer 253, and the plug 283 embedded in the insulating layer 261.

With such a structure, transistors included in a pixel circuit as well as the driver circuit, an arithmetic circuit, and the like can be provided directly under the light-receiving element and the light-emitting element; thus, the size of a display apparatus with higher performance can be reduced.

At least part of this embodiment can be implemented in combination with any of the other embodiments described in this specification, as appropriate.

<Notes on Description of this Specification and the Like>

The following are notes on the description of the foregoing embodiment and the structures in the embodiment.

One embodiment of the present invention can be constituted by appropriately combining the structure described in an embodiment with any of the structures described in the other embodiments. In addition, in the case where a plurality of structure examples are described in one embodiment, the structure examples can be combined with each other as appropriate.

Note that a content (or part thereof) in an embodiment can be applied to, combined with, or replaced with another content (or part thereof) in the same embodiment and/or a content (or part thereof) in another embodiment or other embodiments.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be created.

In this specification and the like, components are classified on the basis of the functions and shown as blocks independent of each other in block diagrams. However, in an actual circuit or the like, it may be difficult to separate components on the basis of the functions, so that one circuit may be associated with a plurality of functions or several circuits may be associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and an embodiment of the present invention is not limited to shapes or values shown in the drawings. For example, the following can be included: variation in signal, voltage, or current due to noise or difference in timing.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term "electrode", "wiring", or the like does not limit a function of the component. For example, an "electrode" is used as part of a "wiring" in some cases, and vice versa. Moreover, the term "electrode", "wiring", or the like also includes the case where a plurality of "electrodes", "wirings", or the like are formed in an integrated manner, for example.

In this specification and the like, voltage and potential can be interchanged with each other as appropriate. The term "voltage" refers to a potential difference from a reference potential. When the reference potential is a ground voltage, for example, "voltage" can be replaced with "potential". The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

In this specification and the like, a switch is in a conduction state (on state) or in a non-conduction state (off state) to determine whether a current flows therethrough or not. Alternatively, a switch has a function of selecting and changing a current path.

In this specification and the like, the channel length refers to, for example, the distance between a source and a drain in a region where a semiconductor (or a portion where a current flows in a semiconductor when a transistor is on) and a gate overlap each other, or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap each other, or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

This application is based on Japanese Patent Application Serial No. 2021-119388 filed with Japan Patent Office on Jul. 20, 2021 and Japanese Patent Application Serial No. 2021-119389 filed with Japan Patent Office on Jul. 20, 2021, the entire contents of which are hereby incorporated by reference.

What is claimed is:

1. A display apparatus comprising:
a first layer comprising a plurality of pixel circuits;
a second layer provided over the first layer;
a plurality of optical lenses provided over the second layer;
a display region; and
a plurality of light-receiving regions,
wherein the display region comprises a light-emitting device provided in the second layer,
wherein each of the plurality of light-receiving regions comprises a plurality of light-receiving devices provided in the second layer,
wherein the plurality of light-receiving regions is provided around the display region,
wherein each of the plurality of optical lenses is provided at a position overlapping with a corresponding one of the plurality of light-receiving regions, and
wherein a resolution of an image captured by a first light-receiving device of the plurality of light-receiving devices provided in a first light-receiving region of the plurality of light-receiving regions is higher than a resolution of an image displayed by the light-emitting device provided in the display region.

2. The display apparatus according to claim 1,
wherein the display region is a rectangular region, and
wherein the plurality of light-receiving regions is placed at each corner of the rectangular region.

3. An electronic device comprising:
a housing; and
the display apparatus according to claim 1,
wherein the housing is configured to position the display apparatus at a position where an image of a user's eye can be captured, and
wherein each of the plurality of light-receiving regions is configured to capture an image of the user's eye or the surroundings of the eye.

4. A display apparatus comprising:
a first layer;
a second layer provided over the first layer;
a plurality of optical lenses provided over the second layer;
a display region; and
a plurality of light-receiving regions,
wherein the display region comprises a first pixel circuit provided in the first layer and a light-emitting device provided in the second layer,
wherein each of the plurality of light-receiving regions comprises a second pixel circuit provided in the first layer and a light-receiving device provided in the second layer,
wherein the plurality of light-receiving regions is provided around the display region,
wherein each of the plurality of optical lenses is provided at a position overlapping with a corresponding one of the plurality of light-receiving regions, wherein a plurality of first wirings is provided in a first light-receiving region of the plurality of light-receiving regions, wherein a plurality of second wirings is provided in the display region, wherein the plurality of first wirings is configured to drive the second pixel circuit of the first light-receiving region of the plurality of light-receiving regions, wherein the plurality of second wirings is configured to drive the first pixel circuit, and wherein a distance between a third wiring of the plurality of first wirings and a fourth wiring of the plurality of first wirings is shorter than a distance between a fifth wiring of the plurality of second wirings and a sixth wiring of the plurality of second wirings.

5. A display apparatus comprising:

a first layer;

a second layer provided over the first layer;

a third layer comprising a driver circuit and an arithmetic circuit;

a plurality of optical lenses provided over the second layer;

a display region; and a plurality of light-receiving regions, wherein the display region comprises a first pixel circuit provided in the first layer and a light-emitting device provided in the second layer, wherein each of the plurality of light-receiving regions comprises a second pixel circuit provided in the first layer and a light-receiving device provided in the first layer, wherein the plurality of light-receiving regions is provided around the display region, wherein each of the plurality of optical lenses is provided at a position overlapping with a corresponding one of the plurality of light-receiving regions, wherein the driver circuit and the arithmetic circuit are placed at a position overlapping with the display region, wherein the arithmetic circuit comprises a neural network, wherein the arithmetic circuit is configured to perform eye tracking on the basis of image data obtained in the plurality of light-receiving regions using the neural network, and wherein a resolution of an image captured by the light-receiving device in a first light-receiving region of the plurality of light-receiving regions is higher than a resolution of an image displayed by the light-emitting device provided in the display region.

6. The display apparatus according to claim 5, wherein the first layer comprises a first transistor comprising a semiconductor layer comprising silicon in a channel formation region, and wherein the first pixel circuit comprises the first transistor.

7. The display apparatus according to claim 5, wherein the first layer comprises a second transistor comprising a semiconductor layer comprising a metal oxide in a channel formation region.

8. The display apparatus according to claim 7, wherein the metal oxide comprises In, Zn, and an element M, and wherein M is Al, Ga, Y, or Sn.

9. The display apparatus according to claim 5, wherein the light-receiving device comprises an organic semiconductor.

10. An electronic device comprising:

a housing; and the display apparatus according to claim 5, wherein the housing is configured to position the display apparatus at a position where an image of a user's eye can be captured, and wherein each of the plurality of light-receiving regions is configured to capture an image of the user's eye or the surroundings of the eye.

11. The display apparatus according to claim 5, wherein a plurality of first wirings is provided in the first light-receiving region of the plurality of light-receiving regions, wherein a plurality of second wirings is provided in the display region, wherein the plurality of first wirings is configured to drive the second pixel circuit of the first light-receiving region of the plurality of light-receiving regions, wherein the plurality of second wirings is configured to drive the first pixel circuit, and wherein a distance between a third wiring of the plurality of first wirings and a fourth wiring of the plurality of first wirings is shorter than a distance between a fifth wiring of the plurality of second wirings and a sixth wiring of the plurality of second wirings.

* * * * *